United States Patent
Kim et al.

(10) Patent No.: US 12,142,891 B2
(45) Date of Patent: Nov. 12, 2024

(54) SURFACE EMITTING LASER PACKAGE

(71) Applicant: SUZHOU LEKIN SEMICONDUCTOR CO., LTD., Taicang (CN)

(72) Inventors: Myung Sub Kim, Seoul (KR); Woo Jin Moon, Seoul (KR); Ju Young Park, Seoul (KR)

(73) Assignee: SUZHOU LEKIN SEMICONDUCTOR CO., LTD., Suzhou (CN)

( * ) Notice: Subject to any disclaimer, the term of this patent is extended or adjusted under 35 U.S.C. 154(b) by 1085 days.

(21) Appl. No.: 17/041,067

(22) PCT Filed: May 2, 2019

(86) PCT No.: PCT/KR2019/005264
§ 371 (c)(1),
(2) Date: Sep. 24, 2020

(87) PCT Pub. No.: WO2019/216596
PCT Pub. Date: Nov. 14, 2019

(65) Prior Publication Data
US 2021/0098964 A1    Apr. 1, 2021

(30) Foreign Application Priority Data

May 9, 2018   (KR) .......... 10-2018-0053022
Aug. 1, 2018  (KR) .......... 10-2018-0089669
Aug. 24, 2018 (KR) .......... 10-2018-0099462

(51) Int. Cl.
H01S 5/022    (2021.01)
H01S 5/02257  (2021.01)
(Continued)

(52) U.S. Cl.
CPC .......... *H01S 5/02345* (2021.01); *H01S 5/022* (2013.01); *H01S 5/02257* (2021.01);
(Continued)

(58) Field of Classification Search
CPC .................................................. H01S 5/02257
See application file for complete search history.

(56) References Cited

U.S. PATENT DOCUMENTS 10,088,140 B2 * 10/2018 Balimann ................ F21V 3/00
2006/0244118 A1    11/2006 Roberts et al.
(Continued)

FOREIGN PATENT DOCUMENTS

JP    2008-091496       4/2008
JP    2010-129655 A     6/2010
(Continued)

OTHER PUBLICATIONS

International Search Report dated Aug. 27, 2019 issued in Application No. PCT/KR2019/005264.

*Primary Examiner* — Michael Carter
(74) *Attorney, Agent, or Firm* — Birch, Stewart, Kolasch & Birch, LLP

(57) ABSTRACT

In a surface emitting laser package, a surface emitting laser element and a substrate may be electrically connected through a diffusion part. In detail, according to the surface emitting laser package, a housing includes a step, the diffusion part is disposed at the step of the housing, and the surface emitting laser element and the substrate may be electrically connected through a connection wiring extending through the housing to correspond to the step and a conductive line disposed at one side of the diffusion part.

19 Claims, 21 Drawing Sheets

(51) Int. Cl.
*H01S 5/02325* (2021.01)
*H01S 5/02345* (2021.01)
*H01S 5/042* (2006.01)
*H01S 5/18* (2021.01)
*H01S 5/183* (2006.01)
*H01S 5/42* (2006.01)

(52) U.S. Cl.
CPC ...... *H01S 5/02325* (2021.01); *H01S 5/04252* (2019.08); *H01S 5/18* (2013.01); *H01S 5/183* (2013.01); *H01S 5/423* (2013.01)

(56) References Cited

U.S. PATENT DOCUMENTS

| | | | |
|---|---|---|---|
| 2006/0279949 A1 | 12/2006 | Shin et al. | |
| 2009/0296762 A1* | 12/2009 | Yamaguchi | H04N 9/3129 359/197.1 |
| 2011/0291135 A1* | 12/2011 | Hsieh | H01L 33/641 257/E33.068 |
| 2017/0350581 A1 | 12/2017 | Balimann et al. | |

FOREIGN PATENT DOCUMENTS

| | | |
|---|---|---|
| JP | 2013-258371 | 12/2013 |
| KR | 10-1995-0002209 B1 | 3/1995 |
| KR | 10-2003-0074729 | 9/2003 |
| KR | 10-2006-0128443 | 12/2006 |
| KR | 20060128443 | * 12/2006 |
| KR | 10-0748815 B1 | 8/2007 |
| KR | 10-2008-0035745 | 4/2008 |
| KR | 10-2008-0076054 | 8/2008 |
| KR | 10-2012-0127109 A | 11/2012 |
| KR | 10-2012-0127184 A | 11/2012 |
| KR | 10-2013-0077069 A | 7/2013 |
| KR | 10-2014-0147856 | 12/2014 |
| KR | 10-2015-0133048 A | 11/2015 |
| KR | 10-2016-0011723 | 2/2016 |

* cited by examiner

SURFACE EMITTING LASER PACKAGE

CROSS-REFERENCE TO RELATED PATENT APPLICATIONS

This application is a U.S. National Stage Application under 35 U.S.C. § 371 of PCT Application No. PCT/KR2019/005264, filed May 2, 2019, which claims priority to Korean Patent Application Nos. 10-2018-0053022, filed May 9, 2018, 10-2018-0089669, filed Aug. 1, 2018 and 10-2018-0099462, filed Aug. 24, 2018, whose entire disclosures are hereby incorporated by reference.

TECHNICAL FIELD

An embodiment relates to a surface emitting laser package.

BACKGROUND ART

A semiconductor device including compounds such as GaN and AlGaN has a lot of advantages such as having wide and easily adjustable band gap energy and may be used variously as a light-emitting device, a light-receiving device, and various diodes.

In particular, a light-emitting device such as a light-emitting diode or a laser diode using a compound semiconductor material of Group III-V or Group II-VI of a semiconductor may realize various colors such as red, green, blue, and ultraviolet rays by development of thin film growth technology and device materials, and the light-emitting device may realize a white light source with high efficiency by using fluorescent materials or combining colors, and has advantages of low power consumption, semi-permanent lifetime, fast response speed, safety, and environmental friendliness as compared with conventional light sources such as fluorescent lamps and incandescent lamps.

In addition, when a light-receiving device such as a photodetector or a solar cell is manufactured using a compound semiconductor material of Group III-V or Group II-VI, by developing device materials, light of various wavelength regions from gamma rays to a radio wavelength region may be received by absorbing light of various wavelength regions and generating a photocurrent. In addition, the semiconductor device has advantages of fast response speed, safety, environmental friendliness and easy control of device materials, so that it can be easily used for power control or a microwave circuit or communication module.

Accordingly, a semiconductor device has been expanded to a transmitting module of an optical communication means, a light-emitting diode backlight which replaces a cold cathode fluorescent lamp (CCFL) constituting a backlight of a liquid crystal display (LCD) device, white light-emitting diode lighting device which may replace the fluorescent lamp or the incandescent lamp, automotive headlights, traffic lights, and even sensors sensing gas or fire.

In addition, the semiconductor device may be extended to high-frequency application circuits or other power control devices, and even communication modules. For example, there is a vertical-cavity surface emitting laser (VCSEL) element as the semiconductor device. The surface emitting laser element is used for optical communication, optical parallel processing, optical connection, and the like. Meanwhile, a laser diode used in such a communication module is designed to easily operate at a low current.

The surface emitting laser element has been developed for communication and sensor. The surface emitting laser element for communication is applied to an optical communication system.

The surface emitting laser element for sensor is applied to a 3D sensing camera that recognizes a human face. For example, the 3D sensing camera is in the limelight as a camera capable of capturing depth information of an object by engaging with recent augmented reality.

It may be commercialized in a surface emitting laser package that includes the surface emitting laser element.

DISCLOSURE

Technical Problem

An embodiment is directed to solving the above problems and other problems.

Another object of the embodiment is to provide a surface emitting laser package having a new structure.

Still another object of the embodiment is to provide a surface emitting laser package in which a wire is removed.

Still another object of the embodiment is to provide a surface emitting laser package capable of sensing easily detachment of a diffusion part.

Still another object of the embodiment is to provide a surface emitting laser package capable of preventing an electrical disconnection between a surface emitting laser element and a substrate.

Still another object of the embodiment is to provide a surface emitting laser package capable of ensuring product reliability.

Still another object of the embodiment is to provide a surface emitting laser package capable of reducing an entire size.

Still another object of the embodiment is to provide a surface emitting laser package having a simple structure.

Still another object of the embodiment is to provide a surface emitting laser package in which electrical connection of a surface emitting laser element is easy.

Still another object of the embodiment is to provide a surface emitting laser package with enhanced fixability of a diffusion part.

Still another object of the embodiment is to provide a surface emitting laser package capable of providing high-power light and preventing moisture from entering the inside thereof.

Still another object of the embodiment is to provide a surface emitting laser package capable of improving heat dissipation performance.

Still another object of the embodiment is to provide a surface emitting laser package with enhanced fixability of a surface emitting laser element.

Still another object of the embodiment is to provide a surface emitting laser package capable of ensuring reliability of electrical connection.

Yet another object of the embodiment is to provide a surface emitting laser package capable of preventing surface damage of a diffusion part.

Technical Solution

According to one aspect of an embodiment to achieve the above or other objectives, a surface emitting laser package includes: a substrate; a surface emitting laser element disposed on the substrate; a housing disposed on the substrate, and surrounding the surface emitting laser element and having a step; a diffusion part disposed at the step of the housing; a conductive line disposed between the diffusion part and the surface emitting laser package and between the diffusion part and the step; a connection hole formed on one side of the step; and a connection wiring disposed in the connection hole and electrically connected to the conductive line. Wherein the conductive line includes at least two connection pads disposed between the diffusion part and the surface emitting laser package and between the diffusion part and the step, and at least two connection lines disposed between the diffusion part and the surface emitting laser package and between the diffusion part and the step, having a width smaller than that of the connection pad, and electrically connected to the connection pad.

According to another aspect of the embodiment, a surface emitting laser package includes: a housing including a seating portion, the seating portion having a first pattern; a surface emitting laser element disposed in the housing; and a diffusion part disposed on the seating portion of the housing, and having a second pattern having a shape corresponding to a shape of the first pattern.

Advantageous Effects

Effects of a surface emitting laser package according to an embodiment will be described as follows.

According to at least one of embodiments, there is an advantage that scratches, cracks, deviation, or detachment of a diffusion part may be easily detected by disconnection of a connection pad or a connection line disposed under the diffusion part. When a failure of the diffusion part is detected as described above, driving of a surface emitting laser element may be stopped to block irradiation of a strong laser beam to a user's eyes.

According to at least one of the embodiments, the connection line smaller than the connection pad is disposed in a part corresponding to the surface emitting laser element of the connection line and the connection pad disposed under the diffusion part, or the connecting line is not disposed in the part corresponding to the surface emitting laser element so as to minimize obstruction of progress of the laser beam from the surface emitting laser element to the diffusion part, and accordingly, there is an advantage that it is possible to prevent poor light diffusion of the laser beam or a decrease in light output.

According to at least one of the embodiments, each bump is wrapped by an adhesive part, the connection pad and the surface emitting laser element is attached by each bump, and accordingly, there is an advantage that electrical disconnection between the connection pad and the surface emitting laser element may be prevented by the surface emitting laser.

According to at least one of the embodiments, since the surface emitting laser element and the substrate are electrically connected by the conductive line and the bump disposed between the surface emitting laser element and the substrate, there is an advantage that a separate wire is not required.

According to at least one of the embodiments, a plurality of conductive lines are disposed under the diffusion part, and accordingly, there is an advantage that it is possible to easily detect detachment of the diffusion part by disconnection of the plurality of conductive lines.

According to at least one of the embodiments, the diffusion part is attached to the surface emitting laser element or a housing by the adhesive part, and accordingly, there is an advantage that adhesive force of the diffusion part may be strengthened to prevent the detachment of the diffusion part.

According to at least one of the embodiments, the adhesive part is disposed in all spaces in an opening of the housing including a circumference of the surface emitting laser element, and accordingly, the detachment of the diffusion part may be basically blocked.

According to at least one of the embodiments, a structure of the housing is changed and locations of the first and second electrodes are changed, and a central axis of a light emitting portion of the surface emitting laser element coincides with the central axis of the housing by using a dot electrode so that light is emitted from a central axis of the housing, and accordingly, there is an advantage that it is possible to ensure reliability of a sensing operation or an optical communication operation.

According to at least one of the embodiments, the surface emitting laser element and the second electrode portion are electrically connected by the dot electrode instead of the wire, and accordingly, there is an advantage that it is possible to reduce a product size.

According to at least one of the embodiments, the surface emitting laser element and the second electrode portion are electrically connected at the shortest distance by the dot electrode regardless of an area required for wire bonding, and accordingly, there is an advantage that it is possible to simplify a product structure.

According to at least one of the embodiments, the surface emitting laser element is buried in the adhesive part, and the surface emitting laser element is firmly fixed by the adhesive part, and accordingly, there is an advantage that it is possible to prevent detachment of the surface emitting laser element.

According to at least one of the embodiments, the wire is buried in the adhesive part, and the wire is firmly fixed by the adhesive part, and accordingly, there is an advantage that it is possible to prevent disconnection of the wire due to impact.

According to at least one of the embodiments, even though oxygen or moisture is permeated into the housing via the housing from the outside, it may be blocked by the adhesive part, and accordingly, there is an advantage that the surface emitting laser element may not be exposed to oxygen or moisture.

According to at least one of the embodiments, when only a material for forming the diffusion part is formed on a first pattern of the adhesive part, a second pattern is naturally formed on a lower surface of the diffusion part, and thus it is not necessary to separately form the second pattern of the diffusion part, and accordingly, there is an advantage that a process may be simplified and a process time may be reduced.

According to at least one of the embodiments, there is no need for a separate attaching process for attaching the diffusion part as in the related art, and there is no need to make a separate diffusion part in advance, and the diffusion part including the second pattern is formed directly in the housing, and thus a scratch of the diffusion part that may occur when performing the separate attaching process for attaching the diffusion part are not generated, and accordingly, there is an advantage that a design of a target divergence angle is easy.

According to at least one of the embodiments, a distance between an upper surface of the surface emitting laser element and the lower surface of the diffusion part is smaller than a distance between the upper surface of the surface emitting laser element and a bottom surface of the housing so as to enter the laser beam emitted from the surface emitting laser element to the diffusion part 440 at the shortest distance, and accordingly, there is an advantage that it is possible to minimize the divergence angle.

According to at least one of the embodiments, since a seating portion and the diffusion part of the housing are fitted and fastened by using a thread, and the diffusion part is firmly fixed to the seating portion, deviation of the diffusion part is prevented, and accordingly, there is an advantage that reliability of a product may be improved.

According to at least one of the embodiments, when the diffusion part is fastened to the seating portion, the diffusion part may be easily separated from the seating portion by being rotated in a direction opposite to the rotational direction, and accordingly, there is an advantage that the diffusion part is easily replaced when failures of the diffusion part occur.

According to at least one of the embodiments, the first pattern of the seating portion of the housing and the second pattern of the diffusion part may be further firmly fastened to each other by the adhesive member disposed between the first pattern of the seating portion of the housing and the second pattern of the diffusion part, and accordingly, there is an advantage that the detachment of the diffusion part may be basically blocked.

According to at least one of the embodiments, a diameter of the diffusion part is set smaller than a diameter of the seating portion of the housing so that a predetermined gap is formed between an outer surface of the diffusion part and an inner surface of the seating portion of the housing, and the adhesive member is disposed in such a gap. Accordingly, the diffusion part is more easily fitted and fastened to the seating portion of the housing, and in addition, the detachment of the diffusion part is basically blocked by adhesion of the diffusion part and the seating portion of the housing by the adhesive member as well as the fitting and fastening between the first pattern of the seating portion of the housing and the second pattern of the diffusion part, and accordingly, there is an advantage that reliability of a product may be improved.

According to at least one of the embodiments, while a side surface of the diffusion part and a side surface of the seating portion of the housing are fitted and fastened with threads, the adhesive member is disposed between the diffusion part and a bottom surface of the seating portion of the housing, so that the detachment of the diffusion part is basically blocked, and accordingly, there is an advantage that reliability of a product may be improved.

According to at least one of the embodiments, since an upper surface of the diffusion part is located lower than an upper surface of the housing, the upper surface of the diffusion part is protected by the upper surface of the housing, and accordingly, there is an advantage that a defect such as a scratch that may occur on the upper surface of the housing may be blocked.

MODES OF THE INVENTION

Hereinafter, embodiments of the present invention will be described in detail with reference to the accompanying drawings. However, the spirit and scope of the present embodiment is not limited to a part of the embodiments described, and may be implemented in various other forms, and within the spirit and scope of the present invention, one or more of the elements of the embodiments may be selectively combined and replaced. In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. In addition, the terms used in the embodiments of the present invention are for describing the embodiments and are not intended to limit the present invention. In this specification, the singular forms may also include the plural forms unless In detail stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used. These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements. Further, when described as being formed or disposed "on (over)" or "under (below)" of each element, the "on (over)" or "under (below)" may include not only when two elements are directly connected to each other, but also when one or more other elements are formed or disposed between two elements. Furthermore, when expressed as "on (over)" or "under (below)", it may include not only the upper direction but also the lower direction based on one element.

First Embodiment

Figure 1:
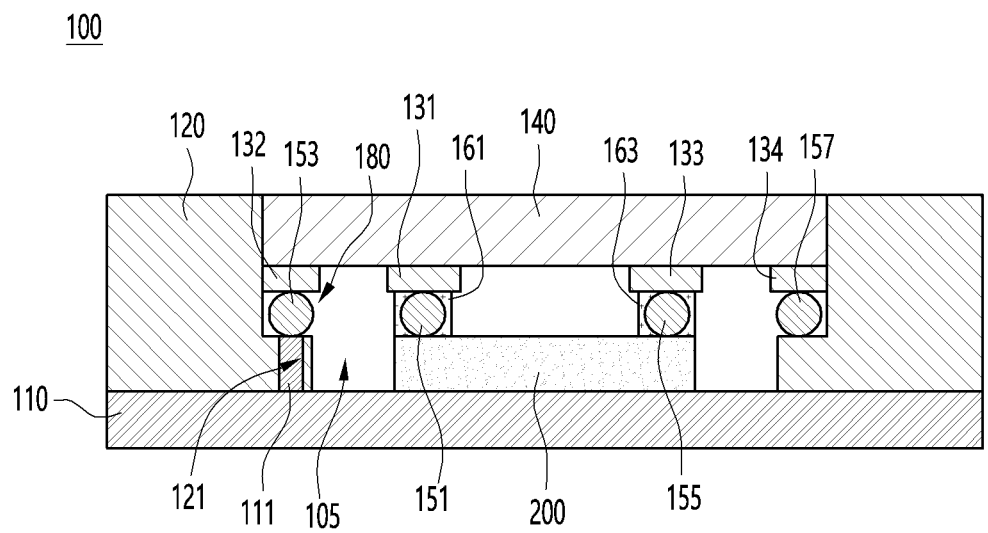
FIG. 1 is a cross-sectional view illustrating a surface emitting laser package according to a first embodiment.
Figure 2:
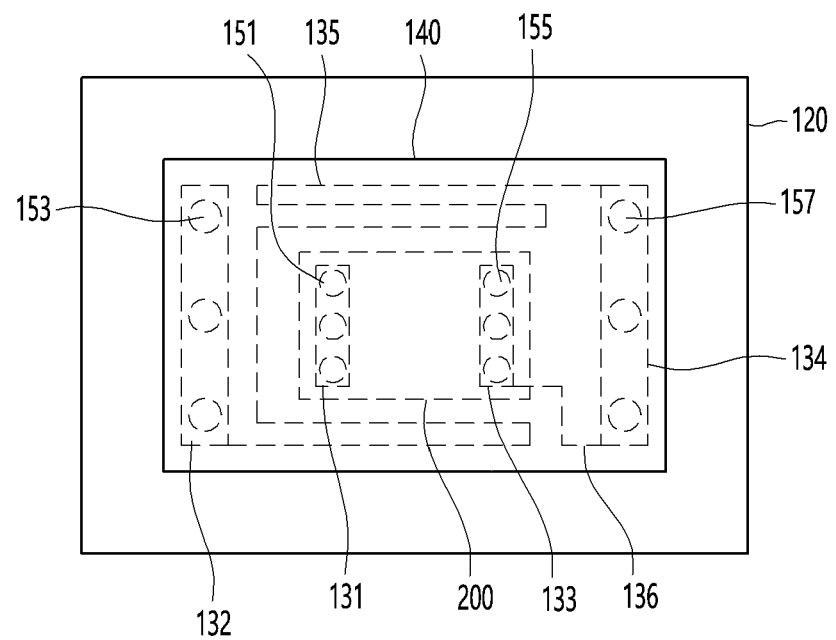
FIG. 2 is a plan view of the surface emitting laser package according to the first embodiment.

FIG. 1 is a cross-sectional view of a surface emitting laser package according to a first embodiment, and FIG. 2 is a plan view of the surface emitting laser package according to the first embodiment.

Referring to FIGS. 1 and 2, a surface emitting laser package 100 according to the first embodiment may provide a substrate 110. For example, the substrate 110 may include a printed circuit board. The substrate 110 may be a rigid type printed circuit board having no warpage characteristics or a flexible type printed circuit board having excellent warpage characteristics. The substrate 110 may provide driving power to a surface emitting laser element 200. The substrate 110 may include at least one signal line to be electrically connected to the surface emitting laser element 200. Power may be supplied to the surface emitting laser element 200 via the signal line of the substrate 110.

The surface emitting laser package 100 according to the first embodiment may provide the surface emitting laser element 200.

The surface emitting laser element 200 may be disposed on the substrate 110. For example, the surface emitting laser element 200 may be attached onto the substrate 110 by using an adhesive member. The adhesive member may be made of a conductive material such as silver (Ag) paste material, but the embodiment is not limited thereto. The surface emitting laser element 200 may be electrically connected to the substrate 110. For example, a first electrode of the surface emitting laser element 200 may be electrically connected to a first signal line (not shown) of the substrate 110 via the adhesive member.

Figure 3:
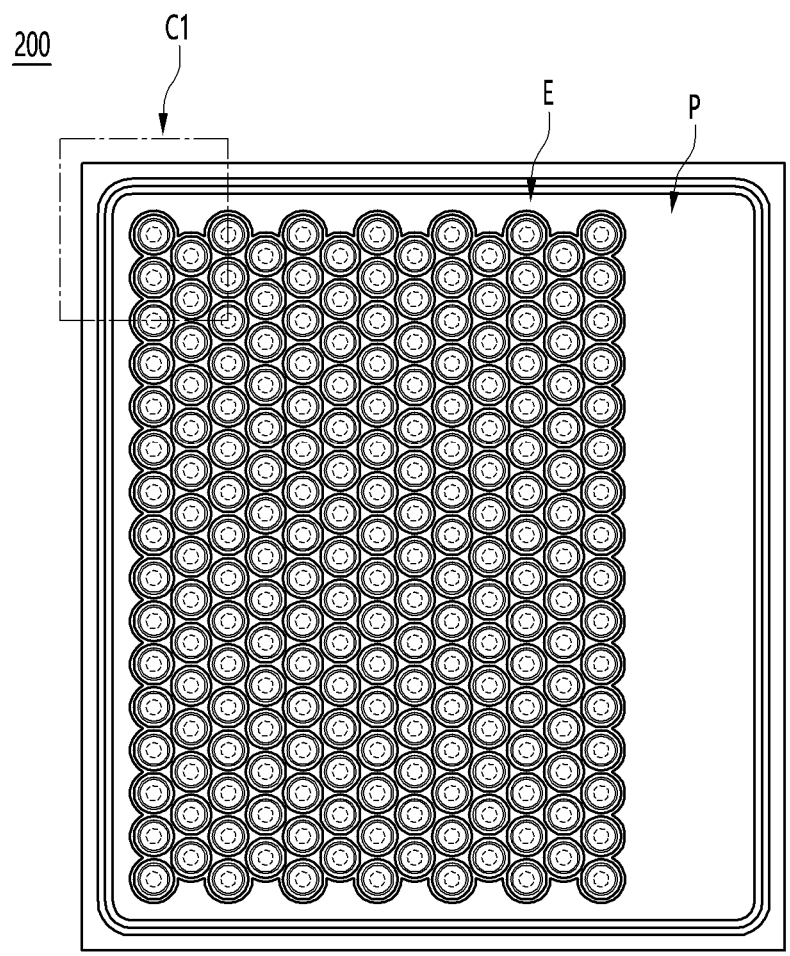
FIG. 3 is a plan view of a surface emitting laser element according to the first embodiment.

As shown in FIGS. 2 and 3, the surface emitting laser element 200 may include any one or more of a first electrode 215, a substrate 210, a first reflective layer 220, a cavity region 230, an aperture 241, an insulating region 242, a second reflective layer 250, a second electrode 282, a passivation layer 270, and a pad electrode 280.

The cavity region 230 may include an active layer (not shown) and a cavity (not shown), which will be described below. The insulating region 242 may include a first insulating region 242a disposed in a first emitter E1, a second insulating region 242b disposed in a second emitter E2, and a third insulating region 242c disposed in a third emitter E3, but the embodiment is not limited thereto.

Hereinafter, the surface emitting laser element 200 will be described in more detail.

FIGS. 2 to 5B, a surface emitting laser element 200 will be described in detail.

Figure 4:
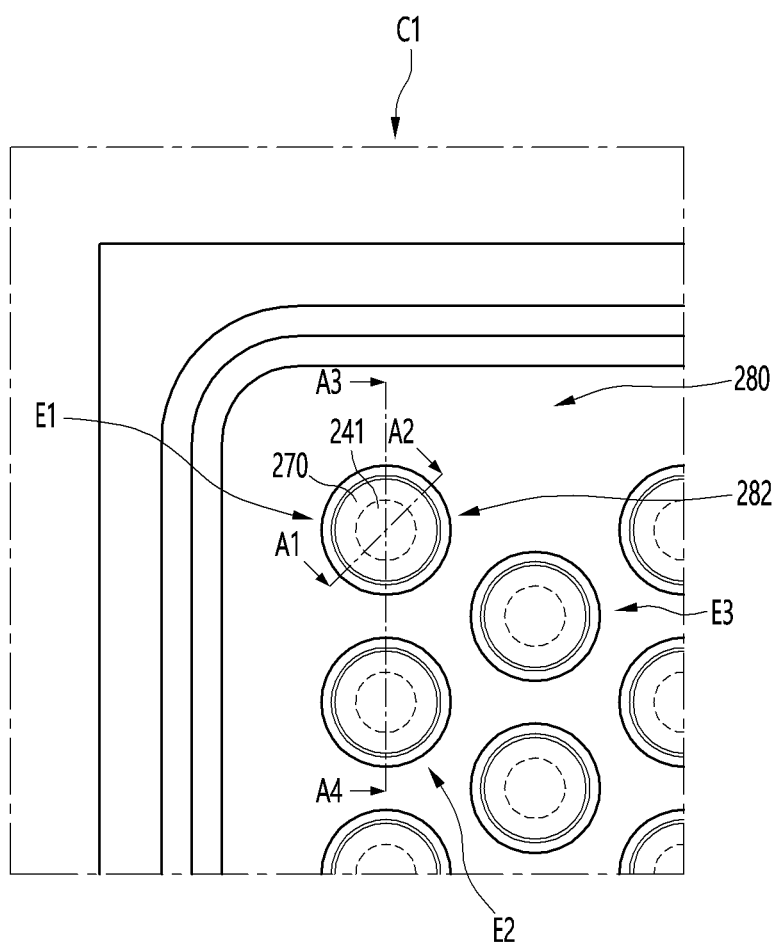
FIG. 4 is an enlarged view of one region C1 of the surface emitting laser element according to the first embodiment shown in FIG. 3.
Figure 5A:
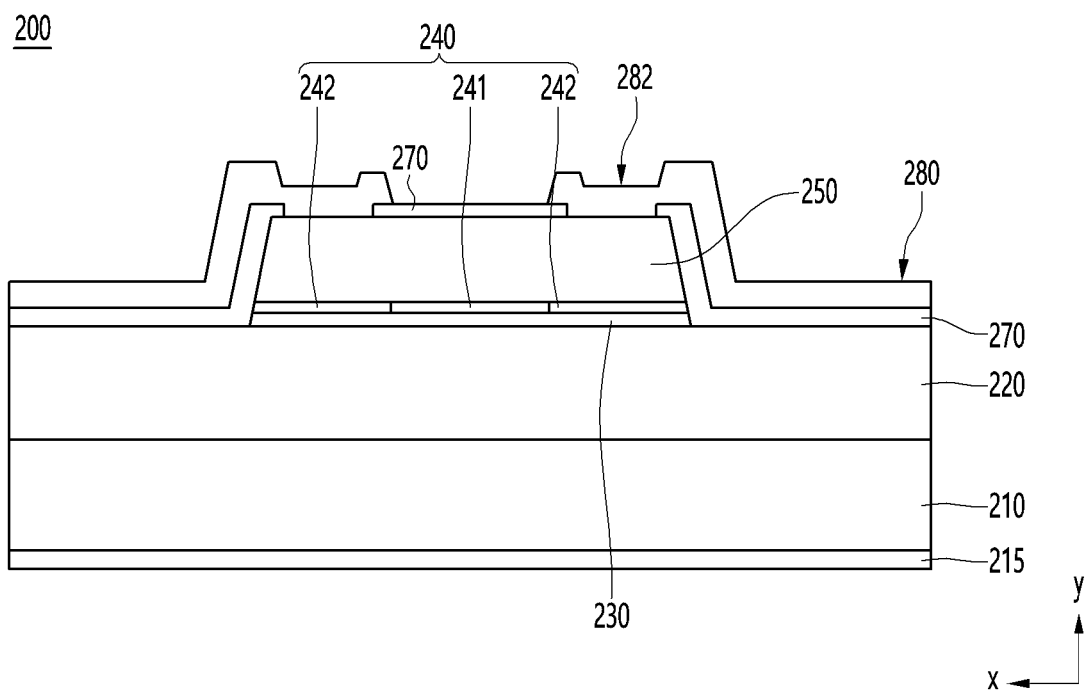
FIG. 5A is a first cross-sectional view taken along line A1-A2 of the surface emitting laser element according to the first embodiment shown in FIG. 4.
Figure 5B:
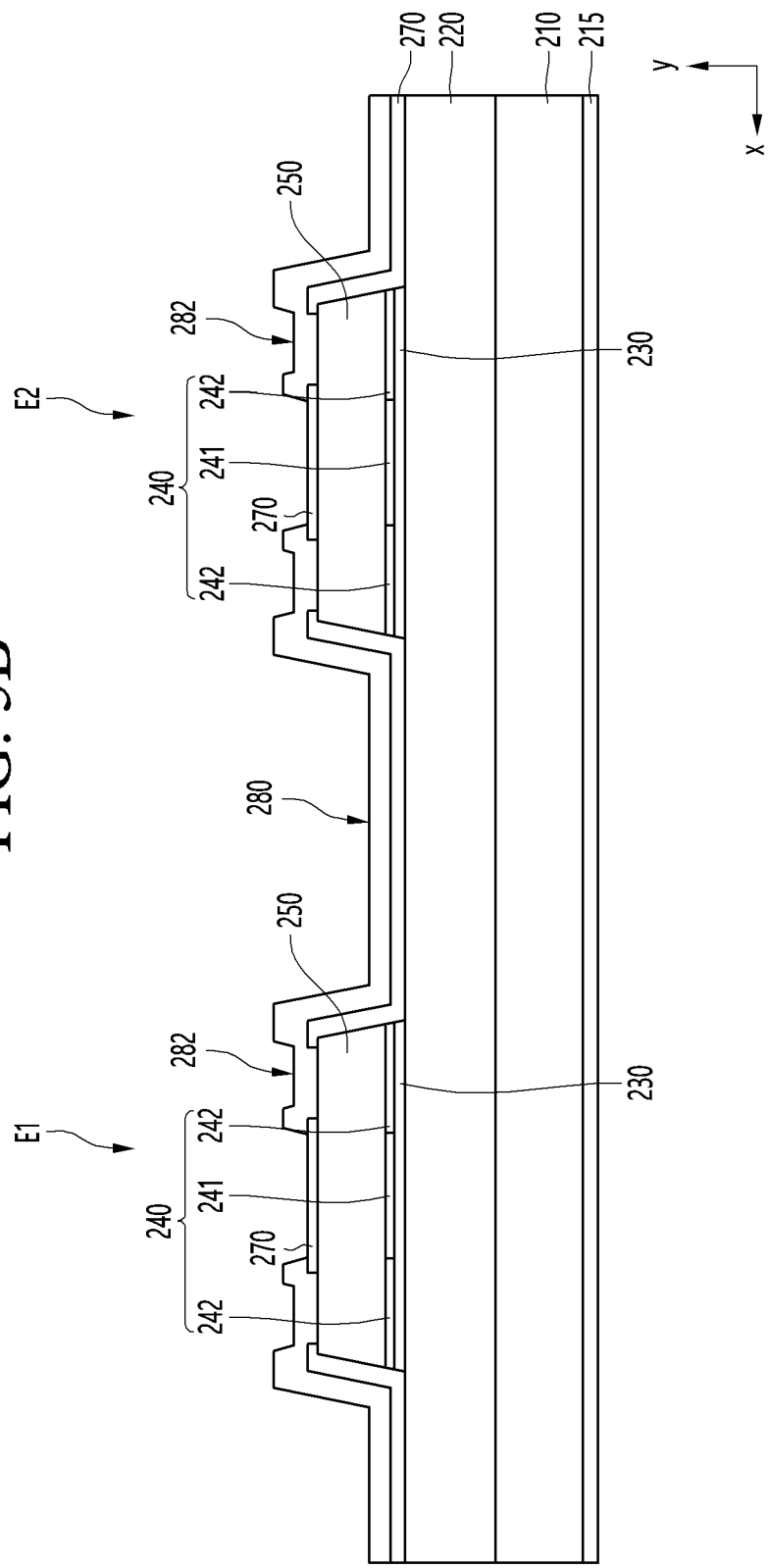
FIG. 5B is a second cross-sectional view taken along line A3-A4 of the surface emitting laser element according to the first embodiment shown in FIG. 4.

FIG. 2 is a plan view of the surface emitting laser element according to the first embodiment, and FIG. 4 is an enlarged view of one region C1 of the surface emitting laser element according to the first embodiment shown in FIG. 3. FIG. 5A is a first cross-sectional view taken along line A1-A2 of the surface emitting laser element according to the first embodiment shown in FIG. 4, and FIG. 5B is a second cross-sectional view taken along line A3-A4 of the surface emitting laser element according to the first embodiment shown in FIG. 4.

Referring to FIGS. 2 to 5B, the surface emitting laser element 200 according to the first embodiment may include a light emitting portion E and a pad portion P. As shown in FIG. 4, the light emitting portion E may be a region including a plurality of light emitting emitters E1, E2, and E3, and may be a region in which a laser beam is emitted. For example, the light emitting portion E may include several tens to hundreds of the light emitting emitters. The pad portion P may be a region not disposed in the light emitting emitters E1, E2, and E3.

The surface emitting laser element 200 according to the first embodiment may include a second electrode 282. That is, in each of the emission emitters E1, E2, and E3, the second electrode 282 may be disposed in a remaining region except for a region corresponding to the aperture 241. For example, the second electrode 282 may be disposed in a second region of the second reflective layer 250. A first region of the second reflective layer 250 may be surrounded by the second region, and may be equal to or larger than a size of the aperture 241. Therefore, a beam generated in a light emitting layer 230 passes through the aperture 241, and may be emitted to the outside via an aperture defined by the second electrode 282.

The surface emitting laser element 200 according to the first embodiment may include any one or more of the first electrode 215, the substrate 210, the first reflective layer 220, the light emitting layer 230, the oxidation layer 240, the second reflective layer 250, the passivation layer 270, and the second electrode 282.

The oxidation layer 240 may include the aperture 241 and the insulating region 242. The aperture 241 may be a passage region through which current flows. The insulating region 242 may be a blocking region that blocks the flow of current. The insulating region 242 may be referred to as an oxide layer or an oxidation layer.

The oxidation layer 240 may be referred to as a current confinement layer because it restricts the flow or density of current so as to emit a more coherent laser beam.

The surface emitting laser element 200 according to the first embodiment may further include the pad electrode 280.

The pad electrode 280 may be disposed in the pad portion P, that is, a region except for the light emitting portion E. The pad electrode 280 may be electrically connected to the second electrode 282. The first electrode 215 and the pad electrode 280 may be formed integrally or separately.

Hereinafter, technical features of the surface emitting laser element 200 according to the first embodiment will be described with reference to FIGS. 2 to 5B. In the drawing of the first embodiment, a direction of an x-axis may be a direction parallel to a longitudinal direction of the substrate 210, and a y-axis may be a direction perpendicular to the x-axis.

<Substrate, First Electrode>

The surface emitting laser element 200 according to the first embodiment provides the substrate 210. The substrate 210 may be a conductive substrate or a non-conductive substrate. A metal having excellent electrical conductivity may be used as the conductive substrate. Since heat generated during operation of the surface emitting laser element 200 should be sufficiently dissipated, a GaAs substrate or a metal substrate having high thermal conductivity, or a silicon (Si) substrate, or the like may be used as the conductive substrate. An AlN substrate, a sapphire ($Al_2O_3$) substrate, or a ceramic-based substrate may be used as the non-conductive substrate.

The surface emitting laser element 200 according to the first embodiment provides the first electrode 215. The first electrode 215 may be disposed under the substrate 210. The first electrode 215 may be disposed in a single layer or multiple layers as a conductive material. For example, the first electrode 215 may be a metal, may include at least one of aluminum (Al), titanium (Ti), chromium (Cr), nickel (Ni), copper (Cu), and gold (Au), and may be formed as a single layer or a multi-layer structure, thereby improving an electrical characteristic and a light output.

<First Reflective Layer>

The surface emitting laser element 200 according to the first embodiment provides the first reflective layer 220. The first reflective layer 220 may be disposed on the substrate 210. When the substrate 210 is omitted to reduce a thickness, a lower surface of the first reflective layer 220 may contact an upper surface of the first electrode 215.

The first reflective layer 220 may be doped with a first conductivity type dopant. For example, the first conductivity type dopant may include an n-type dopant such as Si, Ge, Sn, Se, Te, or the like.

The first reflective layer 220 may include a gallium-based compound, for example, AlGaAs, but the embodiment is not limited thereto. The first reflective layer 220 may be a distributed bragg reflector (DBR). For example, the first reflective layer 220 may have a structure in which a first layer and a second layer including materials having different refractive indexes are alternately stacked at least once.

For example, the first reflective layer 220 may include a plurality of layers disposed on the substrate 210. Each layer may include a semiconductor material having a composition formula of $Al_xGa_{(1-x)}As$ (0<x<1), and when the Al in each layer increases, a refractive index of each layer may decrease, and when Ga increases, the refractive index of each layer may increase. A thickness of each layer may be λ/4n, λ may be a wavelength of light generated in the light emitting layer 230, and n may be the refractive index of each layer with respect to light of the above-described wavelength. Here, λ may be from 650 to 980 nanometers (nm), and n may be the refractive index of each layer. The first reflective layer 220 having such a structure may have a reflectance of 99.999% with respect to light having a wavelength of about 940 nm.

The thickness of each layer in the first reflective layer 220 may be determined according to each refractive index and a wavelength λ of the light emitted from the light emitting layer 230.

<Active Layer>

The surface emitting laser element 200 according to the first embodiment may include the light emitting layer 230. The light emitting layer 230 may be disposed on the first reflective layer 220. In detail, the light emitting layer 230 may be disposed on the first reflective layer 220. The light emitting layer 230 may be disposed between the first reflective layer 220 and the second reflective layer 250.

The light emitting layer 230 may include the active layer and at least one cavity. For example, the light emitting layer 230 may include the active layer, a first cavity disposed under the active layer, and a second cavity disposed on the active layer. The light emitting layer 230 of the first embodiment may include both the first cavity and the second cavity, or may include only one of them.

The active layer may include any one of a single well structure, a multiple well structure, a single quantum well structure, a multi quantum well (MQW) structure, a quantum dot structure, or a quantum-wire structure.

The active layer may include a quantum well layer and a quantum wall layer using a compound semiconductor material of Group III-V or Group II-VI. The quantum well layer may be formed of a material having an energy band gap smaller than that of the quantum wall layer. The active layer may be formed of one to three pair structure such as InGaAs/AlxGaAs, AlGaInP/GaInP, AlGaAs/AlGaAs, AlGaAs/GaAs, GaAs/InGaAs, but the embodiment is not limited thereto. A dopant may not be doped in the active layer.

The first cavity and the second cavity may be formed of $Al_yGa_{(1-y)}As$ (0<y<1) material, but the embodiment is not limited thereto. For example, the first cavity and the second cavity may include a plurality of layers of $Al_yGa_{(1-y)}As$, respectively.

<Oxidation Layer>

The surface emitting laser element 200 according to the first embodiment may provide the oxidation layer 240. The oxidation layer 240 may include an insulating region 242 and an aperture 241. The insulating region 242 may surround the aperture 241. For example, the aperture 241 may be disposed on a first region (center region) of the light emitting layer 230, and the insulating region 242 may be disposed on a second region (edge region) of the light emitting layer 230. The second region may surround the first region.

The aperture 241 may be a passage region through which current flows. The insulating region 242 may be a blocking region that blocks the flow of current. The insulating region 242 may be referred to as an oxide layer or an oxidation layer.

An amount of current supplied from the second electrode 282 to the light emitting layer 230, that is, a current density may be determined by a size of the aperture 241. The size of the aperture 241 may be determined by the insulating region 242. As a size of the insulating region 242 increases, the size of the aperture 241 decreases, and accordingly, the current density supplied to the light emitting layer 230 may increase. In addition, the aperture 241 may be a passage through which the beam generated in the light emitting layer 230 travels in an upward direction, that is, in a direction of the second reflective layer 250. That is, a divergence angle of the beam of the light emitting layer 230 may be changed according to the size of the aperture 241.

The insulating region 242 may be formed of an insulating layer, for example, aluminum oxide ($Al_2O_3$). For example, when the oxidation layer 240 includes aluminum gallium arsenide (AlGaAs), the insulating region 242 may be formed as the AlGaAs of the oxidation layer 240 reacts with $H_2O$ and the edge thereof changes to aluminum oxide ($Al_2O_3$), and an aperture 241 including AlGaAs may be formed in a central region thereof not reacting with $H_2O$.

According to the first embodiment, light emitted from the light emitting layer 230 through the aperture 241 may be emitted toward an upper region, and compared with the insulating region 242, light transmittance of the aperture 241 may be excellent.

The insulating region 242 may include a plurality of layers. For example, the insulating region 242 may include the first insulating region, the second insulating region disposed on the first insulating region, and the third insulating region disposed on the second insulating region. One insulating region of the first to third insulating regions may have the same thickness as the other insulating regions, or may have a different thickness. The first to third insulating regions may include at least an oxidation material. The first to third insulating regions may include at least a compound semiconductor material of Group III-V or Group II-VI.

<Second Reflective Layer>

The surface emitting laser element 200 according to the first embodiment may include the second reflective layer 250. The second reflective layer 250 may be disposed on the oxidation layer 240.

The second reflective layer 250 may include a gallium-based compound such as AlGaAs, and the second reflective layer 250 may be doped with a second conductive dopant. For example, the second conductive dopant may be a p-type dopant such as Mg, Zn, Ca, Sr, and Ba. Meanwhile, the first reflective layer 220 may be doped with the p-type dopant, and the second reflective layer 250 may be doped with an n-type dopant.

The second reflecting layer 250 may also be a distributed Bragg reflector (DBR). For example, the second reflective layer 250 may have a structure in which a plurality of layers including materials having different refractive indexes are alternately stacked at least once.

Each layer of the second reflective layer 250 may include AlGaAs, and in detail, may be made of a semiconductor material having a composition formula of $Al_xGa_{(1-x)}As$ ($0<x<1$). Here, when Al increases, the refractive index of each layer may decrease, and when Ga increases, the refractive index of each layer may increase. A thickness of each layer of the second reflective layer 250 may be $\lambda/4n$, $\lambda$ may be a wavelength of light emitted from the active layer, and n may be the refractive index of each layer with respect to the light of the above-described wavelength.

The second reflective layer 250 having such a structure may have a reflectivity of 99.9% with respect to light having a wavelength region of 940 nm.

The second reflective layer 250 may be formed by alternately stacking layers, and the number of pairs of layers in the first reflective layer 220 may be greater than that of pairs of the layers in the second reflective layer 250. As described above, the reflectance of the first reflective layer 220 may be 99.999%, which may be greater than 99.9% of the reflectance of the second reflective layer 250.

In the first embodiment, the second reflective layer 250 may include a plurality of layers disposed on the light emitting layer 230. Each layer may be formed as a single or a plurality of layers.

<Passivation Layer, Second Electrode>

The surface emitting laser element 200 according to the first embodiment may provide the passivation layer 270. The passivation layer 270 may surround a partial region of a light emitting structure. The partial region of the light emitting structure may include, for example, the light emitting layer 230, the oxidation layer 240, and the second reflective layer 250. The passivation layer 270 may be disposed on an upper surface of the first reflective layer 220. The passivation layer 270 may be disposed on an edge region of the second reflective layer 250. When the light emitting structure is partially mesa-etched, a part of the upper surface of the first reflective layer 220 may be exposed, and the partial region of the light emitting structure may be formed. The passivation layer 270 may be disposed on a circumference of the partial region of the light emitting structure and on the upper surface of the exposed first reflective layer 220.

The passivation layer 270 may protect the light emitting structure from the outside, and may block electrical short between the first reflective layer 220 and the second reflective layer 250. The passivation layer 270 may be formed of an inorganic material such as $SiO_2$, but the embodiment is not limited thereto.

The surface emitting laser element 200 according to the first embodiment may provide the second electrode 282. The second electrode 282 may be electrically connected to the pad electrode 280. The second electrode 282 may be in contact with a part of an upper surface of the second reflective layer 250.

The second electrode 282 and the pad electrode 280 may be made of a conductive material. For example, the second electrode 282 and the pad electrode 280 may be formed of a single layer or a multilayer structure including at least one of platinum (Pt), aluminum (Al), titanium (Ti), chromium (Cr), nickel (Ni), tungsten (W), and copper (Cu), Gold (Au).

Referring again to FIGS. 1 and 4, the surface emitting laser package 100 according to the first embodiment may provide a plurality of wires 191. The wire 191 may be a connection member for electrically connecting the surface emitting laser element 200 to the second electrode unit 182.

The plurality of wires 191 may be spaced apart from each other. One side of each wire 191 may be electrically connected to the pad electrode 280 of the pad portion P of the surface emitting laser element 200, and the other side of each wire 191 may be electrically connected to the second electrode portion 182. For example, the pad electrode 280 may be electrically connected to the second electrode 282 of the surface emitting laser element 200. The pad electrode 280 may be integrally formed with the second electrode 282 of the surface emitting laser element 200.

The wire 191 may be electrically connected to the pad portion P and the second electrode portion 182 of the surface emitting laser element 200 by using a bonding process.

The highest point of the wire 191 may be located higher than an upper surface of the surface emitting laser element 200, in detail, an upper surface of the pad portion P of the surface emitting laser element 200.

Referring again to FIG. 1, the surface emitting laser package 100 according to the first embodiment may provide a housing 120. For example, the housing 120 may be disposed on the substrate 110.

In detail, the housing 120 may surround the surface emitting laser element 200. The surface emitting laser element 200 may be disposed to be spaced apart from an inner surface of the housing 120. The housing 120 may be attached on the substrate 110 using, for example, an adhesive member.

The housing 120 may have an opening 105. An upper surface of the substrate 110 may be exposed by the opening 105 of the housing 120, and the surface emitting laser element 200 may be disposed on the exposed upper surface of the substrate 110.

Figure 6:
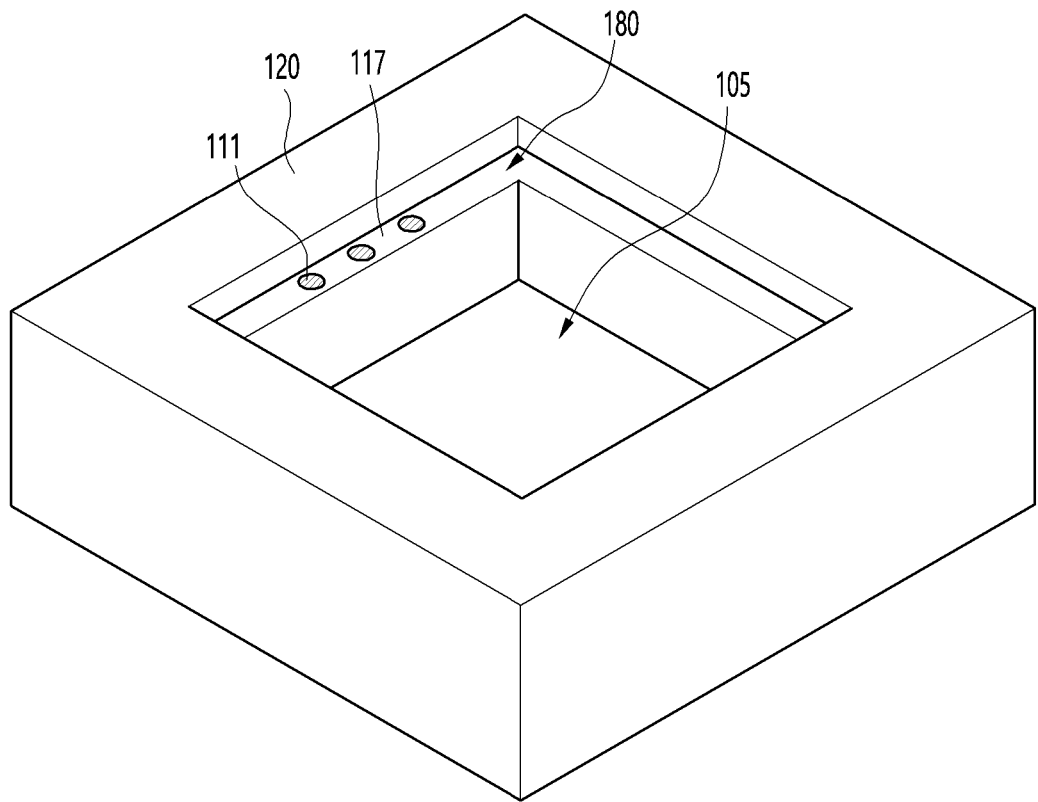
FIG. 6 is a perspective view of a surface emitting laser package according to a second embodiment.

The housing 120 may have a step 180. The step 180 may be formed at an upper portion of the housing 120. The step 180 may be connected to the opening 105 at the upper portion of the housing 120. The step 180 of the housing 120 may have a bottom surface 117 as shown in FIG. 6.

A plurality of connection wirings 111 may be disposed on one side of the housing 120. That is, the plurality of connection wirings 111 may be disposed in a connection hole 121 of the housing 120.

The connection wiring 111 may be disposed in the connection hole 121 of the housing 120. The connection hole 121 may be formed passing through from an upper surface of the housing 120 corresponding to the step 180 to a lower surface thereof. An inner diameter of each of the connection holes 121 may be the same as an outer diameter of each of the connection wirings 111.

An upper surface of each of the connection wirings 111 may be exposed to the bottom surface 117 of the step 180 of the housing 120. That is, the upper surface of each of the connection wirings 111 may be located coplanar with the bottom surface 117 of the step 180 of the housing 120. A lower surface of each of the connection wirings 111 may be exposed to the lower surface of the housing 120. That is, the lower surface of each of the connection wirings 111 may be located coplanar with the lower surface of the housing 120. The lower surface of each of the connection wirings 111 may be electrically connected to a second signal line (not shown) of the substrate 110.

The surface emitting laser package 100 according to the first embodiment may provide a diffusion part 140.

The diffusion part 140 may be disposed on the surface emitting laser element 200. The diffusion part 140 may be disposed to be spaced apart from the surface emitting laser element 200.

The diffusion part 140 may be made of a transparent insulating material. For example, the diffusion part 140 may be glass or a polymer resin. For example, the diffusion part 140 may include a body made of the glass and a diffusion pattern disposed on one side of the body and made of the polymer resin, but the embodiment is not limited thereto.

The diffusion part 140 may extend a viewing angle of a beam of light emitted from the surface emitting laser element 200.

The diffusion part 140 may include an anti-reflective function. For example, the diffusion part 140 may include an anti-reflective layer disposed on one surface facing the surface emitting laser element 200. The anti-reflective layer may be formed separately from the diffusion part 140. The diffusion part 140 may include the anti-reflective layer disposed on a lower surface facing the surface emitting laser element 200. The anti-reflective layer prevents a laser beam incident from the surface emitting laser element 200 from being reflected from a surface of the diffusion part 140 and transmits the light into the diffusion part 140, thereby improving light loss due to reflection.

The anti-reflective layer may be formed of, for example, an anti-reflective coating film and attached to the surface of the diffusion part 140. The anti-reflective layer may be formed on the surface of the diffusion part 140 by spin coating or spray coating, or the like. As an example, the anti-reflective layer may be formed as a single layer or multiple layers including at least one of a group consisting of $TiO_2$, $SiO_2$, $Al_2O_3$, $Ta_2O_3$, $ZrO_2$, and $MgF_2$.

The surface emitting laser package 100 according to the first embodiment may provide a conductive line. The conductive line may be disposed at a lower portion of the diffusion part 140. For example, the conductive line may be disposed on a lower surface of the diffusion part 140. The conductive line may be formed on the lower surface of the diffusion part 140, for example, by a sputtering process and an etching process, but the embodiment is not limited thereto.

As shown in FIG. 2, the conductive line may include a plurality of connection pads 131 to 134 and connection lines 135 and 136 electrically connecting between the pads.

Although a first connection pad 131 is not shown to be connected to a connection line in the drawing, in the embodiment, all of the plurality of connection pads 131 to 134 may be connected by the connection lines 135 and 136, or some pads of the plurality of connection pads 131 to 134 may not be connected by the connection line.

The plurality of connection pads 131 to 134 may be spaced apart from each other. For example, the first connection pad 131 may be disposed in a first region of the lower surface of the diffusion part 140, the second connection pad 132 may be disposed in a second region of the lower surface of the diffusion part 140, the third connection pad 133 may be disposed in a third region of the lower surface of the diffusion part 140, and the fourth connection pad 134 may be disposed in a fourth region of the lower surface of the diffusion part 140. The first region of the lower surface of the diffusion part 140 may be disposed between the second region of the lower surface of the diffusion part 140 and the third region of the lower surface of the diffusion part 140. The third region of the lower surface of the diffusion part 140 may be disposed between the first region of the lower surface of the diffusion part 140 and the fourth region of the lower surface of the diffusion part 140. The first region of the lower surface of the diffusion part 140 may correspond to a first region of an upper surface of the surface emitting laser element 200. The second region of the lower surface of the diffusion part 140 may correspond to the connection hole 121 of the housing 120. The connection wiring 111 may be disposed in the connection hole 121 of the housing 120. The third region of the lower surface of the diffusion part 140 may correspond to a second region of the upper surface of the surface emitting laser element 200. The fourth region of the lower surface of the diffusion part 140 may correspond to the other side of the connection hole 121 of the housing 120.

A length of each of the first to fourth connection pads 131 to 134 may be different from each other. For example, the length of each of the first and third connection pads 131 and 133 may be smaller than that of each of the second and fourth connection pads 132 and 134. The length of each of the first and second connection pads 131 and 132 may be smaller than a horizontal width or a vertical width of the surface emitting laser element 200. For example, the length of each of the first and second connection pads 131 and 132 may be equal to or greater than that of the second electrode of the surface emitting laser element 200. Each of the second and fourth connection pads 132 and 134 may have a length greater than the horizontal width or the vertical width of the surface emitting laser element 200. The length of each of the second and fourth connection pads 132 and 134 may be smaller than a length of the step 180 formed at one side of the housing 120.

The second connection pad 132 may be disposed to correspond to the connection hole 121 of the housing 120 adjacent to a first side of the surface emitting laser element 200. The fourth connection pad 134 may be disposed to correspond to the other side of the connection hole 121 of the housing 120 adjacent to a second side opposite to the first side of the surface emitting laser element 200.

A first connection line 135 is a member that electrically connects the second connection pad 132 and the fourth connection pad 134. The first connection line 135 may be disposed in any form between the second connection pad 132 and the fourth connection pad 134. For example, the first connection line 135 may be disposed along a periphery of the surface emitting laser element 200 at the lower surface of the diffusion part 140. For example, the first connection line 135 is disposed so as not to be overlapped with the surface emitting laser element 200 at the lower surface of the diffusion part 140, and thus it is possible not to obstruct a path of the laser beam from the surface emitting laser element 200.

A second connection line 136 is a member that electrically connects the third connection pad 133 and the fourth connection pad 134, and it may be disposed in any form between the third connection pad 133 and the fourth connection pad 134.

The first connection pad 131 may be electrically connected to the second connection pad 132 using a connection line. The first connection pad 131 may be electrically connected to the third connection pad 133 by using a connection line. The first connection pad 131 may be electrically connected to the fourth connection pad 134 using a connection line.

At least one connection pad of the first connection pad 131 and the third connection pad 133 may be connected to the second connection pad 132. The first connection pad 131 may be electrically connected to the second connection pad 132, and the third connection pad 133 may not be electrically connected to any connection pad. The fourth connection pad 134 may not be electrically connected to any connection pad.

The third connection pad 133 may be electrically connected to the second connection pad 132 using a connection line.

A width of a connection line may be smaller than that of a connection pad. For example, the width of the connection pad may be equal to or greater than a diameter of bumps 151, 153, 155, and 157 described later. For example, a width of each of connection lines may be 3% to 10% of a width of each of connection pads. When the width of each of the connection lines is less than or equal to 3% of the width of each of the connection pads, a resistance component becomes large so that current does not flow easily. When the width of each of the connection lines is 10% or more of the width of each of the connection pads, it may obstruct progress of the laser beam of the surface emitting laser element 200. As described above, connection pads that require electrical contact with the bumps 151, 153, 155, and 157 have relatively large widths, and connection lines that do not require electrical contact with the bumps 151, 153, 155, and 157 have remarkably small widths, and thus it is possible to prevent poor light diffusion of the laser beam or a decrease in light output by minimizing obstruction of progress of the laser beam from the surface emitting laser element 200 to the diffusion part 140.

According to the first embodiment, scratches, cracks, deviation, or detachment of the diffusion part 140 may be easily detected by disconnection of a connection pad or a connection line disposed under the diffusion part 140. When a failure of the diffusion part 140 is detected as described above, driving of the surface emitting laser element 200 may be stopped to block irradiation of a strong laser beam to a user's eyes.

The conductive line may include a conductive material. For example, the conductive line is a transparent conductive material, and may be ITO or TCO. For example, the conductive line is an opaque conductive material, and may be aluminum (Al), copper (Cu), gold (Au), chromium (Cr), tungsten (W), or an alloy thereof.

As shown in FIG. 7, the plurality of connection pads and the plurality of connection lines may be disposed in various forms.

Figure 7A:
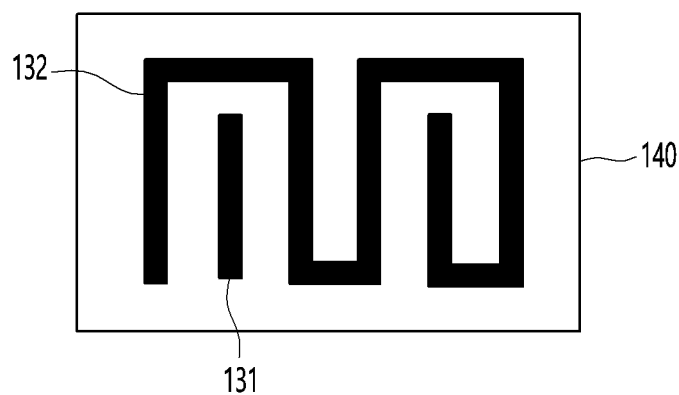
FIGS. 7A to 7C are plan views of a surface emitting laser package according to a third embodiment.

As shown in FIG. 7A, it is possible to include the first connection pad 131 disposed on the lower surface of the diffusion part 140, and the second connection pad 132 which is spaced apart from the first connection pad 131, not electrically connected, and disposed in a zigzag form. That is, the first connection pad 131 and the second connection pad 132 may not be connected by the connection line. The first connection pad 131 may correspond to at least one region of the upper surface of the surface emitting laser element 200.

Although the first connection pad 131 and the second connection pad 132 are not electrically connected in the drawing, the first connection pad 131 and the second connection pad 132 may be electrically connected to each other.

When the first connection pad 131 is not electrically connected to the second connection pad 132, the second connection pad 132 is not electrically connected to the second signal line of the substrate 110 via the connection wiring 111. In this case, the first connection pad 131 and the first bump 151 may not serve as an electrode, but may serve as a pillar supporting the diffusion part 140. When the first connection pad 131 is electrically connected to the second connection pad 132, the first connection pad 131 and the first bump 151 may serve as the pillar supporting the diffusion part 140 as well as the electrode connecting the second signal line.

In FIG. 7A, a connection line may be omitted. Alternatively, in FIG. 7A, the second connection pad 132 corresponding to the connection wiring 111 disposed on the step 180 of the housing 120 may be formed in a pad shape among shapes of the second connection pads 132, and the other second connection pad 132 may be formed as a line having a width smaller than that of the pad.

Figure 7B:
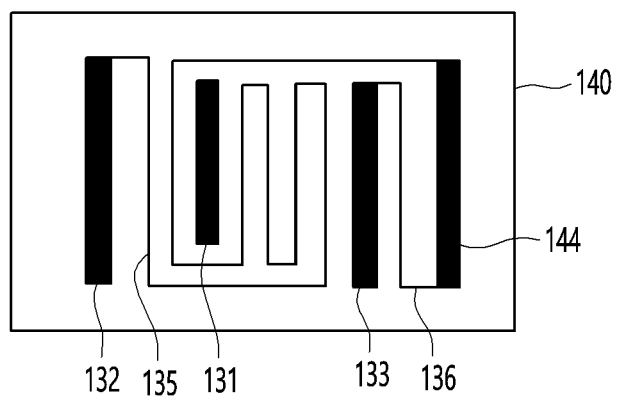

In FIG. 7B, disposition of the first to fourth connection pads 131 to 134 is the same as that of FIG. 2. However, disposition of the connection lines 135 and 136 in FIG. 7B is different from that in FIG. 2. Although the first connection pad 131 is not electrically connected to other connection pads or connection lines in the drawing, the first connection pad 131 may be electrically connected to other connection pads or connection lines.

Figure 7C:
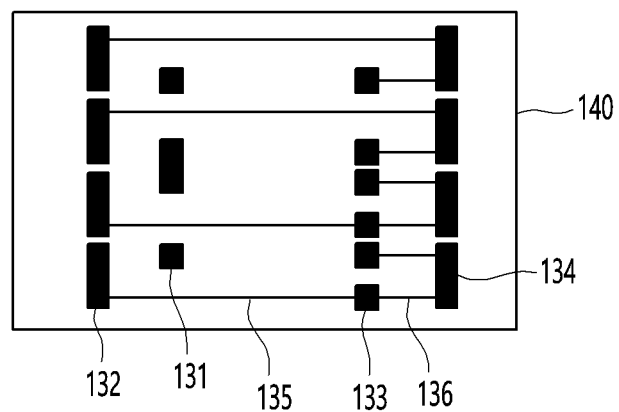

As shown in FIG. 7C, each of the first to fourth connection pads may be composed of a plurality of pads spaced apart from each other. Although the first connection pad 131 is not electrically connected to other connection pads or connection lines in the drawing, the first connection pad 131 may be electrically connected to other connection pads or connection lines.

The surface emitting laser package 100 according to the first embodiment may provide a plurality of bumps 151, 153, 155, and 157.

The plurality of first bumps 151 may be disposed between the first connection pad 131 and the surface emitting laser element 200. In detail, the first bump 151 may be disposed between the first connection pad 131 and one region of the upper surface of the surface emitting laser element 200. The first bump 151 may be in electrical contact with the second electrode of the surface emitting laser element 200. The second bump 153 may be disposed between the second connection pad 132 and the housing 120. In detail, the second bump 153 may be disposed between the second connection pad 132 and a connection hole 121 region of the housing 120.

When the first connection pad 131 and the second connection pad 132 are electrically connected by the connection line, the surface emitting laser element 200 may be connected to the second signal line of the substrate 110 via the first bump 151, the first connection pad 131, the second connection pad 132, the second bump 153, and the connection wiring 111 disposed in the connection hole 121 region of the housing 120. Since the surface emitting laser element 200 is electrically connected to the second signal line of the substrate 110, an electrical passage composed of the first signal line of the substrate 110→the surface emitting laser element 200→the first bump 151→the first connection pad 131→the second connection pad 132→the second bump 153→the connection wiring 111→the second signal line of substrate 110 may be formed. Therefore, the laser beam may be emitted from the surface emitting laser element 200 by power applied to the first and second signal lines of the substrate 110.

The plurality of third bumps 155 may be disposed between the third connection pads 133 and the surface emitting laser element 200. In detail, the third bump 155 may be disposed between the third connection pad 133 and the other region of the upper surface of the surface emitting laser element 200. The third bump 155 may be in electrical contact with the second electrode of the surface emitting laser element 200. The fourth bump 157 may be disposed between the fourth connection pad 134 and the housing 120. In detail, the fourth bump 157 may be disposed between the fourth connection pad 134 and the other region of the connection hole 121 of the housing 120. As shown in FIG. 2, the third connection pad 133 and the fourth connection pad 134 may be electrically connected by the second connection line 136, and the second connection pad 132 and the third connection pad 133 may be electrically connected by the first connection line 135. Accordingly, an electrical passage composed of the first signal line of the substrate 110→the surface emitting laser element 200→the third bump 155→the third connection pad 133→the second connection line 136→the fourth connection pad 134→the first connection line 135→the second connection pad 132→the second bump 153→the connection wiring 111→the substrate 110. Therefore, the laser beam may be emitted from the surface emitting laser element 200 by power applied to the first and second signal lines of the substrate 110.

The first to fourth bumps may be made of a metal material. For example, the first to fourth bumps 151, 153, 155, and 157 may be made of gold (Au) or aluminum (Al), but the embodiment is not limited thereto.

The first to fourth bumps 151, 153, 155, and 157 described above may be referred to as dots.

The surface emitting laser package 100 according to the first embodiment may provide adhesive parts 161 and 163.

The adhesive parts 161 and 163 may include a first adhesive part 161 and a second adhesive part 163.

The first and second adhesive parts 161 and 163 may be made of a material having excellent adhesiveness and heat dissipation characteristics. For example, the first and second adhesive parts 161 and 163 may include a resin-based insulating material. For example, the first and second adhesive parts 161 and 163 may be provided with a silicone resin, an epoxy resin, a thermosetting resin including a plastic material, or a high heat-resistant material.

The first and second adhesive parts 161 and 163 may be made of a material having excellent conductivity. For example, the first and second adhesive parts 161 and 163 may be silver (Ag) paste, but the embodiment is not limited thereto.

The first adhesive part 161 may surround the first bump 151 located between the first connection pad 131 and the surface emitting laser element 200. The second adhesive part 163 may surround the third bump 155 located between the third connection pad 133 and the surface emitting laser element 200.

Although not shown in the drawing, the adhesive parts 161 and 163 may surround the second bump 153 located between the second connection pad 132 and the connection hole 121 region of the housing 120, or may surround the fourth bump 157 located between the fourth connection pad 134 and the other region of the connection hole 121 of the housing 120.

According to the first embodiment, the second adhesive part 163 surrounds the third bump 155, and is attached to the third connection pad 133 and the second electrode 282 of the surface emitting laser element 200, and thus electrical disconnection between the third connection pad 133 and the second electrode 282 of the surface emitting laser element 200 may be prevented by the third bump 155.

According to the first embodiment, no wire is required for the surface emitting laser element 200. That is, the surface emitting laser element 200 and the substrate 110 may be electrically connected to each other by conductive lines 131 to 136, which are disposed between the surface emitting laser element 200 and the substrate 110, and bumps. Accordingly, in the first embodiment, it is possible to prevent failures due to disconnection of the wire in the related art.

According to the first embodiment, the first to fourth connection pads 131 to 134 and the first and second connection lines 135 and 136 are provided in the diffusion part 140, and accordingly, detachment of the diffusion part 140 may be easily detected by disconnection of the first to fourth connection pads 131 to 134 and the first and second connection lines 135 and 136. For example, when one of the first to fourth connection pads 131 to 134 and the first and second connection lines 135 and 136 is disconnected, an electrical passage between the substrate 110 and the surface emitting laser element 200 is blocked so that the laser beam is not emitted from the surface emitting laser element 200, and accordingly, the detachment of the diffusion part 140 may be detected by emission of the laser beam.

According to the first embodiment, the diffusion part 140 is attached to the surface emitting laser element 200 or the housing 120 by the adhesive parts 161 and 163, and accordingly, the adhesive force of the diffusion part 140 may be strengthened to prevent the detachment of the diffusion part 140.

Second Embodiment

Figure 8:
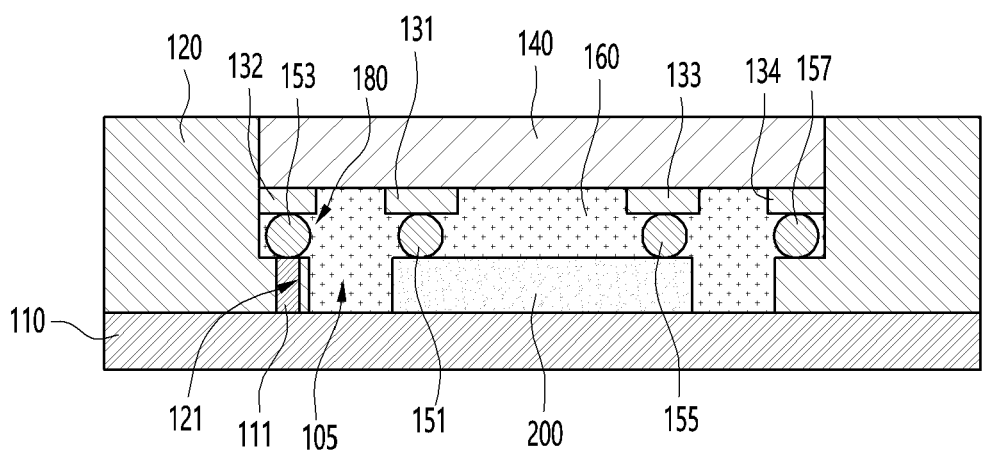
FIG. 8 is a cross-sectional view of the surface emitting laser package according to the third embodiment.

FIG. 8 is a cross-sectional view of a surface emitting laser package according to a second embodiment.

The second embodiment is the same as the first embodiment except for an adhesive part 160. In description of the second embodiment, components having the same functions, shapes, and/or structures as those of the first embodiment will be denoted by the same reference numerals and detailed description thereof will be omitted. The description omitted in the second embodiment may be easily understood from the description of the first embodiment.

Referring to FIG. 8, a surface emitting laser package 100A according to the second embodiment may provide the adhesive part 160.

The adhesive part 160 may be disposed between one region of a diffusion part 140 and one region of a surface emitting laser element 200, between one region of the diffusion part 140 and one region of a substrate 110, and one region of the diffusion part 140 and one region of the surface emitting laser element 200 and one region of the substrate 110.

The adhesive part 160 may be disposed between the other region of the diffusion part 140 and the other region of the surface emitting laser element 200, between the other region of the diffusion part 140 and the other region of the substrate 110, and between the other region of the diffusion part 140 and the other region of the surface emitting laser element 200 and the other region of the substrate 110.

The adhesive part 160 may be disposed in a spatial region between the surface emitting laser element 200 and an inner surface of the housing 120 and between the diffusion part 140 and the inner surface of the housing 120 at an opening 105 of the housing 120.

The adhesive part 160 may be disposed between the surface emitting laser element 200 and the diffusion part 140 corresponding to a first connection pad 131 and a third connection pad 133.

According to the second embodiment, the adhesive part 160 is disposed in all spaces in the opening 105 of the housing 120 including a circumference of the surface emitting laser element 200, and accordingly, not only the diffusion part 140 but also the housing 120 is adhered by the adhesive part 160, so that detachment of the diffusion part 140 may be basically blocked.

Third Embodiment

Figure 9:
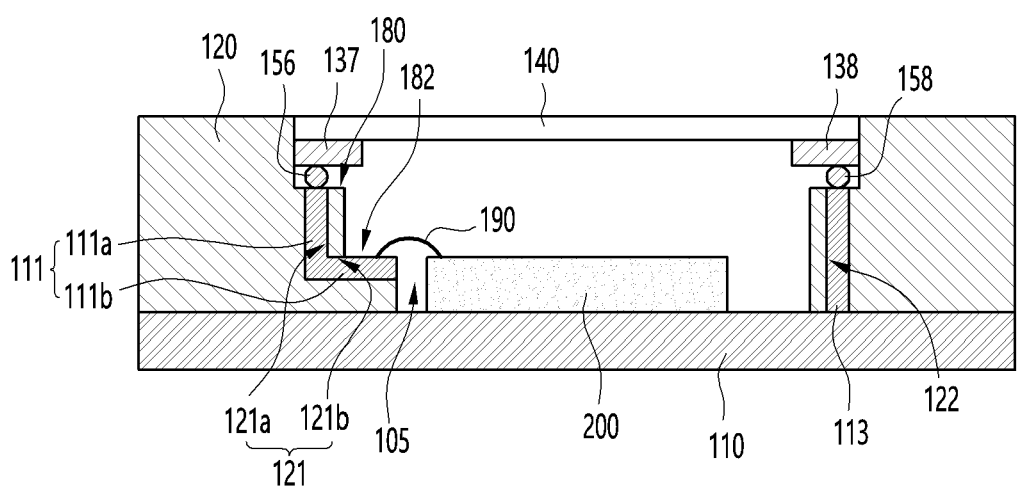
FIG. 9 is a cross-sectional view of a surface emitting laser package according to a third embodiment.
Figure 10:
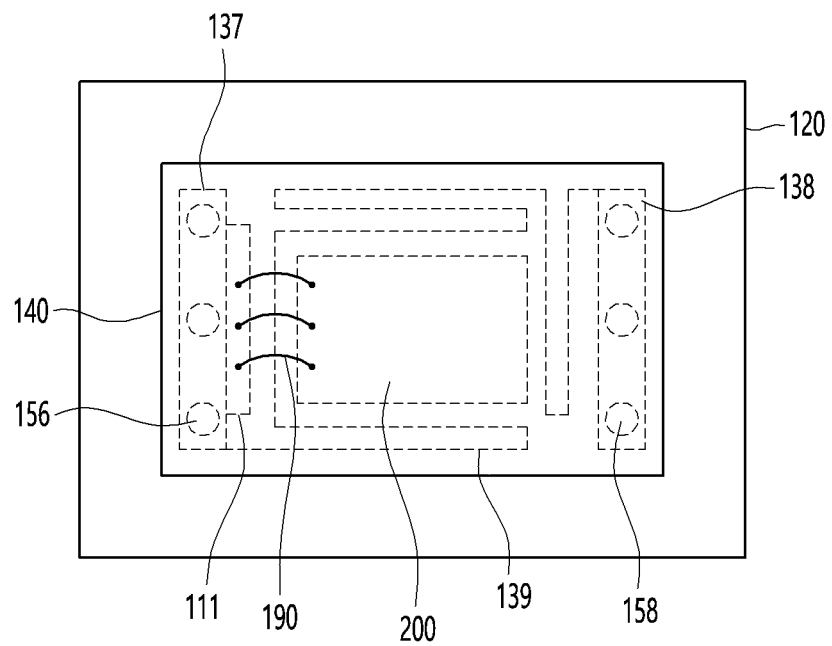
FIG. 10 is a plan view of the surface emitting laser package according to the third embodiment.

FIG. 9 is a cross-sectional view of the surface emitting laser package according to a third embodiment, and FIG. 10 is a plan view of the surface emitting laser package according to the third embodiment.

In description of the third embodiment, components having the same functions, shapes, and/or structures as those of the first and second embodiments will be denoted by the same reference numerals and detailed description thereof will be omitted. The description omitted in the third embodiment may be easily understood from the description of the first and second embodiments.

Referring to FIGS. 9 and 10, a surface emitting laser package 100B according to the third embodiment may include a substrate 110, a surface emitting laser element 200 disposed on the substrate 110, a housing 120 surrounding the surface emitting laser element 200, and a diffusion part 140 disposed on the surface emitting laser element 200.

The housing 120 may have an opening 105 penetrated vertically. The housing 120 may have a first step 180 formed at an upper side thereof and connected to the opening 105. The housing 120 may have a second step 182 formed at least at a location lower than an upper surface of the first step 180. The first step 180 may be formed along an inner side of the housing 120. The second step 182 is formed adjacent to a connection hole 121, but may or may not be formed along the inner side of the housing 120. A bottom surface of the second step 182 may extend from a bottom surface of the first step 180 toward the center of the housing 120.

The housing 120 may include a first connection hole 121 and a second connection hole 122. The second connection hole 122 may be formed so as to pass through vertically the housing 120 corresponding to the other side of the first connection hole 121.

The first connection hole 121 may include a vertical connection hole 121a formed along a vertical direction and a horizontal connection hole 121b connected to the vertical connection hole 121a and formed along a horizontal direction. The vertical connection hole 121a is formed vertically at an upper side of the first step 180, and the horizontal connection hole 121b may be connected to the vertical connection hole 121a to be formed along the horizontal direction so as to be exposed to a side portion of the second step 182. The horizontal connection hole 121b may be connected to an upper side of the second step 182.

Instead of the vertical connection hole 121a and the horizontal connection hole 121b, a round type connection hole may be formed. One side of the round type connection hole may be exposed to an inner surface of the housing 120, and the other side of the round type connection hole may be exposed to the upper side of the first step 180 of the housing 120.

A first connection wiring 111 may be disposed in the first connection hole 121. A cross section of the first connection wiring 111 may be circular, rectangular, or other shapes. In detail, the first connection wiring 111 may include a vertical connection wiring 111a disposed in the vertical connection hole 121a and a horizontal connection wiring 111b disposed in the horizontal connection hole 121b. One side of the vertical connection wiring 111a may be exposed on the bottom surface of the first step 180. One side of the horizontal connection wiring 111b may be in contact with the vertical connection wiring 111a and the other side of the horizontal connection wiring 111b may be disposed on the bottom surface of the second step 182. In this case, an upper surface of the horizontal connection wiring 111b and an upper surface of the surface emitting laser element 200 may be located on the same line. That is, the upper surface of the horizontal connection wiring 111b and the upper surface of the surface emitting laser element 200 may have the same location. Alternatively, the upper surface of the horizontal connection wiring 111b may be lower than the upper surface of the surface emitting laser element 200. Accordingly, the wire 190 may electrically connect the surface emitting laser element 200 and the horizontal connection wiring 111b.

As shown in FIG. 10, the horizontal connection wiring 111b may be disposed long along in a longitudinal direction of a first connection pad 137. Accordingly, a plurality of wires 190 may be easily bonded to different regions of the horizontal connection wiring 111b.

The second electrode of the surface emitting laser element 200 and the horizontal connection wiring 111b may be electrically connected by using the plurality of wires 190. In detail, one side of the wire 190 is electrically connected to the second electrode of the surface emitting laser element 200, and the other side of the wire 190 may be electrically connected to one region of the upper surface of the horizontal connection wiring 111b of the first connection wiring.

A second connection wiring 113 may be disposed in the second connection hole 122.

A conductive line including the first connection pad 137, a second connection pad 138, and a connection line 139 may be disposed on a lower surface of the diffusion part 140. The first connection pad 137 and the second connection pad 138 may be electrically connected by the connection line.

The first connection pad 137 may be the same as the second connection pad 132 shown in FIG. 1, and the second connection pad 138 may be the same as the fourth connection pad 134 shown in FIG. 1. In the third embodiment, since the surface emitting laser element 200 is not electrically connected to any connection pad, the first connection pad 131 and the third connection pad 133 shown in FIG. 1 may be omitted.

The connection line 139 may be disposed in a zigzag form between the first connection pad 137 and the second connection pad 138, but may be disposed in any form. In the drawing, although the connection line is shown so as not to be overlapped with the surface emitting laser element 200, the connection line may be disposed to be overlapped with the surface emitting laser element 200.

A first bump 156 may be disposed between the first connection pad 137 and the first connection wiring 111 so that the first connection pad 137 and the first connection wiring 111 may be electrically connected by the first bump 156. In detail, one side of the first bump 156 may be in contact with a lower surface of the first connection pad 137, and the other side of the first bump 156 may be in contact with an upper surface of the vertical connection wiring 111a of the first connection wiring 111.

A second bump 158 is disposed between the second connection pad 138 and the second connection wiring 113, and the second connection pad 138 and the second connection wiring 113 may be electrically connected by the second bump 158. In detail, one side of the second bump 158 may be in contact with a lower surface of the second connection pad 138, and the other side of the second bump 158 may be in contact with an upper surface of the second connection wiring 113.

A lower surface of the surface emitting laser element 200, that is, the first electrode may be electrically connected to a first signal line of the substrate 110. A lower surface of the second connection wiring 113 may be electrically connected to a second signal line of the substrate 110. Accordingly, an electrical passage composed of the first signal line of the substrate 110→the surface emitting laser element 200→the wire 190→the first connection wiring 111→the first bump 156→the first connection pad 137→the connection line→the second connection pad 138→the second bump 158→the second connection wiring 113→the substrate 110. Therefore, the laser beam may be emitted from the surface emitting laser element 200 by power applied to the first and second signal lines of the substrate 110.

Although not shown in the drawing, an adhesive part may be disposed around the first bump 156 and around the second bump 158.

Fourth Embodiment

Figure 11:
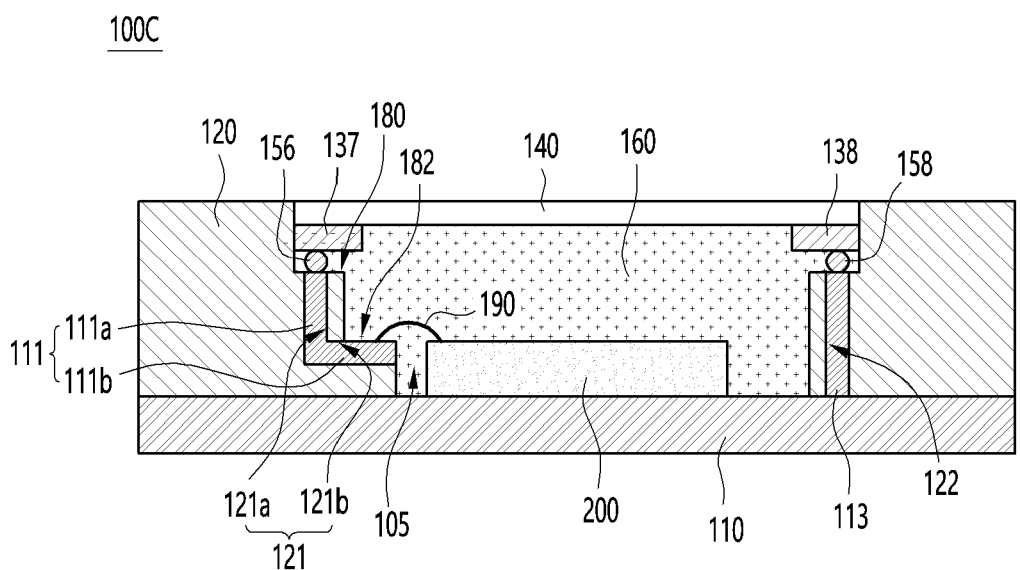
FIG. 11 is a cross-sectional view of a surface emitting laser package according to a fourth embodiment.

FIG. 11 is a cross-sectional view of a surface emitting laser package according to a fourth embodiment.

The fourth embodiment is the same as the third embodiment except for an adhesive part 160. In description of the fourth embodiment, components having the same functions, shapes, and/or structures as those of the third embodiment will be denoted by the same reference numerals and detailed description thereof will be omitted. The description omitted in the fourth embodiment may be easily understood from the description of the fourth embodiment.

Referring to FIG. 11, a surface emitting laser package 100C according to the fourth embodiment may provide the adhesive part 160.

The adhesive part 160 may be disposed in an opening 105 of a housing 120. The adhesive part 160 may be disposed between a surface emitting laser element 200 and a diffusion part 140. The adhesive part 160 may be disposed around the surface emitting laser element 200. The adhesive part 160 may be disposed on a first step 180 and a second step 182 of the housing 120. The adhesive part 160 may be disposed between a first connection pad 137 and a second connection pad 138. The adhesive part 160 may be disposed around a first bump 156 and around a second bump 158.

According to the fourth embodiment, the adhesive part 160 is disposed in all spaces in the opening 105 of the housing 120 including a circumference of the surface emitting laser element 200, and accordingly, not only the diffusion part 140 but also the housing 120 is adhered by the adhesive part 160, so that detachment of the diffusion part 140 and the housing 120 may be basically blocked.

Fifth Embodiment

Figure 12:
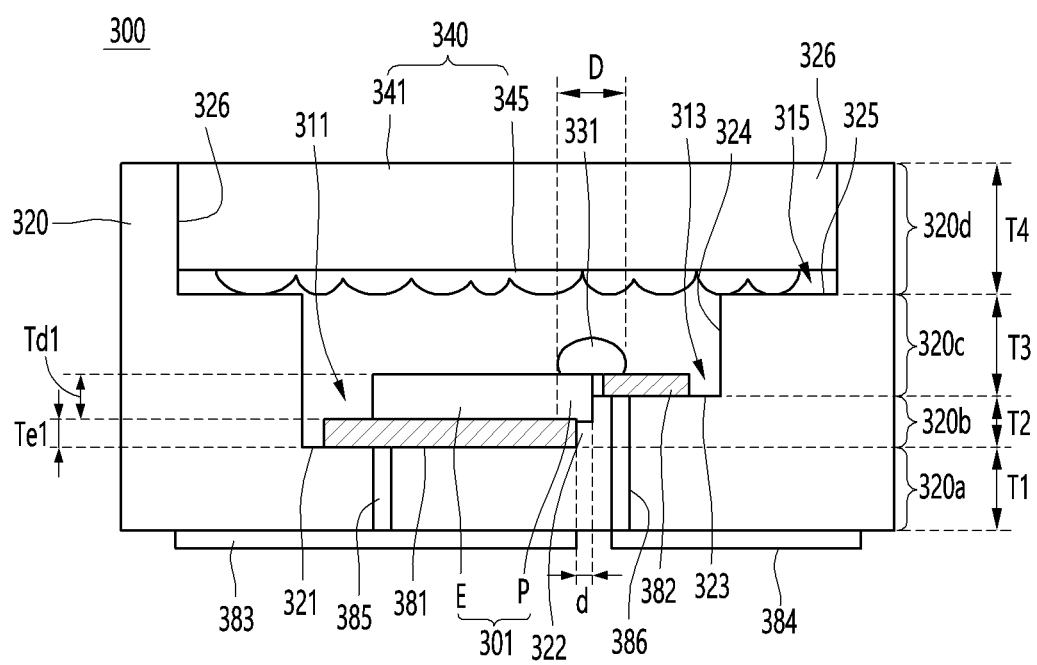
FIG. 12 is a cross-sectional view illustrating a surface emitting laser package according to a fifth embodiment.
Figure 13:
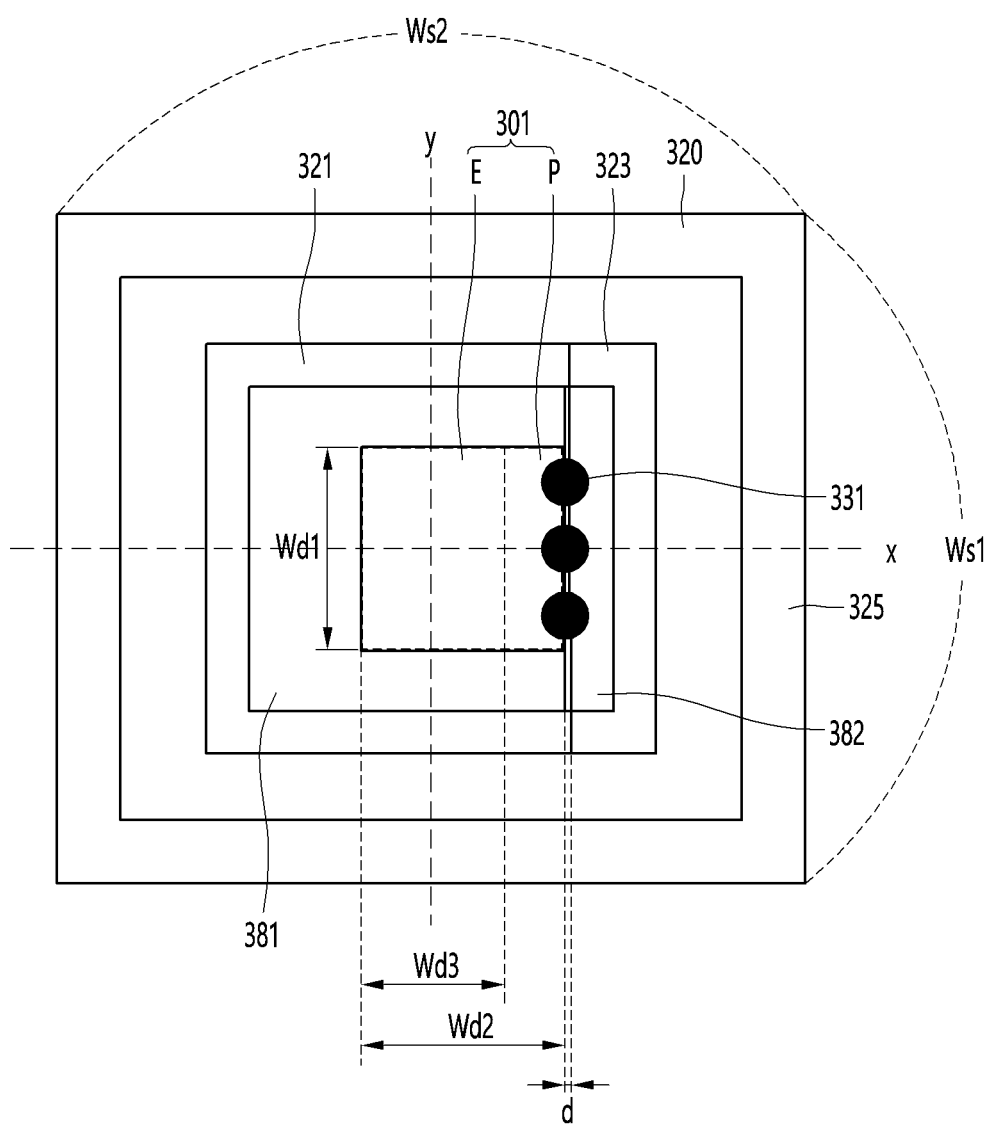
FIG. 13 is a plan view illustrating the surface emitting laser package according to the fifth embodiment.

FIG. 12 is a cross-sectional view illustrating a surface emitting laser package according to a fifth embodiment, and FIG. 13 is a plan view illustrating the surface emitting laser package according to the fifth embodiment.

In a surface emitting laser package 300 according to the fifth embodiment, light is emitted about the center of the center, that is, the central axis of a housing 320, thereby ensuring reliability of a product, reducing a product size, and simplifying a product structure.

FIGS. 12 and 13, the surface emitting laser package 300 according to the fifth embodiment may provide the housing 320.

The housing 320 may support all components disposed on the housing 320. For example, the housing 320 may support a surface emitting laser element 301 and a diffusion part 340 disposed thereon. The housing 130, the surface emitting laser element 301, and the diffusion part 340 may be modules modularized by a packaging process. One or more such modules may be mounted on a circuit board (not shown).

The housing 320 of the fifth embodiment may include a material having excellent support strength, heat dissipation, and insulation.

The housing 320 may include a material having high thermal conductivity. The housing 320 may be provided with a material having excellent heat dissipation characteristics so as to efficiently discharge heat generated in the surface emitting laser element 301 to the outside thereof. The housing 320 may include an insulating material.

For example, the housing 320 may include a ceramic material. The housing 320 may include a low temperature co-fired ceramic (LTCC) or a high temperature co-fired ceramic (HTCC) that is co-fired.

In addition, the housing 320 may include a metal compound. The housing 320 may include a metal oxide having a thermal conductivity of 340 W/mK or more. For example, the housing 320 may include aluminum nitride (AlN) or alumina ($Al_2O_3$).

As another example, the housing 320 may include a resin-based insulating material. The housing 320 may be provided with a silicone resin, an epoxy resin, a thermosetting resin including a plastic material, or a high heat-resistant material.

The housing 320 may include a conductive material. When the housing 320 is provided with a conductive material such as metal, an insulating member for electrical insulation may be provided between the housing 320 and the surface emitting laser element 301 or between the housing 320 and the electrodes 381 to 386.

The housing 320 may have a square shape when viewed from above, but the embodiment is not limited thereto. For example, the housing 320 may have a width of Ws1 and a height of Ws2.

The housing 320 of the fifth embodiment may include a first body 320a, a second body 320b, a third body 320c, and a fourth body 320d.

The first to fourth bodies 320a to 320d may be made of the same material, and may be integrally formed. For example, the first to fourth bodies 320a to 320d may be formed by a batch process by molding.

The first to fourth bodies 320a to 320d may be formed of materials different from each other, and may be formed by separate processes. For example, the second to fourth bodies 320b to 320d may be made of the same material, and may be integrally formed, and the first body 320a may be made of a different material from the second to fourth bodies 320b to 320d, and may be formed by a separate process. In this case, a lower surface of the second to fourth bodies 320a to 320d integrally formed and an upper surface of the first body 320a may be adhered to each other by an adhesive member (not shown). As an example, the adhesive member may include an organic material. For example, the adhesive member may include an epoxy-based resin. For example, the adhesive member may include a silicone-based resin.

The second body 320b may be disposed on the first body 320a, the third body 320c may be disposed on the second body 320b, and the fourth body 320d may be disposed on the third body 320c.

The upper surface of the first body 320a may include a first region and a second region surrounding the first region. The second body 320b may have a first opening corresponding to the first region of the upper surface of the first body 320a. In this case, the second body 320b may be disposed on the second region of the upper surface of the first body 320a. A first cavity 311 may be defined by the first region of the upper surface of the first body 320a and the first opening of the second body 320b. The first region of the upper surface of the first body 320a exposed by the first cavity 311 may be a first bottom surface 321.

The second body 320b may have a first side surface 322 in contact with the first opening or the first cavity 311. A step (hereinafter, referred to as a first step) corresponding to the thickness T2 of the second body 320b may be formed between the second body 320b and the first body 320a. The first step may be formed by the first side surface 322 located between the first bottom surface 321 of the first body 320a and a second bottom surface 323 of the second body 320b.

The upper surface of the second body 320b may include the first region located at one side of the first opening and the second region surrounding the first opening and the first region. The second body 320b may have a second opening having a diameter larger than a diameter of the first opening of the first body 320a. The third body 320c may have the first opening of the second body 320b and the second opening corresponding to the first region. In this case, the third body 320c may be disposed on the second region of the upper surface of the second body 320b. A second cavity 313 may be defined by the first region of the upper surface of the second body 320b and the second opening of the third body 320c. The first region of the upper surface of the second body 320b exposed by the second cavity 313 may be the second bottom surface 323. Therefore, the second bottom surface 323 of the second body 320b may be disposed on one side of the first cavity 311, but the embodiment is not limited thereto. That is, the second bottom surface 323 of the second body 320b is adjacent to the first cavity 311, and thus it may be disposed along a circumference of the first cavity 311.

The third body 320c may have a second side surface 324 in contact with the second opening and the second cavity 313. A step (hereinafter referred to as a second step) corresponding to a thickness T3 of the third body 320c may be formed between the third body 320c and the second body 320b. The second step may be formed by the second side surface 324 located between the second bottom surface 323 of the second body 320b and a third bottom surface 325 of the third body 320c.

The upper surface of the third body 320c may include a first region and a second region surrounding the first region. The fourth body 320d may have a second opening of the third body 320c and a third opening corresponding to the first region. In this case, the fourth body 320d may be disposed on the second region of the upper surface of the third body 320c. A third cavity 315 may be defined by the first region of the upper surface of the third body 320c and the third opening of the fourth body 320d. The first region of the upper surface of the third body 320c exposed by the third cavity 315 may be the third bottom surface 325.

The fourth body 320d may have a third side surface 326 in contact with the third opening or the third cavity 315. A step (hereinafter referred to as a third step) corresponding to a thickness T4 of the fourth body 320d may be formed between the fourth body 320d and the third body 320c. The third step may be formed by the third side surface 326 located between the third bottom surface 325 of the third body 320c and an upper surface of the fourth body 320d.

The second cavity 313 may communicate with the first cavity 311, and the third cavity 315 may communicate with the second cavity 313. A size of the second cavity 313 may be larger than a size of the first cavity 311. A size of the third cavity 315 may be larger than the size of the second cavity 313.

A central axis of the first bottom surface 321 of the first body 320a may be located to be deviated from the central axis of the housing 320. For example, when one side and the other side of the first bottom surface 321 of the first body 320a facing each other along an x-axis direction are defined, a distance between the one side of the first bottom surface 321 of the first body 320a and a central axis of the housing 320 may be greater than a distance between the other side of the first bottom surface 321 of the first body 320a and the central axis of the housing 320.

A thickness of the first body 320a may be referred to as T1, and a thickness of the second body 320b may be referred to as T2. In addition, a thickness of the third body 320c may be referred to as T3, and a thickness of the fourth body 320d may be referred to as T4. In this case, between the first to fourth thicknesses T1 to T4 may be represented by Equation 1.

$$T3 > T1 \geq T4 > T2 \qquad \text{[Equation 1]}$$

A ratio of the thickness T1 of the first body 320a to the thickness T3 of the third body 320c may be about 1:1.2 to about 1:2.5. A ratio of the thickness T1 of the first body 320a to the thickness T2 of the second body 320b may be about 1:0.15 to about 1:0.55.

The thickness T1 of the first body 320a may be about 0.35 mm to about 0.42 mm. For example, the thickness T1 of the first body 320a may be 0.39 mm. The thickness T2 of the second body 320b may be about 0.07 mm to about 0.2 mm. For example, the thickness T2 of the second body 320b may be 0.1 mm. The thickness T3 of the third body 320c may be about 0.55 mm to about 0.72 mm. For example, the thickness T3 of the third body 320c may be 0.62 mm. The thickness T4 of the fourth body 320d may be about 0.32 mm to about 0.43 mm. For example, the thickness T4 of the fourth body 320d may be 0.38 mm.

The step between the second body 320b and the first body 320a may be equal to the thickness T2 of the second body 320b. The step between the third body 320c and the second body 320b may be equal to the thickness T3 of the third body 320c. The step between the fourth body 320d and the third body 320c may be equal to the thickness T4 of the fourth body 320d.

Each of the first side surface 322 of the second body 320b, the second side surface 324 of the third body 320c, and the third side surface 326 of the fourth body 320d may have a surface perpendicular to a bottom surface of the first body 320a, but the embodiment is not limited thereto.

A part of the second side 324 of the third body 320c may vertically coincide with a part of the first side surface 322 of the second body 320b, but the embodiment is not limited thereto.

The housing 320 of the fifth embodiment may include first and second via holes (not shown) spaced apart from each other. In detail, the first body 320a of the housing 320 may include the first and second via holes penetrated vertically. As will be described later, first and second connection wirings 385 and 386 may be disposed in the first and second via holes.

The surface emitting laser package 300 according to the fifth embodiment may include a first electrode portion 381 and a second electrode portion 382.

The first electrode portion 381 and the second electrode portion 382 may be disposed in the housing 320. In detail, the first electrode portion 381 may be disposed on the first bottom surface 321 of the first body 320a. The second electrode portion 382 may be disposed on the second bottom surface 323 of the second body 320b. Since the second bottom surface 323 of the second body 320b is higher than the first bottom surface 321 of the first body 320a by the thickness T2 of the second body 320b, the second electrode portion 382 may be disposed higher than the first electrode portion 381 by the thickness T2 of the second body 320b. The second bottom surface 323 may be located between a lower surface and an upper surface of the surface emitting laser element 301.

The first electrode portion 381 may have the same shape as that of the first bottom surface 321 of the first body 320a, and the second electrode portion 382 may have the same shape as that of the second bottom surface 323 of the second body 320b.

A ratio of a size of the first bottom surface 321 of the first body 320a to a size of the first electrode portion 381 may be about 1:0.7 to about 1:0.97. A ratio of a size of the second bottom surface 323 of the second body 320b to a size of the second electrode portion 382 may be about 1:0.7 to about 1:0.97.

One side end of the first electrode portion 381 may be spaced apart from the first side surface 322 of the second body 320b. A separation distance d between the one side end of the first electrode portion 381 and the first side surface 322 of the second body 320b may be about 0.05 mm to about 0.2 mm. For example, the separation distance d between the one side end of the first electrode portion 381 and the first side surface 322 of the second body 320b may be 0.1 mm.

As another example, the one side end of the first electrode portion 381 may be in contact with the first side surface 322 of the second body 320b.

One side end of the second electrode portion 382 may be spaced apart from the first side surface 322 of the second body 320b. A separation distance between the one side end of the second electrode portion and the first side surface 322 of the second body 320b may be about 0.05 mm to about 0.2 mm. For example, the separation distance between the one side end of the second electrode portion 382 and the first side surface 322 of the second body 320b may be 0.07 mm.

As another example, the one side end of the second electrode portion 382 may vertically coincide with the first side surface 322 of the second body 320b.

A thickness Te1 of each of the first and second electrode portions 381 and 382 may be about 0.04 mm to about 0.8 mm. For example, the thickness Te1 of each of the first and second electrode portions 381 and 382 may be 0.06 mm.

The surface emitting laser package 300 according to the fifth embodiment may provide the surface emitting laser element 301.

The surface emitting laser element 301 may be disposed on the first electrode portion 381. The surface emitting laser element 301 may be disposed on a partial region of the first electrode portion 381. The size of the first electrode portion 381 may be larger than that of the surface emitting laser element 301. For example, the surface emitting laser element 301 may have a square shape when viewed from above, but the embodiment is not limited thereto. A vertical width (a first width) Wd1 and a horizontal width Wd2 of the surface emitting laser element 301 may be the same.

The surface emitting laser element 301 may include a light emitting portion E including a plurality of emitters E1, E2, and E3 that emit a laser beam, respectively, and a pad portion P on which a pad electrode for being electrically connected to the second electrode portion 382 by using a dot electrode 331 is disposed.

A vertical width of the light emitting portion E may be the same as the vertical width Wd1 of the surface emitting laser element 301, and a horizontal width of the light emitting portion E may be Wd3. In this case, a horizontal width of the pad portion P may be a value obtained by subtracting the horizontal width Wd3 of the light emitting portion E from the horizontal width Wd2 of the surface emitting laser element 301.

A central axis of the light emitting portion E may coincide with a central axis of the housing 320. Accordingly, light is emitted around the central axis of the housing 320, thereby ensuring reliability of sensing operation or optical communication operation.

The surface emitting laser element 301 may be disposed adjacent to the second electrode portion 382. In detail, the pad portion P of the surface emitting laser element 301 may be disposed adjacent to the second electrode portion 382. When the first side surface 322 of the second body 320b is defined as one side and the other side that are in contact with the first cavity 311 and face each other, one side of the first side surface 322 of the second body 320b may be a region disposed adjacent to the second electrode portion 382, and the other side of the first side surface 322 of the second body 320b may be a region away from the second electrode portion 382. In this case, the pad portion P of the surface emitting laser element 301 may be disposed so as to be away from the other side of the first side surface 322 of the second body 320b and to be closer to one side of the first side surface 322 of the second body 320b.

One side of the pad portion P of the surface emitting laser element 301 may be in contact with the first side surface 322 in contact with the second bottom surface 323 of the second body 320b.

As another example, one side of the pad portion P of the surface emitting laser element 301 may be spaced apart from the first side surface 322 in contact with the second bottom surface 323 of the second body 320b.

For example, a first region of the surface emitting laser element 301 may be vertically overlapped with the first electrode portion 381, and a second region of the surface emitting laser element 301 may not be vertically overlapped with the first electrode portion 381. That is, the first electrode portion 381 does not exist between the first bottom surface 321 of the first body 320a and the second region of the surface emitting laser element 301, so that the second region of the surface emitting laser element 301 may be spatially or physically spaced apart from the first bottom surface 321 of the first body 320a.

In detail, a part of the pad portion P of the surface emitting laser element 301 may not be vertically overlapped with the first electrode portion 381. In this case, the part of the pad portion P of the surface emitting laser element 301 may be the second region of the surface emitting laser element 301 described above. Therefore, the part of the pad portion P of the surface emitting laser element 301 may be not vertically overlapped with the first electrode portion 381, and another part of the pad portion P of the surface emitting laser element 301 may be vertically overlapped with the first electrode portion 381. The other part of the pad portion P of the surface emitting laser element 301 may be located between the light emitting portion E of the surface emitting laser element 301 and the part of the pad portion P of the surface emitting laser element 301.

A thickness Td1 of the surface emitting laser element 301 may be about 0.08 mm to about 0.3 mm. For example, the thickness Td1 of the surface emitting laser element 301 may be 0.1 mm.

An upper surface of the surface emitting laser element 301, in detail, an upper surface of the pad portion P of the surface emitting laser element 301 may horizontally coincide with an upper surface of the second electrode portion 382. The first bottom surface 321 of the second body 320b may be located lower than the upper surface of the pad portion P of the surface emitting laser element 301. The second electrode portion 382 may be disposed on the first bottom surface 321 of the second body 320b, and the upper surface of the second electrode portion 382 may horizontally coincide with the upper surface of the pad portion P of the surface emitting laser element 301 due to the thickness Te1 of the second electrode portion 382.

As another example, the upper surface of the surface emitting laser element 301 may be located higher than the upper surface of the second electrode portion 382. For example, the upper surface of the surface emitting laser element 301 may be located 5 nm to 30 nm higher than the upper surface of the second electrode portion 382.

Referring again to FIGS. 12 and 13, the surface emitting laser package 300 according to the fifth embodiment may provide a plurality of dot electrodes 331. The dot electrode 331 may be a connection member for electrically connecting the surface emitting laser element 301 to the second electrode portion 382.

The plurality of dot electrodes 331 may be spaced apart from each other. One side of each dot electrode 331 may be electrically connected to a pad electrode 280 of the pad portion P of the surface emitting laser element 301, and the other side of each dot electrode 331 may be electrically connected to the second electrode portion 382.

The dot electrode 331 may have a first region and a second region. The first region of the dot electrode 331 may be vertically overlapped with the pad electrode 280 of the pad portion P of the surface emitting laser element 301. The second region of the dot electrode 331 may be vertically overlapped with the second electrode portion 382.

When the surface emitting laser element 301 and the second electrode portion 382 are spaced apart from each other, the dot electrode 331 may further include a third region located between the first region and the second region. The third region of the dot electrode 331 may correspond to a space spaced between the surface emitting laser element 301 and the second electrode portion 382.

The dot electrode 331 may be disposed in the space spaced between the surface emitting laser element 301 and the second electrode portion 382. When the dot electrode 331 is disposed in the space spaced between the surface emitting laser element 301 and the second electrode portion 382, the dot electrode 331 may be in contact with one side surface of the surface emitting laser element 301, one side surface of the second electrode portion 382, and the second bottom surface 323 of the second body 320b. When the dot electrode 331 is in contact with the one side surface of the surface emitting laser element 301, for example, the passivation layer 270 (in FIG. 8A) may be disposed on a side surface of the surface emitting laser element for electrical insulation between the dot electrode 331 and the first reflective layer 220 (in FIG. 8A).

When the dot electrode 331 is disposed in the space spaced between the surface emitting laser element 301 and the second electrode portion 382, an electrical contact area of the dot electrode 331 and the second electrode portion 382 is large, and thus current flows smoothly.

In the related art (see FIG. 1), a surface emitting laser element 4 and a second electrode portion 3 were electrically connected by a wire 6. Since the wire 6 is very thin, not only a line resistance is large, but also line disconnection occurs even with a small impact.

When the dot electrode 331 is disposed in the space spaced between the surface emitting laser element 301 and the second electrode portion 382, since the surface emitting laser element 301 and the second electrode portion 382 are more firmly fixed by the dot electrode 331 and may not be separated, failures such as line disconnection may be prevented.

A diameter D of the dot electrode 331 may be, for example, 50 nm to 200 nm. For example, the diameter D of the dot electrode 331 may be 100 nm.

The surface emitting laser element 301 is directly electrically connected to the second electrode portion 382 by a dot electrode having a very small diameter D, and thus a distance between the surface emitting laser element 301 and the second electrode portion 382 is very short and a current flow path is short, thereby minimizing current loss.

An upper surface of the dot electrode 331 may have a round shape, but the embodiment is not limited thereto.

A thickness between the highest point of the upper surface of the dot electrode 331 and a lower surface contacting the upper surface of the second electrode portion 382 may be 100 nm or less.

The dot electrode 331 may be formed by curing after a liquid metal material is dotted between the light emitting laser element and the second electrode portion 382.

According to the fifth embodiment, the surface emitting laser element 301 is in contact with the first side surface 322 of the second body 320b so that the liquid metal material does not flow between the surface emitting laser element 301 and the first side surface 322 of the second body 320b, and accordingly, it is possible to block occurrence of electrical short between the dot electrode 331 and the first electrode portion 381.

Even though the surface emitting laser element 301 is spaced apart from the first side surface 322 of the second body 320b, the liquid metal material does not flow between the surface emitting laser element 301 and the first electrode portion 381 by minimizing a separation distance between the surface emitting laser element 301 and the second electrode portion 382. For example, the separation distance between the surface emitting laser element 301 and the second electrode portion 382 may be about 0.05 mm to about 0.2 mm. For example, the separation distance between the surface emitting laser element 301 and the second electrode portion 382 may be 0.07 mm.

The surface emitting laser package 300 according to the fifth embodiment may provide a first bonding portion 383 and a second bonding portion 384.

The first bonding portion 383 and the second bonding portion 384 may be disposed under the housing 320. For example, the first bonding portion and the second bonding portion may be disposed on a lower surface of the first body 320a of the housing 320.

In the drawing, the first bonding portion and the second bonding portion may be disposed so as to protrude downward from the lower surface of the first body 320a of the housing 320.

As another example, first and second recesses spaced apart from each other are formed on the lower surface of the first body 320a of the housing 320, and the first bonding portion 383 may be disposed in the first recess, and the second bonding portion 384 may be disposed in the second recess. In this case, a lower surface of the first bonding portion disposed in the first recess and a lower surface of the second bonding portion disposed in the second recess may horizontally coincide with the lower surface of the first body 320a of the housing 320.

For example, each of the lower surface of the first bonding portion 383 and the lower surface of the second bonding portion 384 may be in surface contact with a signal line (not shown) of the circuit board (not shown) to be electrically connected. In this case, the housing 320 may be referred to as a first substrate, and the circuit board may be referred to as a second substrate.

The first bonding portion 383 and the second bonding portion 384 may be disposed to be spaced apart from each other under the housing 320. The first bonding portion 383 and the second bonding portion 384 may have circular-shaped pads when viewed from below, but the embodiment is not limited thereto.

The first bonding portion 383 may be electrically connected to the first electrode 381. The first bonding portion 383 may be electrically connected to the first electrode 381 via the first connection wiring 385. The first connection wiring 385 may be disposed in, for example, the first via hole provided in the housing 320. The first bonding portion 383 and the first connection wiring 385 may be integrally formed by using the same metal material.

The second bonding portion 384 may be electrically connected to the second electrode 382. The second bonding portion 384 may be electrically connected to the second electrode 382 via the second connection wiring 386. For example, the second connection wiring 386 may be disposed in the second via hole provided in the housing 320. The second bonding portion 384 and the second connection wiring 386 may be integrally formed by using the same metal material.

For example, the first connection wiring 385 and the second connection wiring 386 may include tungsten (W), but the embodiment is not limited thereto. The tungsten (W) may be melted at a high temperature of 1000° C. or more, injected into the first and second via holes, and then cured to form the first connection wiring 385 and the second connection wiring 386. A part of the tungsten (W) may be cured at a lower portion of the housing 320 to be formed to the first and second bonding portions 383 and 384, but the embodiment is not limited thereto.

According to the fifth embodiment, driving power can be provided to the surface emitting laser element 301 via a circuit board (not shown).

The surface emitting laser package 300 according to the fifth embodiment may provide the diffusion part 340.

The diffusion part 340 may be disposed on the surface emitting laser element 301. For example, the diffusion part 340 may be disposed on a third bottom surface 325 of the third body 320c of the housing 320. In this case, a part of a lower surface of the diffusion part 340 is in contact with the third bottom surface 325 of the third body 320c of the housing 320, and a side surface of the diffusion part 340 may be in contact with the third side surface 326 of the four body 320d of the housing 320.

The diffusion part 340 and the third bottom surface 325 of the third body 320c of the housing 320 may be adhered to each other by an adhesive member (not shown). As an example, the adhesive member may include an organic material. For example, the adhesive member may include an epoxy-based resin. For example, the adhesive member may include a silicone-based resin.

An upper surface of the diffusion part 340 may horizontally coincide with an upper surface of the fourth body 320d of the housing 320, but the embodiment is not limited thereto.

The diffusion part 340 may be disposed to be spaced apart from the surface emitting laser element 301. The diffusion part 340 may be supported by the third bottom surface 325 of the third body 320c of the housing 320.

The diffusion part 340 may extend a divergence angle of the laser beam emitted from the surface emitting laser element 301.

The diffusion part 340 may include an anti-reflective layer. For example, the diffusion part 340 may include an anti-reflective layer disposed on the upper surface of the diffusion part 340. The anti-reflective layer may be formed separately from the diffusion part 340.

The anti-reflective layer may include, for example, an anti-reflective coating film. Such an anti-reflective coating film may be attached to the upper surface of the diffusion part 340. The anti-reflective layer may be formed on a surface of the diffusion part 340 by spin coating, spray coating, or the like. As an example, the anti-reflective layer may be formed as a single layer or multiple layers including at least one of a group consisting of $TiO_2$, $SiO_2$, $Al_2O_3$, $Ta_2O_5$, $ZrO_2$, and $MgF_2$.

Although not shown in the drawing, the diffusion part 340 may include a plate and a plurality of patterns disposed under the plate.

Figure 15A:
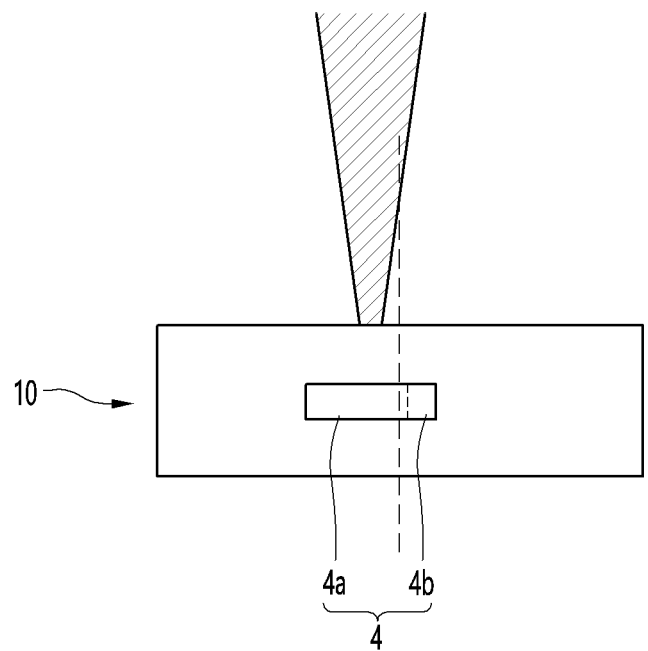
FIGS. 15A and 15B show appearance of light emitted from the surface emitting laser package according to the related art and fifth embodiment.
Figure 15B:
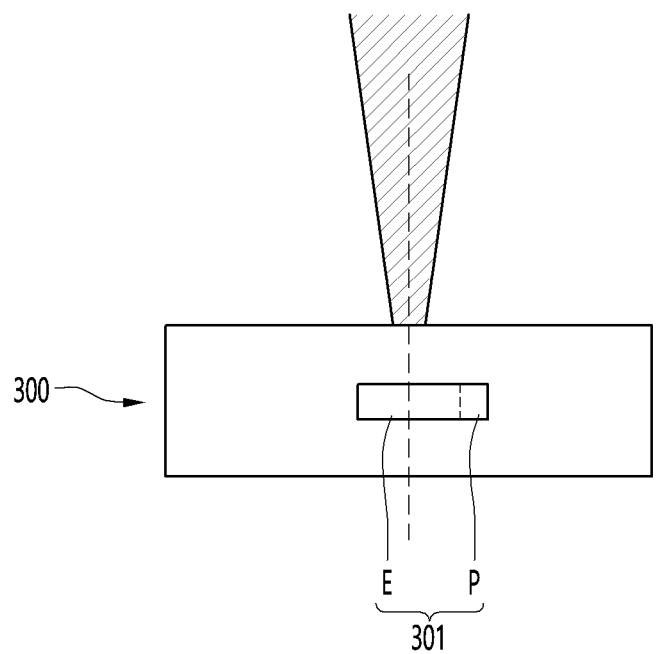

As shown in FIG. 15B, in the surface emitting laser package 300 according to the fifth embodiment configured as described above, the laser beam may be emitted from the central axis thereof, in detail, the central axis of the housing 320.

Figure 14:
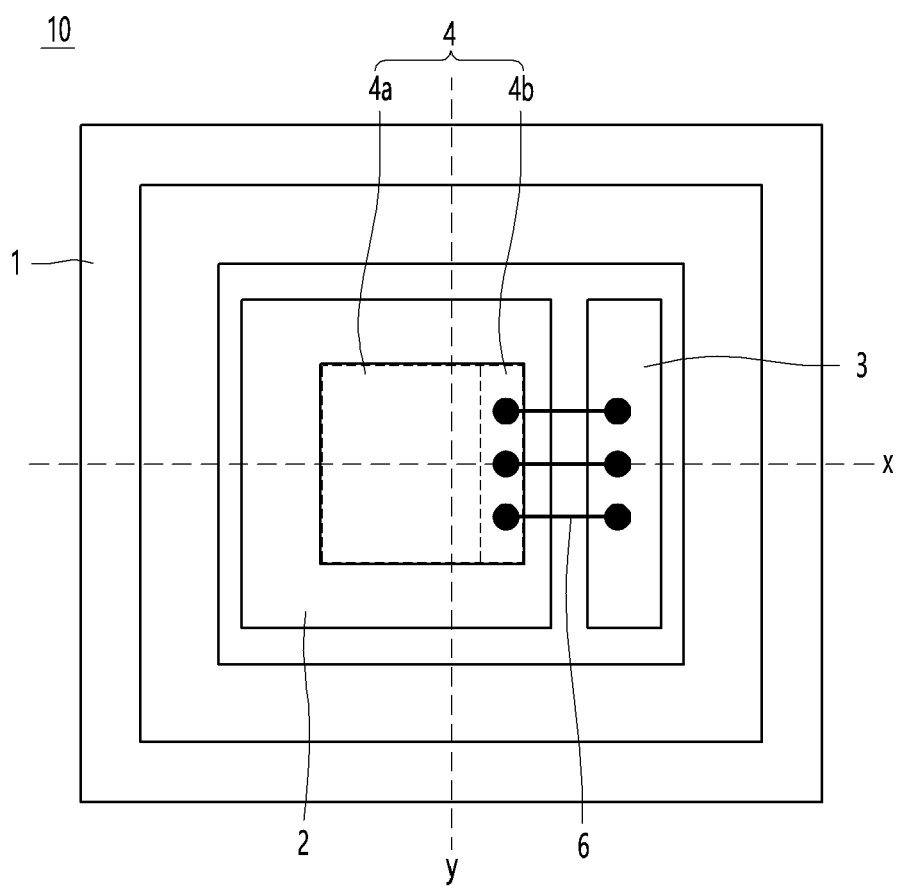
FIG. 14 is a plan view illustrating a surface emitting laser package in the related art.

A surface emitting laser package 10 in the related art, as shown in FIG. 14, two electrode portions 2 and 3 are provided in a housing 1, and a surface emitting laser element 4 is mounted on a first electrode portion 2. Light is not generated in the entire region of the surface emitting laser element 4. That is, the surface emitting laser element 4 includes a light emitting portion 4a for generating light and a pad portion 4b electrically connected to a second electrode portion 3. The pad portion 4b and the second electrode portion 3 are connected by a wire 6, and a bonding process is required for connection of the wire 6. Since an occupied area is required for one side of the wire to be electrically connected to the pad portion 4b by the bonding process, the pad portion 4b is required to have a certain size. In addition, since the first electrode portion 2 and the second electrode portion 3 are disposed on the same surface, the first electrode portion 2 and the second electrode portion 3 should be spaced as far as possible in order to prevent an electrical short between them 2 and 3.

The first electrode portion 2 is relatively far from the second electrode portion 3, and a part of the surface emitting laser element 4 mounted on the first electrode portion 2 does not contribute to emit light as the pad portion 4b. Therefore, in the surface emitting laser package 10 in the related art, a central axis of the light emitting region 4a of the surface emitting laser element 4 does not coincide with the central axis of the housing 10. That is, the central axis of the light emitting region 4a of the surface emitting laser element 4 may be located to move to the right from the center of the housing 10. That is, as shown in FIG. 15A, in in the surface emitting laser package 10 in the related art, light is not emitted about the central axis of the housing 10, but emitted about a region deviating from the central axis of the housing 10. The deviation of the light from the central axis of the housing 10 becomes more severe as a size of the surface emitting laser package 10, that is, a size of the housing 10 becomes smaller. That is, even though the size of the surface emitting laser package 10 becomes small, a size of the pad portion of the surface emitting laser element 4 remains the same, and thus, as the size of the surface emitting laser package 10 becomes smaller, the light emitted from the surface emitting laser package 10 is further deviated from the central axis of the housing 10. As described above, when the light is emitted in a region deviating from the central axis of the housing 10, reliability of sensing operation or optical communication operation using the surface emitting laser package 10 is deteriorated.

On the other hand, in the surface emitting laser package 300 according to the fifth embodiment, light is emitted about the center of the center, that is, the central axis of the housing 320, thereby ensuring the reliability of the sensing operation or the optical communication operation.

In the surface emitting laser package 300 according to the fifth embodiment, the surface emitting laser element 301 and the second electrode portion 382 are electrically connected by the dot electrode 331 instead of the wire, thereby reducing a product size.

In the surface emitting laser package 300 according to the fifth embodiment, the surface emitting laser element 301 and the second electrode portion 382 are electrically connected at the shortest distance by the dot electrode 331 regardless of an area required for wire bonding, thereby simplifying a product structure.

The surface emitting laser package 300 according to the fifth embodiment may include: the housing 320 having a first region, a second region disposed on one side of the first region at a height of a first height higher than that of the first region, a third region disposed along a circumference of the first region at a height of a second height higher than that of the second region; the first electrode portion 381 disposed on the first region of the housing 320; the surface emitting laser element disposed on the first electrode portion 381; the second electrode portion 382 disposed on the second region of the housing 320; the dot electrode connecting the surface emitting laser element and the second electrode portion 382 to each other; and the diffusion part 340 disposed on the third region of the housing 320. The side surface of the surface emitting laser element may be adjacent to a side surface of the second region of the housing 320.

The side surface of the surface emitting laser element may be in contact with the side surface of the second region of the housing 320.

The upper surface of the surface emitting laser element may be the same as, or may be disposed higher than an upper surface of the second electrode.

The first height may be equal to or greater than a sum of a thickness of the first electrode and a thickness of the surface emitting laser element.

The second height may be greater than the first height.

A side surface of the first electrode may be spaced apart from each other by 0.1 mm from the side surface of the second region of the housing 320.

The dot electrode may include a plurality of dots spaced apart from each other.

Sixth Embodiment

Figure 16:
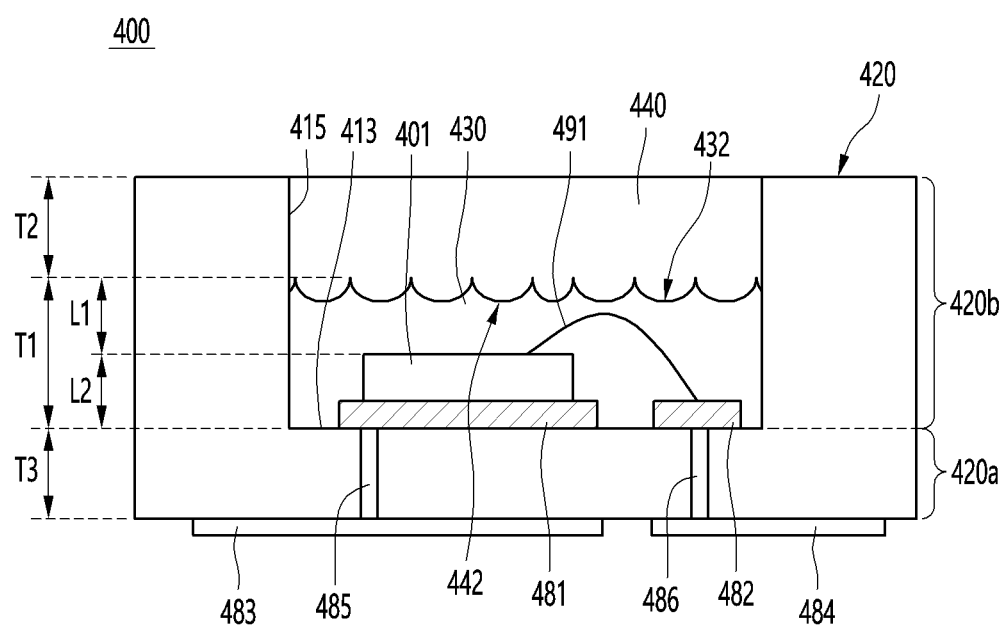
FIG. 16 is a cross-sectional view illustrating a surface emitting laser package according to a sixth embodiment.

FIG. 16 is a cross-sectional view illustrating a surface emitting laser package 100 according to a sixth embodiment.

Referring to FIG. 16, the surface emitting laser package 400 according to the sixth embodiment may provide a housing 420.

The housing 420 may support all components disposed on the housing 420. For example, the housing 420 may support a surface emitting laser element 401 and a diffusion part 440 disposed thereon. The housing 420, the surface emitting laser element 401, and the diffusion part 440 may be modules modularized by a packaging process. One or more such modules may be mounted on a circuit board (not shown).

The housing 420 of the sixth embodiment may include a material having excellent support strength, heat dissipation, and insulation.

The housing 420 may include a material having a high thermal conductivity. The housing 420 may be provided with a material having excellent heat dissipation characteristics so as to efficiently discharge heat generated in the surface emitting laser element 401 to the outside thereof. The housing 420 may include an insulating material.

For example, the housing 420 may include a ceramic material. The housing 420 may include a low temperature co-fired ceramic (LTCC) or a high temperature co-fired ceramic (HTCC) that is co-fired.

In addition, the housing 420 may include a metal compound. The housing 420 may include a metal oxide having a thermal conductivity of 440 W/mK or more. For example, the housing 420 may include aluminum nitride (AlN) or alumina ($Al_2O_3$).

As another example, the housing 420 may include a resin-based insulating material. The housing 420 may be provided with a silicone resin, an epoxy resin, a thermosetting resin including a plastic material, or a high heat-resistant material.

The housing 420 may include a conductive material. When the housing 420 is provided with a conductive material such as metal, an insulating member for electrical insulation may be provided between the housing 420 and the surface emitting laser element 401 or between the housing 420 and electrodes 481 to 486.

The housing 420 of the sixth embodiment may include a first body 420a and a second body 420b. The second body 420b may be disposed on the first body 420a.

The first and second bodies 420a and 420b may be made of the same material, and may be integrally formed. For example, the first and second bodies 420a and 420b may be formed by a batch process by molding.

The first and second bodies 420a and 420b may be formed of materials different from each other and may be formed by separate processes. The second body 420b is made of a different material from the first body 420a and may be formed by a separate process. In this case, a lower surface of the second body 420b and an upper surface of the first body 420a may be adhered to each other by an adhesive member (not shown). As an example, the adhesive member may include an organic material. For example, the adhesive member may include epoxy-based resin. For example, the adhesive member may include a silicone-based resin.

The upper surface of the first body 420a may include a first region and a second region surrounding the first region.

The second body 420b may have an opening therein that may be formed to protrude vertically from an edge of the first body 420a. That is, the second body 420b may have an opening corresponding to the first region of the upper surface of the first body 420a. In this case, the second body 420b may be disposed on the second region of the upper surface of the first body 420a. A cavity 411 may be defined by the first region of the upper surface of the first body 420a and the opening of the second body 420b. The cavity 411 may be provided in the housing 420. The first region of the upper surface of the first body 420a exposed by the cavity 411 may be a bottom surface 413.

The second body 420b may have a side surface 415 in contact with the opening or the cavity 411. The cavity 411 may be formed by the bottom surface 413 and the side surface 415. The side surface 415 may have a surface perpendicular to the bottom surface 413 of the first body 420a, but the embodiment is not limited thereto.

The housing 420 of the sixth embodiment may include first and second via holes (not shown) spaced apart from each other. In detail, the first body 420a of the housing 420 may include the first and second via holes penetrated vertically. As will be described later, first and second connection wirings 485 and 486 may be disposed in the first and second via holes.

The surface emitting laser package 400 according to the sixth embodiment may include a first electrode portion 481 and a second electrode portion 482.

The first electrode portion 481 and the second electrode portion 482 may be disposed in the housing 420. In detail, the first electrode portion 481 and the second electrode portion 482 may be disposed on the bottom surface 413 of the first body 420a. The first electrode portion 481 and the second electrode portion 482 may be spaced apart from each other for electrical insulation.

The first electrode portion 481 and the second electrode portion 482 may have the same shape as that of the bottom surface 413 of the first body 420a.

The surface emitting laser package 400 according to the sixth embodiment may provide the surface emitting laser element 401.

The surface emitting laser element 401 may be disposed on the first electrode portion 481. A lower side of the surface emitting laser element 401 may be electrically connected to the first electrode portion 481. For example, the first electrode portion 481 may be electrically connected to the first electrode 215 of FIG. 5A of the surface emitting laser element 401. The surface emitting laser element 401 may be disposed on a partial region of the first electrode portion 481. A size of the first electrode portion 481 may be larger than that of the surface emitting laser element 401. For example, the surface emitting laser element 401 may have a square shape when viewed from above, but the embodiment is not limited thereto. A vertical width and a horizontal width of the surface emitting laser element 401 may be the same. In consideration of the size of the surface emitting laser element 401, the size of the first electrode portion 481 may be larger than that of the second electrode portion 482.

The surface emitting laser package 400 according to the sixth embodiment may provide a first bonding portion 483 and a second bonding portion 484.

The first bonding portion 483 and the second bonding portion 484 may be disposed under the housing 420. For example, the first bonding portion 483 and the second bonding portion 484 may be disposed on a lower surface of the first body 420a of the housing 420.

In the drawing, the first bonding portion 483 and the second bonding portion 484 may be disposed so as to protrude downward from the lower surface of the first body 420a of the housing 420.

As another example, first and second recesses spaced apart from each other are formed on the lower surface of the first body 420a of the housing 420, and the first bonding portion 483 may be disposed in the first recess, and the second bonding portion 484 may be disposed in the second recess. In this case, a lower surface of the first bonding portion 483 disposed in the first recess and a lower surface of the second bonding portion 484 disposed in the second recess may horizontally coincide with the lower surface of the first body 420a of the housing 420.

For example, each of the lower surface of the first bonding portion 483 and the lower surface of the second bonding portion 484 may be in surface contact with a signal line (not shown) of the circuit board (not shown) to be electrically connected. In this case, the housing 420 may be referred to as a first substrate, and a circuit board 160 may be referred to as a second substrate.

The first bonding portion 483 and the second bonding portion 484 may be disposed to be spaced apart from each other under the housing 420. The first bonding portion 483 and the second bonding portion 484 may have circular-shaped pads when viewed from below, but the embodiment is not limited thereto.

The first bonding portion 483 may be electrically connected to the first electrode 481. The first bonding portion 483 may be electrically connected to the first electrode 481 via the first connection wiring 485. The first connection wiring 485 may be disposed in, for example, the first via hole provided in the housing 420. The first bonding portion 483 and the first connection wiring 485 may be integrally formed by using the same metal material.

The second bonding portion 484 may be electrically connected to the second electrode 482. The second bonding portion 484 may be electrically connected to the second electrode 482 via the second connection wiring 486. For example, the second connection wiring 486 may be disposed in the second via hole provided in the housing 420. The second bonding portion 484 and the second connection wiring 486 may be integrally formed by using the same metal material.

For example, the first connection wiring 485 and the second connection wiring 486 may include tungsten (W), but the embodiment is not limited thereto. The tungsten (W) may be melted at a high temperature of 1000° C. or more, injected into the first and second via holes, and then cured to form the first connection wiring 485 and the second connection wiring 486. A part of the tungsten (W) may be cured at the lower portion of the housing 420 to be formed of the first and second bonding portions 483 and 484, but the embodiment is not limited thereto.

According to the embodiment, driving power may be provided to the surface emitting laser element 401 via the circuit board (not shown).

The surface emitting laser package 400 according to the sixth embodiment may provide an adhesive part 430.

The adhesive part 430 may be disposed in the cavity 411 of the housing 420.

The adhesive part 430 may surround the first electrode portion 481 and the second electrode portion 482. The adhesive part 430 may surround the surface emitting laser element 401. The adhesive part 430 may surround a wire 491. An upper surface of the adhesive part 430 may be located at least higher than the highest point of the wire 491.

The upper surface of the adhesive part 430 may include a plurality of first patterns 432. The first pattern 432 may include an engraved pattern recessed into the adhesive part 430. The first pattern 432 may be referred to as a groove, a recess, or a groove.

The first electrode portion 481 and the second electrode portion 482 may be buried in the adhesive part 430. The surface emitting laser element 401 may be buried in the adhesive part 430. The wire 491 may be buried in the adhesive part 430.

The adhesive part 430 may be made of a material having excellent support strength, heat resistance, heat dissipation, adhesiveness, and insulation. For example, the adhesive part 430 may be made of an organic-inorganic hybrid resin, an aliphatic fluorene-modified acrylate-based resin, or an acrylic acrylate-based resin, but the embodiment is not limited thereto. For example, a refractive index of the organic-inorganic hybrid resin may be about 1.3, a refractive index of the aliphatic fluorene-modified acrylate-based resin may be about 1.43, and a refractive index of the acrylic acrylate-based resin may be about 1.46.

Since the adhesiveness of the adhesive part 430 is excellent, the adhesive part 430 may be easily attached to the side surface 415 and the bottom surface 413 of the housing 420, the first and second electrode portions 481 and 482, the surface emitting laser element 401, and the wire 491.

Since the adhesive part 430 has excellent heat dissipation characteristics, heat generated from the surface emitting laser element 401 may be quickly released to the outside.

Since the adhesive part 430 has excellent insulation characteristics, electrical insulation between the surface emitting laser element 401 and other components may be ensured.

Since the adhesive part 430 has excellent heat resistance, no deformation occurs even when the adhesive part 430 is cured, and optical characteristics of the adhesive part 430 may be maintained.

According to the sixth embodiment, the surface emitting laser element 401 is buried in the adhesive part 430, and the surface emitting laser element 401 is firmly fixed by the adhesive part 430, thereby preventing the surface emitting laser element 401 from being detached.

According to the sixth embodiment, the wire 491 may be buried in the adhesive part 430, and the wire 491 is firmly fixed by the adhesive part 430, thereby preventing disconnection of the wire 491 due to impact.

According to the sixth embodiment, even though oxygen or moisture is permeated into the housing 420 via the housing 420 from the outside, it may be blocked by the adhesive part 430 so that the surface emitting laser element 401 is not be exposed to oxygen or moisture.

The surface emitting laser package 400 according to the sixth embodiment may provide the diffusion part 440.

The diffusion part 440 may be disposed in a cavity of the housing 420. The diffusion part 440 may be disposed on the adhesive part 430. A lower surface of the diffusion part 440 may be in contact with the upper surface of the adhesive part 430, and the side surface 415 of the diffusion part 440 may be in contact with the side surface 415 of the housing 420.

An upper surface of the diffusion part 440 may horizontally coincide with an upper surface of the second body 420b of the housing 420, but the embodiment is not limited thereto.

The lower surface of the diffusion part 440 may include a plurality of second patterns 442. The second pattern 442 may include an embossed pattern protruding from the diffusion part 440 to the outside, that is, toward the surface emitting laser element 401. The second pattern 442 may be referred to as a protrusion, a protruding region, and an extension.

The second pattern 442 may be disposed on the entire region of the lower surface of the diffusion part 440.

The second pattern 442 of the diffusion part 440 may have a shape corresponding to the first pattern 432 of the adhesive part 430. As will be described later, after the first pattern 432 of the adhesive part 430 is formed, a material for forming the diffusion part 440 is formed in the first pattern 432, so that the second pattern 442 corresponding to the first pattern 432 of the adhesive part 430 may be formed on the lower surface of the diffusion part 440.

A laser beam emitted from the surface emitting laser element 401 and incident via the adhesive part 430 may be diffused by the first pattern 432 of the adhesive part 430 and the second pattern 442 of the diffusion part 440.

A pattern part may be configured by the first pattern 432 of the adhesive part 430 and the second pattern 442 of the diffusion part 440. That is, the pattern part may include the first pattern 432 and the second pattern 442. The pattern part may be disposed at an interface between the adhesive part 430 and the diffusion part 440. The pattern part may be configured by the first pattern 432 formed on the upper surface of the adhesive part 430 and the second pattern 442 formed to correspond to the first pattern at the interface between the adhesive part 430 and the diffusion part 440.

As described above, when only the material for forming the diffusion part 440 is formed on the first pattern 432 of the adhesive part 430, the second pattern 442 is naturally formed on the lower surface of the diffusion part 440, and thus it is not necessary to separately form the second pattern of the diffusion part, so that a process may be simplified and a process time may be reduced.

In addition, in the related art, a process of attaching the diffusion part 440 on which a pattern is formed to the housing by using a separate attaching process was required. In order to perform such an attaching process, the diffusion part must be pressed against the housing, but, in this case, a defect such as a scratch occurs on a surface of the diffusion part, and thus a divergence angle failure in which a divergence angle of the laser beam emitted from the surface of the diffusion part is larger than a target divergence angle may occur.

However, according to the sixth embodiment, there is no need for a separate attaching process for attaching the diffusion part as in the related art, and there is no need to make a separate diffusion part in advance, and the diffusion part 440 including the second pattern 442 may be formed directly in the housing 420. Accordingly, scratches of the diffusion part that occur when performing the separate attaching process for attaching the diffusion part are not generated, so that a design of the target divergence angle is easy.

The diffusion part 440 may be made of a material having excellent support strength, heat resistance, heat dissipation, adhesiveness, and insulation. For example, the diffusion part 440 may be made of a urethane acrylate-based resin, a polyamide-imide-based resin, or polyether-imide-based resin, but the embodiment is not limited thereto. A refractive index of the diffusion part 440 may be greater than that of the adhesive part 430, so that the laser beam emitted from the surface emitting laser element 401 and incident via the adhesive part 430 may be diffused. For example, a refractive index of the urethane acrylate-based resin is about 1.6, a refractive index of the polyamide-imide-based resin is about 1.65, and a refractive index of the polyether-amide-based resin may be about 1.63, but the embodiment is not limited thereto.

Since the adhesiveness of the diffusion part 440 is excellent, the diffusion part 440 may be easily attached to the side surface 415 of the housing 420 and the adhesive part 430.

Since the diffusion part 440 has excellent heat dissipation characteristics, heat generated from the surface emitting laser element 401 may be quickly released to the outside.

Since the diffusion part 440 has excellent heat resistance, no deformation occurs even when the diffusion part 440 is cured, and optical characteristics of the diffusion part 440 may be maintained.

For example, the adhesive part 430 may be referred to as a first layer, and the diffusion part 440 may be referred to as a second layer. For example, the adhesive part 430 may be referred to as a first resin layer, and the diffusion part 440 may be referred to as a second resin layer.

When a thickness of the adhesive part 430 is T1 and a thickness of the diffusion part 440 is T2, a thickness of the first body 420a of the housing 420 may be T3. In this case, the thickness T1 of the adhesive part 430 may be the same as the thickness T2 of the diffusion part 440. The thickness T1 of the adhesive part 430 may be the same as the thickness T2 of the first body 420a of the housing 420.

The thickness T1 of the adhesive part 430 may be greater than the thickness T2 of the diffusion part 440. For example, a ratio of the thickness T2 of the diffusion part 440 to the thickness T1 of the adhesive part 430 may be about 1:1 to about 1:1.5.

A distance L1 between an upper surface of the surface emitting laser element 401 and the lower surface of the diffusion part 440 may be smaller than a distance L2 between the upper surface of the surface emitting laser element 401 and the bottom surface 413 of the housing 420, so that the divergence angle may be minimized by allowing the laser beam emitted from the surface emitting laser element 401 to enter the diffusion part 440 at the shortest distance.

Figure 17:
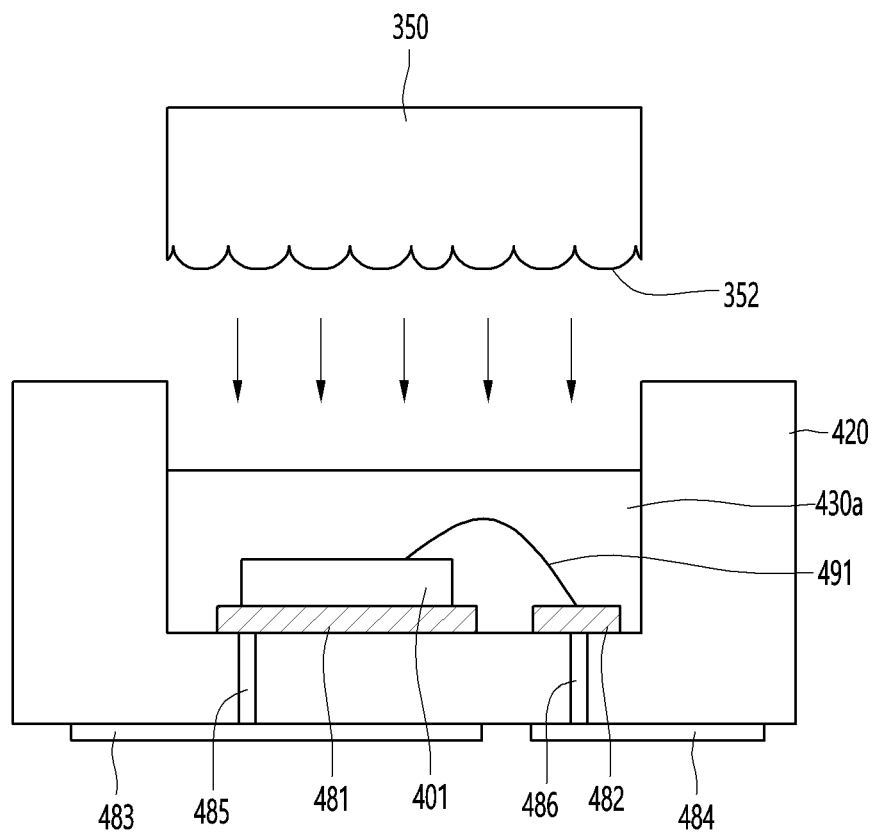
FIGS. 17 to 19 are views illustrating a manufacturing process of the surface emitting laser package according to the sixth embodiment.
Figure 18:
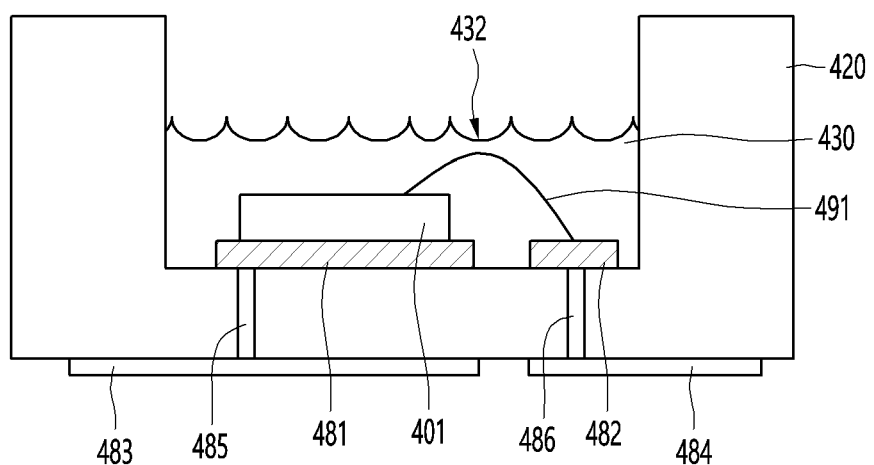
Figure 19:
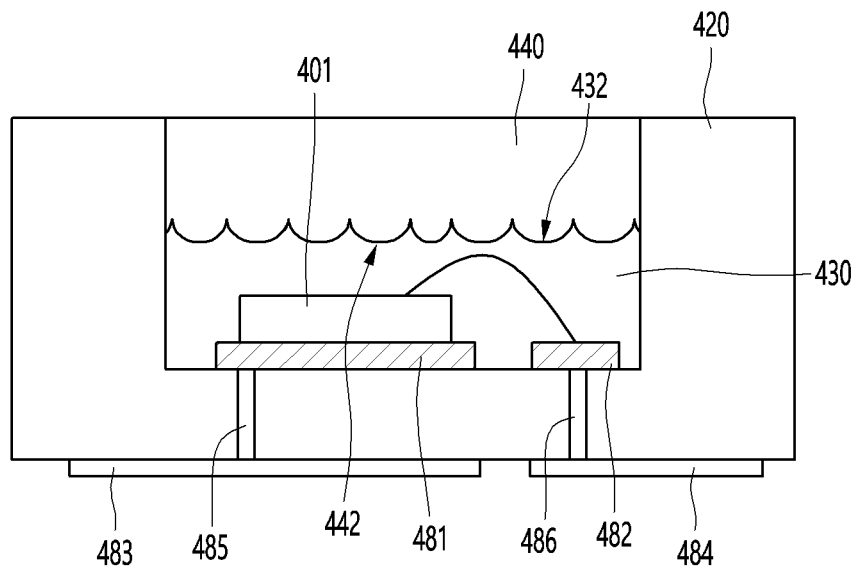

FIGS. 17 to 19 are views illustrating a manufacturing process of the surface emitting laser package according to the sixth embodiment.

As shown in FIG. 17, the housing 420 in which the surface emitting laser element 401 is mounted may be provided. The surface emitting laser element 401 may be disposed on one of the first electrode portion 481 and the second electrode portion 482.

The first and second electrode portions 481 and 482, the first and second bonding portions 483 and 484, and the first and second connection wirings 485 and 486 may be disposed in the housing 420.

As another example, the first and second bonding portions 483 and 484 and the first and second connection wirings 485 and 486 may be formed in the housing 420 after the diffusion part (see 440 of FIG. 19) is formed.

Subsequently, a first resin material 430a may be filled in the cavity 411 of the housing 420. The first resin material 430a may be made of a material having excellent support strength, heat resistance, heat dissipation, adhesiveness, and insulation. For example, the first resin material 430a may be made of an organic-inorganic hybrid resin, an aliphatic fluorene-modified acrylate-based resin, or an acrylic acrylate-based resin, but the embodiment is not limited thereto. For example, the refractive index of the organic-inorganic hybrid resin may be about 1.3, the refractive index of the aliphatic fluorene-modified acrylate-based resin may be about 1.43, and the refractive index of the acrylic acrylate-based resin may be about 1.46.

Subsequently, a stamp 350 having an embossed pattern 352 on its lower portion is placed on the first resin material 430a, and then the stamp 350 may be pressed.

As shown in FIG. 18, the stamp 350 is pressed to form a plurality of first patterns 432 corresponding to the embossed patterns 352 on an upper surface of the first resin material 430a. The first pattern 432 may include an engraved pattern corresponding to the embossed pattern 352 of the stamp 350.

Subsequently, the first resin material 430a may be cured using a curing process to be changed to the adhesive part 430.

As shown in FIG. 19, a second resin material may be filled in the cavity 411 of the housing 420. The second resin material may be formed on the adhesive part 430 in the cavity 411 of the housing 420. The second resin material may be made of a material having excellent support strength, heat resistance, heat dissipation, adhesiveness, and insulation. For example, the second resin material may be made of a urethane acrylate-based resin, a polyamide-imide-based resin, or polyether-imide-based resin, but the embodiment is not limited thereto. The refractive index of the diffusion part 440 may be greater than that of the adhesive part 430, so that the laser beam emitted from the surface emitting laser element 401 and incident via the adhesive part 430 may be diffused. For example, the refractive index of the urethane acrylate-based resin is about 1.6, the refractive index of the polyamide-imide-based resin is about 1.65, and the refractive index of the polyether-imide-based resin may be about 1.63, but the embodiment is not limited thereto. Subsequently, the second resin material may be cured by using a curing process to be changed to the diffusion part 440.

Since the plurality of first patterns 432 are already formed on the upper surface of the adhesive part 430, when the second resin material is cured on the adhesive part 430, the second pattern 442 corresponding to the first pattern 432 of the adhesive part 430 may be formed on a lower surface of the second resin material.

Since the embossed pattern 352 is formed on the stamp 350, the first pattern 432 of the adhesive part 430 may include the engraved pattern corresponding to the embossed pattern 352 of the stamp 350. In addition, since the diffusion part 440 is formed on the adhesive part 430, the first pattern 432 of the adhesive part 430, that is, the second pattern 442 corresponding to the engraved pattern, that is, the embossed pattern may be formed on the lower surface of the diffusion part 440. The second pattern 442 of the diffusion part 440 may include an embossed pattern having the same shape as the embossed pattern 352 of the stamp 350, but the embodiment is not limited thereto.

Seventh Embodiment

Figure 20:
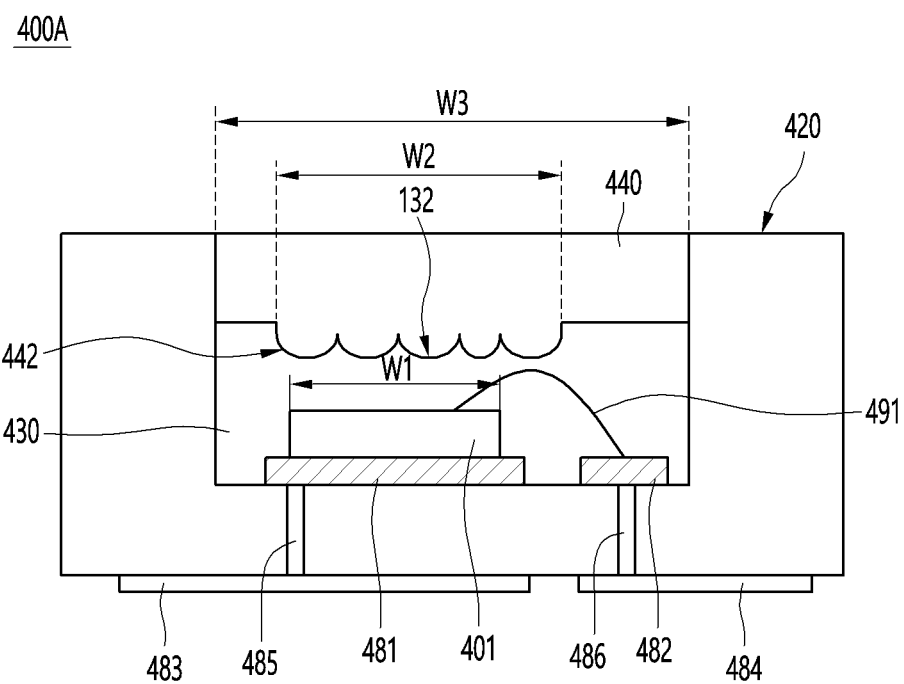
FIG. 20 is a cross-sectional view illustrating a surface emitting laser package according to a seventh embodiment.

FIG. 20 is a cross-sectional view illustrating a surface emitting laser package according to a seventh embodiment.

The seventh embodiment is the same as the first embodiment except for the second pattern 442 of the diffusion part 440. In the seventh embodiment, the same reference numerals are designated for the same functions, shapes, and/or structures as those of the first embodiment, detailed descriptions thereof are omitted, and the omitted technical spirit may be easily understood from the description of the first embodiment.

Referring to FIG. 20, a surface emitting laser package 400A according to the seventh embodiment may include a housing 420, a surface emitting laser element 401, an adhesive part 430, and a diffusion part 440.

The surface emitting laser package 400A according to the seventh embodiment may further include a first electrode portion 481 and a second electrode portion 482. The first electrode portion 481 and the second electrode portion 482 may be disposed on a bottom surface 413 provided in a cavity 411 of the housing 420.

The surface emitting laser element 401 is disposed on, for example, the first electrode portion 481, but the embodiment is not limited thereto. A first electrode of the surface emitting laser element 401 may be electrically connected to the first electrode portion 481.

The surface emitting laser element 401 may be electrically connected to the second electrode portion 482 using a wire 491. For example, one side of the wire may be electrically connected to a second electrode of the surface emitting laser element 401.

For example, the surface emitting laser element 401 may include an active layer from which a laser beam is emitted. In the surface emitting laser element 401, a first electrode 215 may be disposed below the active layer, and a second electrode 282 may be, for example, a vertical type surface emitting laser element 401 that may be disposed on the active layer, but may be a flip chip type surface emitting laser element (see FIG. 9).

An upper surface of the adhesive part 430 may include a plurality of first patterns 432. A lower surface of the diffusion part 440 may include a plurality of second patterns 442 corresponding to the first pattern 432.

The plurality of first patterns 432 may be formed in a part of the upper surface of the adhesive part 430 (hereinafter, referred to as a first pattern region). The plurality of second patterns 442 may be formed in a part of the lower surface of the diffusion part 440 (hereinafter referred to as a second pattern region).

Since the second pattern 442 is formed corresponding to the first pattern 432, the second pattern region and the first pattern region may have the same width W2.

According to the seventh embodiment, the width W2 of each of the first pattern region and the second pattern region may be equal to or larger than a width W1 of the surface emitting laser element 401, and may be smaller than a width W3 of each of the diffusion part 440 and the adhesive part 430. In detail, the width W2 of each of the first pattern region and the second pattern region may be equal to or larger than that of a light emitting portion E of the surface emitting laser element 401.

The surface emitting laser element 401 may be vertically overlapped with each of the first pattern region or the second pattern region.

A part region of the first pattern region or the second pattern region (hereinafter referred to as a first region) may be vertically overlapped with the surface emitting laser element 401, and another region of the first pattern region or the second pattern region (hereinafter, referred to as a second region) may not be vertically overlapped with the surface emitting laser element 401. The second region may surround the first region.

According to the seventh embodiment, since a laser beam is emitted from the surface emitting laser element 401, a divergence angle of the laser beam is not large, and thus. it is not necessary to form the width W2 of the pattern region including the first pattern 432 (or the second pattern 442) in the entire region of the adhesive part 430 (or the diffusion part 440), and it is possible to form the width W2 to be equal to or larger than the width W1 of the surface emitting laser element 401, In detail, the width of the light emitting portion E of the surface emitting laser element 401, and to be smaller than the width W3 of the adhesive part 430 (or the diffusion part 440).

Eighth Embodiment

Figure 21:
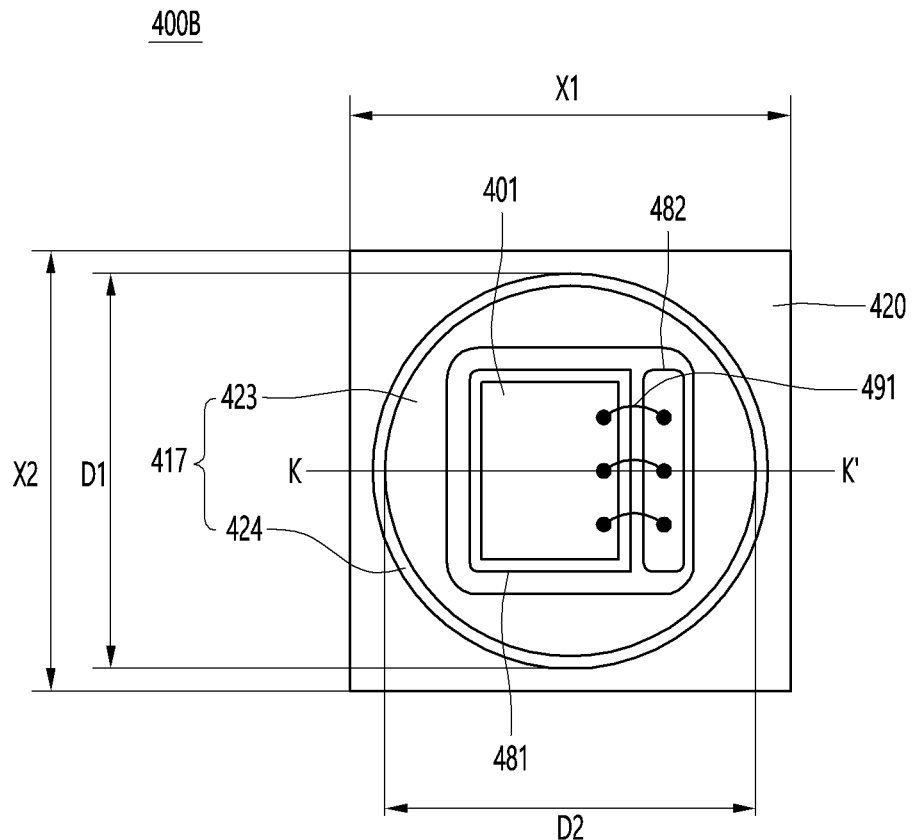
FIG. 21 is a plan view illustrating a surface emitting laser package according to an eighth embodiment.
Figure 22:
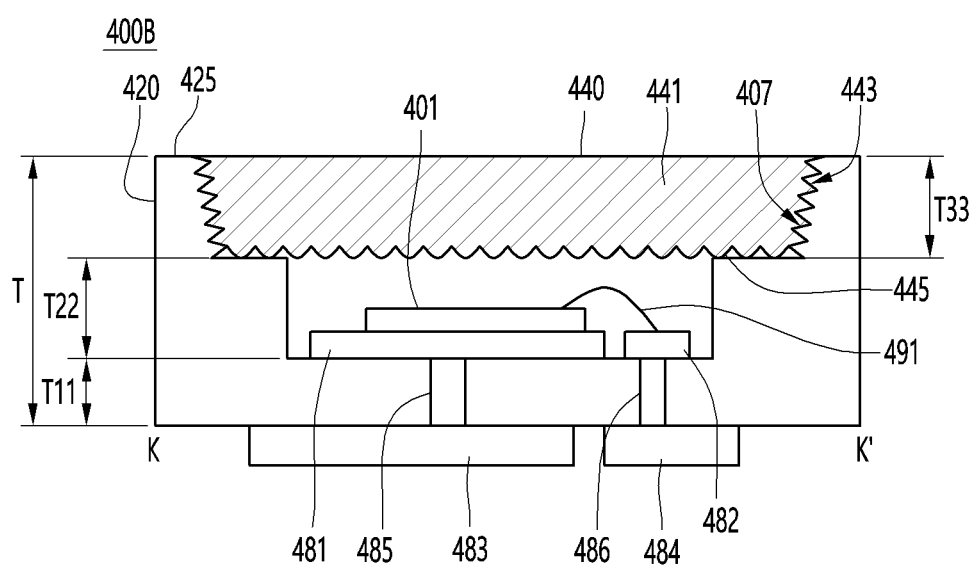
FIG. 22 is a cross-sectional view taken along line K-K' of the surface emitting laser package of FIG. 21.
Figure 23:
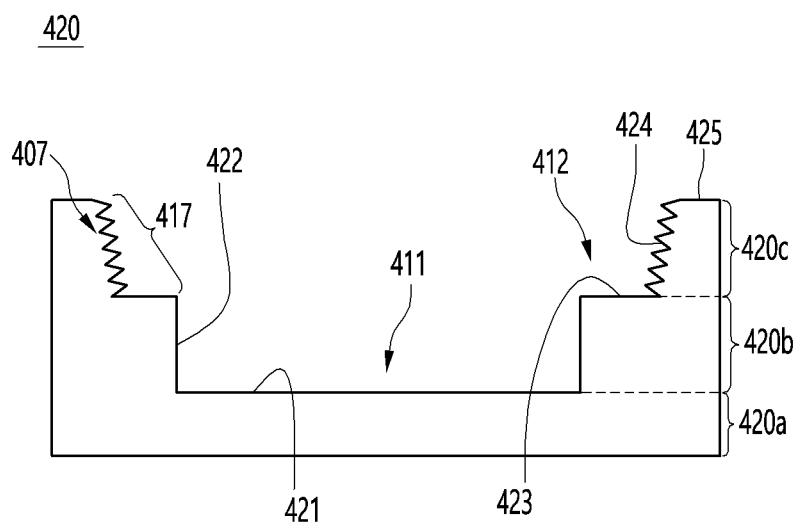
FIG. 23 is a cross-sectional view illustrating a housing according to the eighth embodiment.
Figure 24:
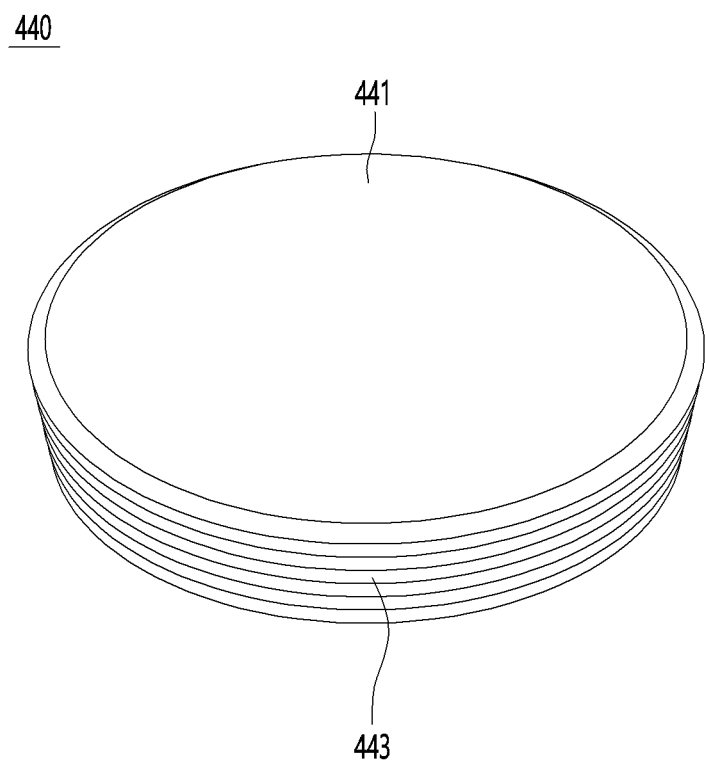
FIG. 24 is a perspective view illustrating a diffusion part according to the eighth embodiment.
Figure 25:
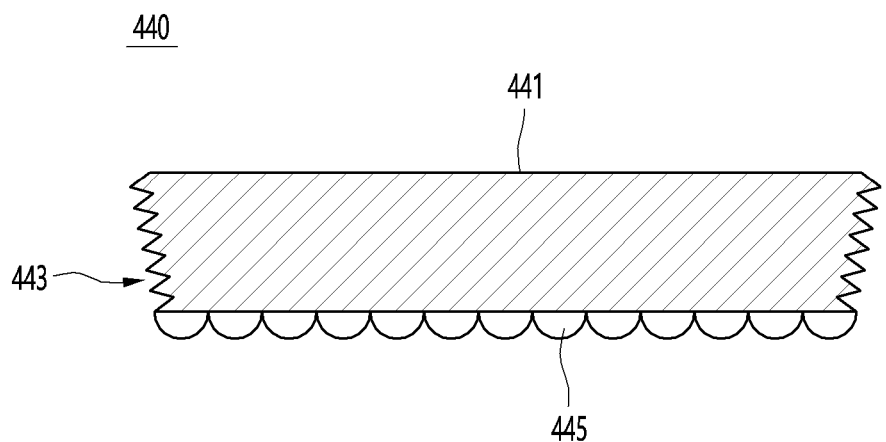
FIG. 25 is a cross-sectional view illustrating the diffusion part according to the eighth embodiment.

FIG. 21 is a plan view illustrating a surface emitting laser package according to an eighth embodiment, FIG. 22 is a cross-sectional view taken along line K-K' of the surface emitting laser package of FIG. 21, FIG. 23 is a cross-sectional view illustrating a housing according to the eighth embodiment, FIG. 24 is a perspective view illustrating a diffusion part according to the eighth embodiment, and FIG. 25 is a cross-sectional view illustrating the diffusion part according to the eighth embodiment.

Referring to FIGS. 21 to 25, a surface emitting laser package 400B according to the eighth embodiment may provide a housing 420.

The housing 420 may support all components disposed on the housing 420. For example, the housing 420 may support a surface emitting laser element 401 and a diffusion part 440 disposed thereon. The housing 420, the surface emitting laser element 401, and the diffusion part 440 may be modules modularized by a packaging process. One or more such modules may be mounted on a circuit board (not shown).

The housing 420 of the embodiment may include a material having excellent support strength, heat dissipation, and insulation.

The housing 420 may include a material having a high thermal conductivity. The housing 420 may be provided with a material having excellent heat dissipation characteristics so as to efficiently discharge heat generated in the surface emitting laser element 401 to the outside thereof. The housing 420 may include an insulating material.

For example, the housing 420 may include a ceramic material. The housing 420 may include a low temperature co-fired ceramic (LTCC) or a high temperature co-fired ceramic (HTCC) that is co-fired.

In addition, the housing 420 may include a metal compound. The housing 420 may include a metal oxide having a thermal conductivity of 440 W/mK or more. For example, the housing 420 may include aluminum nitride (AlN) or alumina ($Al_2O_3$).

As another example, the housing 420 may include a resin-based insulating material. The housing 420 may be provided with a silicone resin, an epoxy resin, a thermosetting resin including a plastic material, or a high heat-resistant material.

The housing 420 may include a conductive material. When the housing 420 is provided with a conductive material such as metal, an insulating member for electrical insulation may be provided between the housing 420 and the surface emitting laser element 401 or between the housing 420 and electrodes 481 to 486.

The outer frame of the housing 420 may have a square shape when viewed from above, but the embodiment is not limited thereto. For example, the housing 420 may have a width of X1 and a height of X2.

A first cavity 411 and a second cavity 412 that is larger than a size of the first cavity 411 may be included inside the housing 420. The first cavity 411 and the second cavity 412 may refer to a recessed shape therein.

The housing 420 of the embodiment may include a first body 420a, a second body 420b, and a third body 420c.

The first to third bodies 420a to 420c may be made of the same material, and may be integrally formed. For example, the first to third bodies 420a to 420c may be formed by a batch process by molding.

The first to third bodies 420a to 420c may be formed of materials different from each other, and may be formed by separate processes. For example, the first to third bodies 420a to 420c may be made of the same material, and may be integrally formed, and the first body 420a may be made of a different material from the second and third bodies 420b and 420c, and may be formed by a separate process. In this case, a lower surface of the second and third bodies 420b and 420c integrally formed and an upper surface of the first body 420a may be adhered to each other by an adhesive member (not shown). As an example, the adhesive member may include an organic material. For example, the adhesive member may include an epoxy-based resin. For example, the adhesive member may include a silicone-based resin.

The second body 420b may be disposed on the first body 420a, and the third body 420c may be disposed on the second body 420b.

The upper surface of the first body 420a may include a first region and a second region surrounding the first region. The second body 420b may have a first opening corresponding to the first region of the first body 420a. In this case, the second body 420b may be disposed on the second region of the first body 420a. The first cavity 411 may be defined by the first region of the first body 420a and the first opening of the second body 420b. The first region of the first body 420a exposed by the first cavity 411 may be a first bottom surface 421.

The second body 420b may have a first side surface 422 in contact with the first opening or the first cavity 411. A step (hereinafter, referred to as a first step) corresponding to a thickness T22 of the second body 420b may be formed between the second body 420b and the first body 420a. The first step may be formed by the first side surface 422 located between the first bottom surface 421 of the first body 420a and a second bottom surface 423 of the second body 420b. The second bottom surface 423 of the second body 420b may be an upper surface of the second body 420b.

The upper surface of the second body 420b may include the first region in contact with the first opening and the second region surrounding the first opening and the first region.

The third body 420c may have a second opening having a diameter larger than a diameter of the first opening of the second body 420b. The third body 420c may be disposed on the second region of the second body 420b.

The second cavity 412 may be defined by the first region of the second body 420b and the second opening of the third body 420c. The first region of the second body 420b exposed by the second cavity 412 may be the second bottom surface 423.

The second bottom surface 423 of the second body 420b may be in contact with the first cavity 411 and disposed in the second cavity 412, but the embodiment is not limited thereto. That is, the second bottom surface 423 of the second body 420b is adjacent to the first cavity 411, and thus it may be disposed along a circumference of the first cavity 411.

The third body 420c may have a second side surface 424 in contact with the second cavity 412. A step (hereinafter, referred to as a second step) corresponding to a thickness T33 of the third body 420c may be formed between the third body 420c and the second body 420b. The second step may be formed by the second side surface 424 located between the second bottom surface 423 of the second body 420b and an upper surface of the third body 420c.

The second cavity 412 may communicate with the first cavity 411. A size of the second cavity 412 may be larger than that of the first cavity 411.

When viewed from above, the first cavity 411 may have a quadrangular shape, and the second cavity 412 may have a circular shape, but the embodiment is not limited thereto. When viewed from above, the first opening of the second body 420b may have a quadrangular shape, and the second opening of the third body 420c may have a circular shape. When viewed from above, the first bottom surface 421 of the first body 420a may have a quadrangular shape, and the second bottom surface 423 of the second body 420b may have a circular shape.

In summary, the first bottom surface 421 of the first body 420a, the first opening of the second body 420b, and the first cavity 411 may have the same quadrangular shape. The second bottom surface 423 of the second body 420b, the second opening of the third body 420c, and the second cavity 412 may have the same circular shape.

For example, a central axis of the first bottom surface 421 of the first body 420a may coincide with a central axis of the housing 420, but the embodiment is not limited thereto.

A thickness of the first body 420a may be referred to as T11, the thickness of the second body 420b may be referred to as T22, and the thickness of the third body 420c may be referred to as T33. In this case, the first to third thicknesses T11 to T33 may be represented by Equation 2.

$$T11 \geq T22 \geq T33 \qquad \text{[Equation 2]}$$

For example, the thickness T33 of the third body 420c may be about 0.3 mm to about 0.6 mm. For example, the thickness T33 of the third body 420c may be 0.5 mm.

The thickness T33 of the third body 420c may be the same as the thickness of the diffusion part 440. For example, an upper surface of the diffusion part 440 may horizontally coincide with an upper surface of the housing 420, that is, an upper surface 425 of the third body 420c.

As described above, the first step may be determined by the thickness T22 of the second body 420b, and the second step may be determined by the thickness T33 of the third body 420c. Therefore, a height of the second step may be equal to or less than a height of the first step.

Meanwhile, a seating portion 417 may be defined by the bottom surface 423 of the second body 420b and the second side surface 424 of the third body 420c. The seating portion 417 may be a region in which the diffusion part 440 to be described later is fixed. The diffusion part 440 may have a shape corresponding to a shape of the seating portion 417 so that the diffusion part 440 is seated on the seating portion 417. For example, when viewed from above, the outer frame of the diffusion part 440 may have a circular shape. The fixing of the diffusion part 440 and the housing 420 will be described later in detail.

The housing 420 of the embodiment may provide first and second via holes (not shown) spaced apart from each other. In detail, the first body 420a of the housing 420 may include the first and second via holes penetrated vertically. As will be described later, first and second connection wirings 485 and 486 may be disposed in the first and second via holes.

The surface emitting laser package 400B according to the eighth embodiment may include a first electrode portion 481 and a second electrode portion 482.

The first electrode portion 481 and the second electrode portion 482 may be disposed in the housing 420. The first electrode portion 481 and the second electrode portion 482 may be disposed on the first bottom surface 421 of the first body 420a. The first electrode portion 481 and the second electrode portion 482 may be spaced apart from each other.

Since the surface emitting laser element 401 should be disposed in the first electrode portion 481, a size of the first electrode portion 481 may be larger than that of the second electrode portion 482.

For example, the first electrode portion 481 may be electrically connected to a first electrode of the surface emitting laser element 401, and the second electrode portion 482 may be electrically connected to a second electrode of the surface emitting laser element 401 via a wire 491.

When the wire 491 is connected between the surface emitting laser element 401 and the second electrode portion 482, the highest point of the wire 491 from the first bottom surface 421 of the first body 420a may be located lower than the second bottom surface 423 of the body 420b. When the wire 491 is located as described above, even though the diffusion part 440 is seated on the seating portion 417, the wire 491 is not in contact with the lower surface of the diffusion part 440, and thus it is possible to prevent a failure due to contact between the diffusion part 440 and the wire 491. Such a failure may include, for example, disconnection of the wire 491 or deformation of the diffusion part 440 by transmitting heat generated by the wire 491 to the diffusion part 440.

The surface emitting laser package 400B according to the eighth embodiment may provide the surface emitting laser element 401.

The surface emitting laser element 401 may be disposed on one of the first electrode portion 481 and the second electrode portion 482. For example, the surface emitting laser element 401 may be disposed on the first electrode portion 481. The surface emitting laser element 401 may be disposed on a partial region of the first electrode portion 481. The size of the first electrode portion 481 may be larger than that of the surface emitting laser element 401. For example, the surface emitting laser element 401 may have a quadrangle shape when viewed from above, but the embodiment is not limited thereto. A vertical width and a horizontal width of the surface emitting laser element 401 may be the same, but the embodiment is not limited thereto.

The surface emitting laser element 401 may include a light emitting portion (E in FIG. 3) including a plurality of emitters (E1, E2, and E3 in FIG. 4) that emit a laser beam respectively and a pad portion (P in FIG. 3) in which a pad electrode 280 for electrically connecting to the second electrode portion 482 is disposed by using the wire 491.

The surface emitting laser package 400B according to the eighth embodiment may provide a first bonding portion 483 and a second bonding portion 484.

The first bonding portion 483 and the second bonding portion 484 may be disposed under the housing 420. For example, the first bonding portion and the second bonding portion may be disposed on a lower surface of the first body 420a of the housing 420.

In the drawing, the first bonding portion and the second bonding portion may be disposed so as to protrude downward from the lower surface of the first body 420a of the housing 420.

As another example, first and second recesses spaced apart from each other are formed on the lower surface of the first body 420a of the housing 420, and the first bonding portion 483 may be disposed in the first recess, and the second bonding portion 484 may be disposed in the second recess. In this case, a lower surface of the first bonding portion disposed in the first recess and a lower surface of the second bonding portion disposed in the second recess may horizontally coincide with the lower surface of the first body 420a of the housing 420.

For example, each of the lower surface of the first bonding portion 483 and the lower surface of the second bonding portion 484 may be in surface contact with a signal line (not shown) of the circuit board (not shown) to be electrically connected. In this case, the housing 420 may be referred to as a first substrate, and the circuit board may be referred to as a second substrate.

The first bonding portion 483 and the second bonding portion 484 may be disposed to be spaced apart from each other under the housing 420. The first bonding portion 483 and the second bonding portion 484 may have circular-shaped pads when viewed from below, but the embodiment is not limited thereto.

The first bonding portion 483 may be electrically connected to the first electrode 481. The first bonding portion 483 may be electrically connected to the first electrode 481 via the first connection wiring 485. The first connection wiring 485 may be disposed in, for example, the first via hole provided in the housing 420. The first bonding portion 483 and the first connection wiring 485 may be integrally formed by using the same metal material.

The second bonding portion 484 may be electrically connected to the second electrode 482. The second bonding portion 484 may be electrically connected to the second electrode 482 via the second connection wiring 486. For example, the second connection wiring 486 may be disposed in the second via hole provided in the housing 420. The second bonding portion 484 and the second connection wiring 486 may be integrally formed by using the same metal material.

For example, the first connection wiring 485 and the second connection wiring 486 may include tungsten (W), but the embodiment is not limited thereto. The tungsten (W) may be melted at a high temperature of 1000° C. or more, injected into the first and second via holes, and then cured to form the first connection wiring 485 and the second connection wiring 486. A part of the tungsten (W) may be cured at a lower portion of the housing 420 to be formed to the first and second bonding portions 483 and 484, but the embodiment is not limited thereto.

According to the embodiment, driving power may be provided to the surface emitting laser element 401 via the circuit board (not shown).

The surface emitting laser package 400B according to the eighth embodiment may provide the diffusion part 440.

The diffusion part 440 may be disposed on the surface emitting laser element 401. For example, the diffusion part 440 may be disposed on the seating portion 417 of the housing 420.

The diffusion part 440 may be firmly fastened to the seating portion 417 of the housing 420 so as not to be separated.

Various features may be presented to firmly fasten the diffusion part 440 to the seating portion 417 of the housing 420.

According to the eighth embodiment, a first pattern 407 is formed on the seating portion 417, and a second pattern 443 corresponding to a shape of the first pattern 407 of the seating portion 417 may be formed on the diffusion part 440. The first pattern 407 may be formed along an inner surface of the seating portion 417, that is, the second side surface 424 of the third body 420c of the housing 420. The second pattern 443 may be formed along an outer surface of the diffusion part 440. For example, each of the first pattern 407 and the second pattern 443 may be a plurality of threads formed along one direction. For example, a thread of the first pattern 407 may be formed in a clockwise direction from an upper side to a lower side of the second side surface 424 of the third body 420c. For example, a thread of the second pattern 443 may be formed along the clockwise direction from an upper side to a lower side of the outer surface of the diffusion part 440. A thread may refer to a region between troughs. Therefore, the first pattern 407 and the second pattern 443 may have a shape in which troughs and ridges are alternately disposed.

The first pattern 407 may be integrally formed with the seating portion 417 and the third body 420c of the housing 420, but the embodiment is not limited thereto. The second pattern 443 may be integrally formed with the diffusion part 440, but the embodiment is not limited thereto.

In the thread of the first pattern 407, an engraved region and an embossed region may be alternately disposed along a vertical direction. In the thread of the second pattern 443, an engraved region and an embossed region may be alternately disposed along the vertical direction. The engraved region of the thread of the second pattern 443 may correspond to the embossed region of the thread of the first pattern 407. The embossed region of the thread of the second pattern 443 may correspond to the engraved region of the thread of the first pattern 407.

Therefore, after a thread of a lower side of the diffusion part 440 is fitted to a thread of an upper side of the seating portion 417, the diffusion part 440 is rotated clockwise or the seating portion 417 is rotated counterclockwise, and accordingly, the thread of the lower side of the diffusion part 440 rotates in engagement with the thread of the upper side of the seating portion 417, and the diffusion part 440 is gradually moved downward, so that the diffusion part 440 may be firmly fastened to the seating portion 417. As the thread of the diffusion part 440 and the thread of the seating portion 417 are fastened so as to be engaged with each other, the diffusion part 440 is not detached, and accordingly, it is possible to prevent the user's eyes from being damaged by a laser beam of the surface emitting laser element 401 that is exposed due to the detachment of the diffusion part 440.

Rotation of the diffusion part 440 may be stopped when the lower side of the diffusion part 440 is in contact with a bottom surface of the seating portion 417, that is, the second bottom surface 423 of the second body 420b. Therefore, when the diffusion part 440 is completely fastened to the seating portion 417, the lower surface of the diffusion part 440 may contact the second bottom surface 423 of the second body 420b.

A side surface of the seating portion 417, that is, the second side surface 424 of the third body 420c may have an inclined surface. For example, an inclined surface of the seating portion 417 may be inclined at an angle of about 100° to 120° with respect to the bottom surface of the housing 420, that is, the second bottom surface 423 of the second body 420b. The inclined surface of the seating portion 417 may be 20° with respect to the second bottom surface 423 of the second body 420b, but the embodiment is not limited thereto. A diameter D1 at the upper side of the seating portion 417 may be larger than a diameter D2 at a lower side of the seating portion 417.

As the seating portion 417 is inclined, the outer surface of the diffusion part 440 may also be inclined to correspond to the inclined surface of the seating portion 417. The inclined surface of the diffusion part 440 may be inclined at an angle of about 10° to 30° with respect to the upper surface of the diffusion part 440. The inclined surface of the diffusion part 440 may be 20° with respect to the upper surface of the diffusion part 440, but the embodiment is not limited thereto. A diameter D1 at the upper side of the diffusion part 440 may be larger than a diameter D2 at the lower side of the diffusion part 440. The diameter of the upper side of the seating portion 417 may be the same as the diameter D1 of the upper side of the diffusion part 440. The diameter of the lower side of the seating portion 417 may be the same as the diameter D2 of the lower side of the diffusion part 440.

As another example, each of the side surface 424 of the seating portion 417 and a side surface of the diffusion part 440 may have a vertical surface perpendicular to the bottom surface of the housing 420.

The diffusion part 440 may be moved into the second cavity 412 of the housing 420 so that the diffusion part 440 is fastened to the seating portion 417. Since the diameter D2 of the lower side of the diffusion part 440 is smaller than the diameter of the upper side of the seating portion 417, the outer surface of the lower side of the diffusion part 440 is not in contact with the inner surface 424 of the seating portion 417. When the lower side of the diffusion part 440 is moved to a middle region of the seating portion 417, the thread formed on the side surface of the lower side of the diffusion part 440 may contact the thread formed on the inner surface 424 of the seating portion 417. From this time, the diffusion part 440 is rotated in a clockwise direction or the seating portion 417 is rotated in a counterclockwise direction, so that the lower side of the diffusion part 440 may ride on the thread of the seating portion 417 to move downward. For example, the lower side of the diffusion part 440 may be in contact with the second bottom surface 423 of the second body 420b, so that the diffusion part 440 may be fitted and fastened to the seating portion 417.

According to the eighth embodiment, since the diffusion part 440 and the seating portion 417 are fitted and fastened by using the thread, and the diffusion part 440 is firmly fixed to the seating portion 417, deviation of the diffusion part 440 may be prevented to improve reliability of a product.

According to the eighth embodiment, when the diffusion part 440 is fastened to the seating portion 417, the diffusion part 440 may be easily separated from the seating portion 417 by being rotated in a direction opposite to the rotational direction, and thus the diffusion part 440 is easily replaced when failures of the diffusion part 440 occur.

Meanwhile, the diffusion part 440 may be disposed to be spaced apart from the surface emitting laser element 401. The diffusion part 440 may be supported by the second bottom surface 423 of the second body 420*b* of the housing 420.

The diffusion part 440 may extend a divergence angle of the laser beam emitted from the surface emitting laser element 401.

The diffusion part 440 may include an anti-reflective layer. For example, the diffusion part 440 may include an anti-reflective layer disposed on the upper surface of the diffusion part 440. The anti-reflective layer may be formed separately from the diffusion part 440.

The anti-reflective layer may include, for example, an anti-reflective coating film. Such an anti-reflective coating film may be attached to the upper surface of the diffusion part 440. The anti-reflective layer may be formed on a surface of the diffusion part 440 by spin coating, spray coating, or the like. As an example, the anti-reflective layer may be formed of a single layer or multiple layers including at least one of group consisting of $TiO_2$, $SiO_2$, $Al_2O_3$, $Ta_2O_3$, $ZrO_2$, and $MgF_2$.

The diffusion part 440 may include a plate 441 and a plurality of third patterns 445 disposed under the plate 441.

As an example, the third pattern 445 may be formed of a material different from that of the plate 441. For example, the plate 441 may include a resin material, and the third pattern 445 may include a glass material.

As another example, the third pattern 445 may be integrally formed with the plate 441.

The third pattern 445 may include protrusions protruding downward, that is, toward the surface emitting laser element 401. Adjacent third patterns 445 may be in contact with or spaced apart from each other. Each of the third patterns 445 may have a random shape.

Ninth Embodiment

Figure 26:
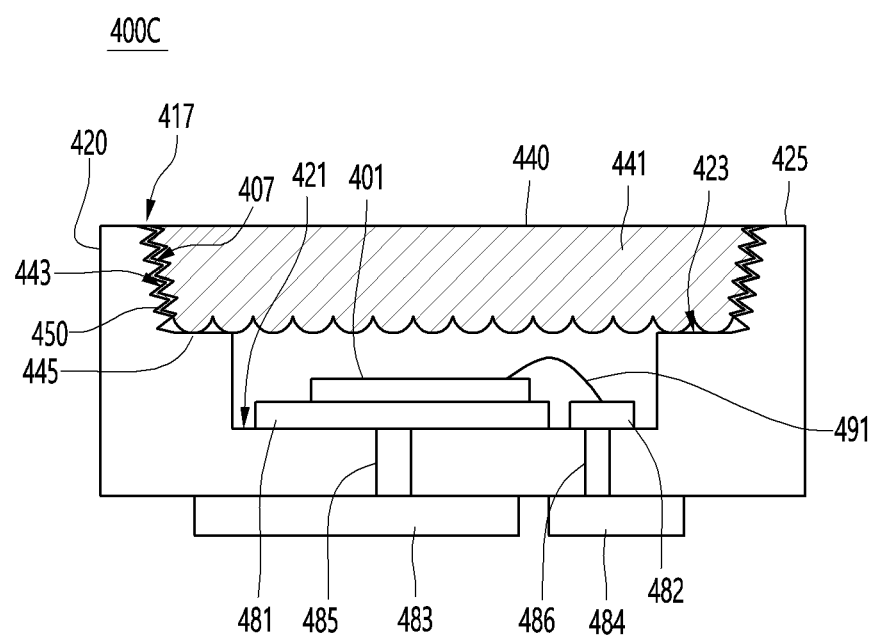
FIG. 26 is a cross-sectional view illustrating a surface emitting laser package according to a ninth embodiment.

FIG. 26 is a cross-sectional view illustrating a surface emitting laser package according to a ninth embodiment.

The ninth embodiment is same as the eighth embodiment except for the adhesive member 450 disposed between the first pattern 407 of the seating portion 417 of the housing 420 and the second pattern 443 of the diffusion part 440. In the ninth embodiment, components having the same functions, shapes, and/or structures as those of the eighth embodiment will be denoted by the same reference numerals and detailed description thereof will be omitted. The disclosure omitted in the following description may be easily understood from the eighth embodiment (FIGS. 1 to 25). Components not shown in the drawings are the same as those shown in FIGS. 1 to 25.

Referring to FIG. 26, a surface emitting laser package 400C according to the ninth embodiment may include a housing 420, first and second electrode portions 481 and 482, a surface emitting laser element 401, and a diffusion part 440.

The seating portion 417 on which the diffusion part 440 may be seated may be formed on an upper side of the housing 420, that is, the third body 420*c*.

The first and second electrode portions 481 and 482 may be disposed on a bottom surface of the housing 420, that is, a first bottom surface 421 of a first body 420*a*. The surface emitting laser element 401 may be disposed on one of the first and second electrode portions 481 and 482.

The seating portion 417 of the housing 420 may be formed at a location having a first terminal from the first bottom surface 421 of the first body 420*a*. The seating portion 417 of the housing 420 may have a step of a predetermined height from the first bottom surface 421 of the first body 420*a*. The seating portion 417 of the housing 420 may include a second bottom surface 423 of a second body 420*b* located at a predetermined height from the first bottom surface 421 of the first body 420*a* and a second side surface 424 of the third body 420*c*. The second body 420*b* has a first opening, and may be disposed on the first body 420*a*, and the third body 420*c* has a second opening having a diameter larger than a diameter of the first opening, and may be disposed on the second body 420*b*.

Therefore, a first cavity 411 is formed by the first bottom surface 421 of the first body 420*a* and the first opening of the second body 420*b*, and a second cavity 412 may be formed by the second bottom surface 423 of the second body 420*b* and the second opening of the third body 420*c*. In this case, the first electrode portion 481, the second electrode portion 482, and the surface emitting laser element 401 may be disposed in the first cavity 411 of the housing 420.

According to the ninth embodiment, a diameter of the diffusion part 440 may be smaller than a diameter of the seating portion 417 of the housing 420. For example, a difference between the diameter of the seating portion 417 of the housing 420 and the diameter of the diffusion part 440 may be about 50 nm to about 300 nm. In this case, there may be as much gap as the difference between the diameter of the seating portion 417 of the housing 420 and the diameter of the diffusion part 440 between the first pattern 407 of the seating portion 417 of the housing 420 and the second pattern 443 of the diffusion part 440.

Even though such a gap exists, when the diffusion part 440 is located on the seating portion 417 of the housing 420, the first pattern 407 of the diffusion part 440 and the second pattern 443 of the seating portion 417 of the housing 420 may be fitted and fastened to each other.

According to the ninth embodiment, the adhesive member 450 may be disposed between the first pattern 407 of the seating portion 417 of the housing 420 and the second pattern 443 of the diffusion part 440. A material having excellent adhesiveness, moisture resistance, insulation, and support strength may be used as the adhesive member 450. For example, the adhesive member 450 may include an organic material. The adhesive member 450 may include an epoxy-based resin. In addition, the adhesive member 450 may include a silicone-based resin.

For example, first, an adhesive paste may be coated on the first pattern 407 of the seating portion 417 of the housing 420. Subsequently, the diffusion part 440 and/or the housing 420 are rotated such that the second pattern 443 of the diffusion part 440 is engaged with the first pattern 407 of the seating portion 417 of the housing 420. The diffusion part 440 and/or the housing 420 may be rotated until a lower side of the diffusion part 440 contacts the bottom surface of the seating portion 417 of the housing 420, that is, the second bottom surface 423 of the second body 420*b*. Subsequently, the adhesive paste is cured to form the adhesive member 450, and such an adhesive member 450 may be disposed between the first pattern 407 of the seating portion 417 of the housing 420 and the second pattern 443 of the diffusion part 440.

According to the ninth embodiment, the first pattern 407 of the seating portion 417 of the housing 420 and the second pattern 443 of the diffusion part 440 may be further firmly fastened to each other by the adhesive member 450 disposed between the first pattern 407 and the second pattern 443 of the diffusion part 440, so that detachment of the diffusion part 440 may be basically blocked.

Meanwhile, when the diameter of the diffusion part 440 is the same as the diameter of the seating portion 417 of the housing 420, the second pattern 443 of the diffusion part 440 is too strongly contacted with the first pattern 407 of the seating portion 417 of the housing 420, and thus the diffusion part 440 or the seating portion 417 of the housing 420 may be difficult to rotate and may not be fitted and fastened.

According to the ninth embodiment, the diameter of the diffusion part 440 is set smaller than the diameter of the seating portion 417 of the housing 420 so that a predetermined gap is formed between the outer surface of the diffusion part 440 and the inner surface 424 of the seating portion 417 of the housing 420, and the adhesive member 450 is disposed in such a gap, and accordingly, the diffusion part 440 is more easily fitted and fastened to the seating portion 417 of the housing 420, and in addition, the detachment of the diffusion part 440 is basically blocked by adhesion of the diffusion part 440 and the seating portion 417 of the housing 420 by the adhesive member 450 as well as the fitting and fastening between the first pattern 407 of the seating portion 417 of the housing 420 and the second pattern 443 of the diffusion part 440, thereby improving reliability of the product.

Meanwhile, as another embodiment, the ninth embodiment and the fifth embodiment may be combined. That is, a first adhesive member 450 may be disposed between the second side surface 424 of the seating portion 417 of the housing 420 and the side surface of the diffusion part 440. A second adhesive member 455 may be disposed between the bottom surface of the seating portion 417 of the housing 420 and the lower surface of the diffusion part 440. As described above, since the first and second adhesive members 450 and 455 adhere not only the lower surface of the diffusion part 440 but also the side surface of the diffusion part 440 to the seating portion 417, the detachment of the diffusion part 440 may be impossible.

As still another embodiment, the ninth and fifth embodiments are combined, but in the ninth embodiment, the first pattern 407 of the seating portion 417 and the second pattern 443 of the diffusion part 440 may be omitted. As described above, even without the first pattern 407 of the seating portion 417 and the second pattern 443 of the diffusion part 440, the side surface of the diffusion part 440 as well as the lower surface of the diffusion part 440 is adhered to the seating portion 417 by the first adhesive member 450 and the second adhesive member 455, and thus the detachment of the diffusion part 440 may be prevented.

Tenth Embodiment

Figure 27:
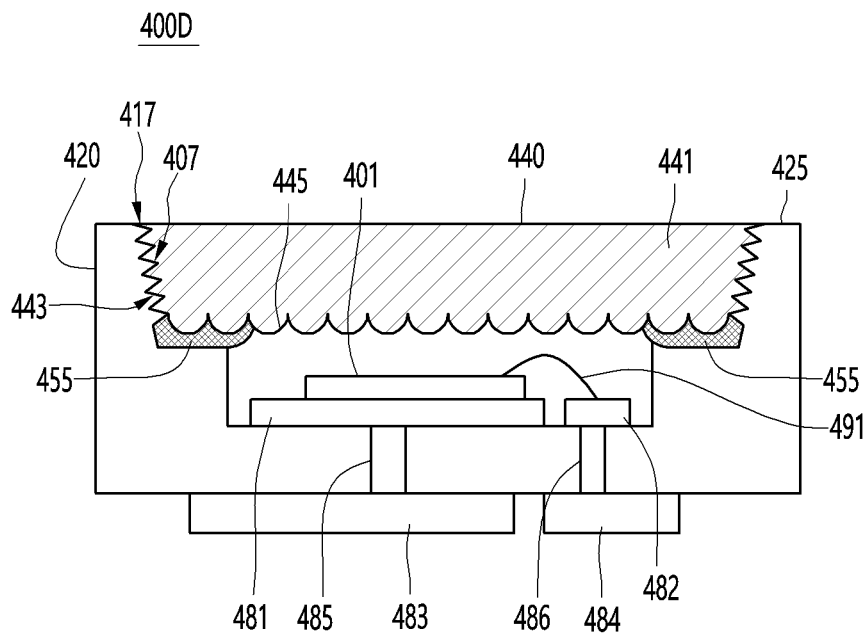
FIG. 27 is a cross-sectional view illustrating a surface emitting laser package according to a tenth embodiment.

FIG. 27 is a cross-sectional view illustrating a surface emitting laser package according to a tenth embodiment.

The tenth embodiment is the same as the sixth and tenth embodiments except for the adhesive member 455 disposed between the bottom surface of the seating portion 417 of the housing 420 and the lower surface of the diffusion part 440. In the tenth embodiment, components having the same functions, shapes, and/or structures as those of the sixth and tenth embodiments will be denoted by the same reference numerals and detailed description thereof will be omitted. The disclosure omitted in the following description may be easily understood from the sixth and tenth embodiments (FIGS. 1 to 26). Components not shown in the drawings are the same as those shown in FIGS. 1 to 26.

Referring to FIG. 27, a surface emitting laser package 400D according to the tenth embodiment may include a housing 420, first and second electrode portions 481 and 482, a surface emitting laser element 401, and a diffusion part 440.

The seating portion 417 on which the diffusion part 440 may be seated may be formed on an upper side of the housing 420, that is, the third body 420*c*.

For example, a first pattern 407 of the seating portion 417 of the housing 420 and a second pattern 443 of the diffusion part 440 may be engaged with each other to be fitted and fastened.

According to the tenth embodiment, the adhesive member 455 may be disposed between the lower surface of the diffusion part 440 and the bottom surface of the seating portion 417 of the housing 420, that is, a second bottom surface 423 of a second body 420*b*. A material having excellent adhesiveness, moisture resistance, insulation, and support strength may be used as the adhesive member 455. For example, the adhesive member 455 may include an organic material. The adhesive member 455 may include an epoxy-based resin. In addition, the adhesive member 455 may include a silicone-based resin.

The adhesive member 455 may or may not be the same as the material of the adhesive member 450 of the ninth embodiment.

The adhesive member 455 may be in contact with a third pattern 445 provided at a lower side of the diffusion part 440. Since the adhesive member 455 is in contact with a wider area of the diffusion part 440 due to a convex shape of the third pattern 445 of the diffusion part 440, the diffusion part 440 may be more firmly fixed to the seating portion 417 of the housing 420 by the adhesive member 455.

As another example, when the third pattern 445 is not provided at an edge of the lower side of the diffusion part 440, the adhesive member 455 may be in contact with the lower surface of the diffusion part 440.

As another example, although not shown in the drawing, the adhesive member 455 is disposed to be narrower than a width of the second bottom surface 423 of the second body 420*b*, and thus it may not be in contact with a first side surface 422 of the second body 420*b*, and it may not affect a divergence angle of a laser beam emitted from the surface emitting laser element 401.

Eleventh Embodiment

Figure 28:
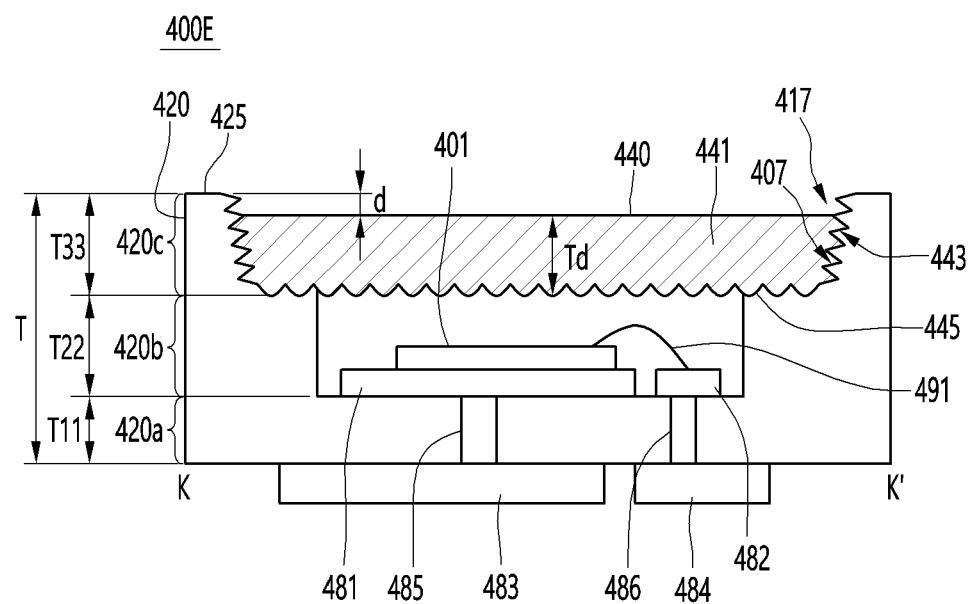
FIG. 28 is a cross-sectional view illustrating a surface emitting laser package according to an eleventh embodiment.

FIG. 28 is a cross-sectional view illustrating a surface emitting laser package according to an eleventh embodiment.

The eleventh embodiment is the same as the sixth to tenth embodiments except that an upper surface of a diffusion part 440 is located lower than an upper surface 425 of a housing 420. In the eleventh embodiment, components having the same functions, shapes, and/or structures as those of the sixth to tenth embodiments will be denoted by the same reference numerals and detailed description thereof will be omitted. The disclosure omitted in the following description may be easily understood from the sixth to tenth embodiments (FIGS. 1 to 27). Components not shown in the drawings are the same as those shown in FIGS. 1 to 27.

Referring to FIG. 28, a surface emitting laser package 400E according to the eleventh embodiment may include the housing 420, first and second electrode portions 481 and 482, a surface emitting laser element 401, and the diffusion part 440.

The housing 420 may include a first body 420a, a second body 420b, and a third body 420c. A first cavity 411 may be formed by a first bottom surface 421 of the first body 420a and a first opening of the second body 420b. A second cavity 412 may be formed by a second bottom surface 423 of the second body 420b and a second opening of the third body 420c. A diameter of the second opening may be larger than a diameter of the first opening. An area of the second bottom surface 423 of the second body 420b may be changed according to a difference between the diameter of the second opening and the diameter of the first opening.

A seating portion 417 on which the diffusion part 440 may be seated may be formed on an upper side of the housing 420, that is, the third body 420c.

The seating portion 417 of the housing 420 may be located at upper side of the housing 420. The seating portion 417 of the housing 420 may surround the second cavity 412. The seating portion 417 of the housing 420 may have the second bottom surface 423 of the second body 420b and a second side surface 424 of the third body 420c. A first pattern 407 may be formed on an inner surface 424 of the seating portion 417. For example, the first pattern 407 of the seating portion 417 of the housing 420 and a second pattern 443 of the diffusion part 440 may be engaged with each other to be fitted and fastened.

A thickness of the seating portion 417 may be the same as a thickness T33 of the third body 420c. In such a case, a thickness Td of the diffusion part 440 may be smaller than the thickness T33 of the seating portion 417. Therefore, when a lower surface of the diffusion part 440 is located to be in contact with a bottom surface of the seating portion 417, that is, the second bottom surface 423 of the second body 420b, the upper surface of the diffusion part 440 may be located lower than the upper surface of the housing 420, that is, the upper surface 425 of the third body 420c.

For example, a depth d at which the upper surface of the diffusion part 440 is located lower than the upper surface 425 of the housing 420 may be 3% to 10% of the thickness Td of the diffusion part 440. For example, the depth d at which the upper surface of the diffusion part 440 is located lower than the upper surface 425 of the housing 420 may be about 3% to about 10% of the thickness T33 of the third body 420c of the housing 420. For example, when the thickness Td of the diffusion part 440 is 500 µm, the depth d may be 15 µm to 50 µm.

According to the eleventh embodiment, since the upper surface of the diffusion part 440 is located lower than the upper surface 425 of the housing 420, the upper surface of the diffusion part 440 is protected by the upper surface 425 of the housing 420, and thus a defect such as a scratch that may occur on the upper surface 425 of the housing 420 may be blocked.

In addition, although not shown in the drawing, an adhesive member may be disposed between an outer portion of the upper surface of the diffusion part 440 and the seating portion 415 exposed by the depth d, and detachment of the diffusion part 440 may be impossible by the adhesive member.

(Flip Chip Type Surface Emitting Laser Element)

Figure 29:
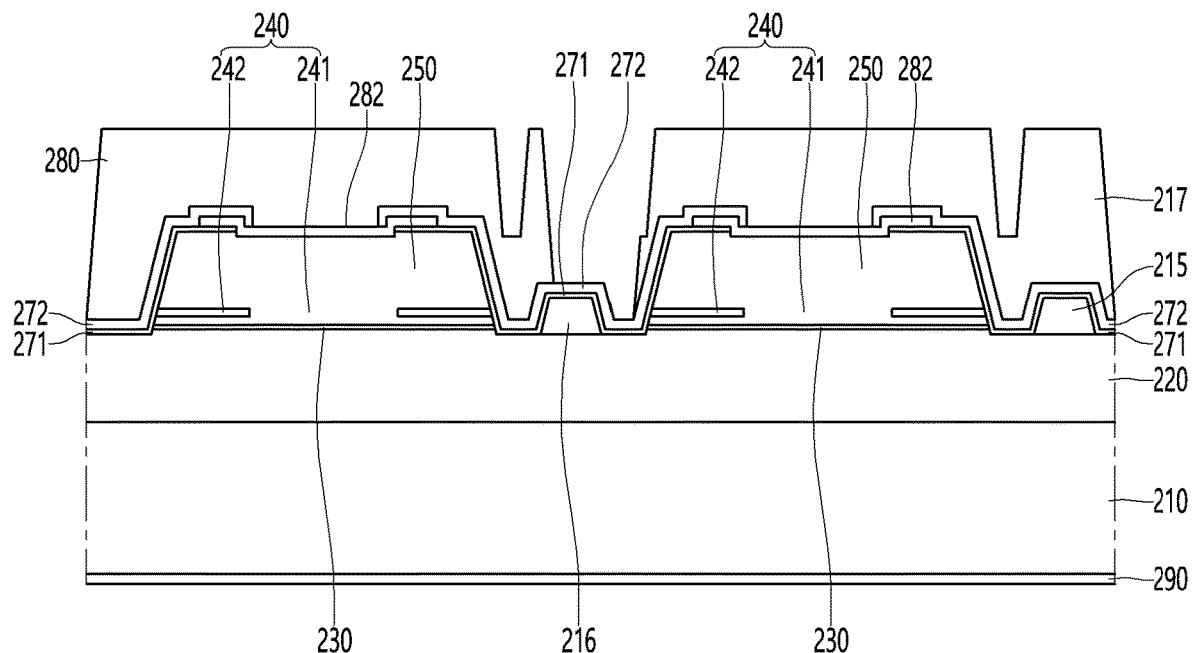
FIG. 29 is another cross-sectional view of a surface emitting laser element according to an embodiment.

FIG. 29 is another cross-sectional view of a surface emitting laser element according to an embodiment.

The surface emitting laser element according to the first to eleventh embodiments may be applied to a flip chip type surface emitting laser element shown in FIG. 29.

The surface emitting laser element according to the first to eleventh embodiments may be a flip chip type in which a first electrode 215 and a second electrode 282 face the same direction as shown in FIG. 29 in addition to a vertical type.

For example, the flip chip type surface emitting laser element shown in FIG. 29 may include any one or more of first electrode portions 215 and 217, a substrate 210, a first reflective layer 220, an active region 230, an aperture region 240, a second reflective layer 250, second electrode portions 280 and 282, a first passivation layer 271, a second passivation layer 272, and an anti-reflective layer 290. In this case, a reflectance of the second reflective layer 250 may be designed to be higher than that of the first reflective layer 220.

In this case, the first electrode portions 215 and 217 may include the first electrode 215 and a first pad electrode 217, and the first electrode 215 may be electrically connected on the first reflective layer 220 exposed by a predetermined mesa process, and the first pad electrode 217 may be electrically connected to the first electrode 215.

The first electrode portions 215 and 217 may be made of a conductive material, for example, metal. For example, the first electrode 215 may be formed of a single layer or a multilayer structure including at least one of aluminum (Al), titanium (Ti), chromium (Cr), nickel (Ni), copper (Cu), and gold (Au). The first electrode 215 and the first pad electrode 217 may include the same metal or different metals.

When the first reflective layer 220 is an n-type reflective layer, the first electrode 215 may be an electrode for the n-type reflective layer.

The second electrode portions 280 and 282 may include the second electrode 282 and a second pad electrode 280, and the second electrode 282 may be electrically connected on the second reflective layer 250, and the second pad electrode 280 may be electrically connected to the second electrode 282.

When the second reflective layer 250 is a p-type reflective layer, the second electrode 282 may be a p-type electrode.

The second electrode (see FIG. 24) according to the above-described embodiment may be equally applied to the second electrode 282 of the flip chip type surface emitting laser element.

The first insulating layer 271 and the second insulating layer 272 may be made of an insulating material, for example, nitride or oxide, and for example, may include at least one of polyimide, silica ($SiO_2$), and silicon nitride ($Si_3N_4$).

The embodiment has a technical effect capable of providing a surface emitting laser element having a highly reliable electrode structure.

In addition, the embodiment has a technical effect capable of providing a surface emitting laser element that may solve an optical problem that a beam pattern of an outgoing beam is split or a divergence angle of the outgoing beam is increased.

In addition, the embodiment has a technical effect capable of providing a surface emitting laser element that may improve ohmic characteristics.

As described above, the first to eleventh embodiments may have various modified embodiments in which components may be added to, deleted from, or combined with each other. For example, the substrate (110 in FIG. 1) of the first embodiment may be replaced with the housing 120. For example, the substrate (110 in FIG. 1) of the first embodiment may be adopted instead of the lower side of the housing 320 of the fifth embodiment.

(Mobile Terminal)

Figure 30:
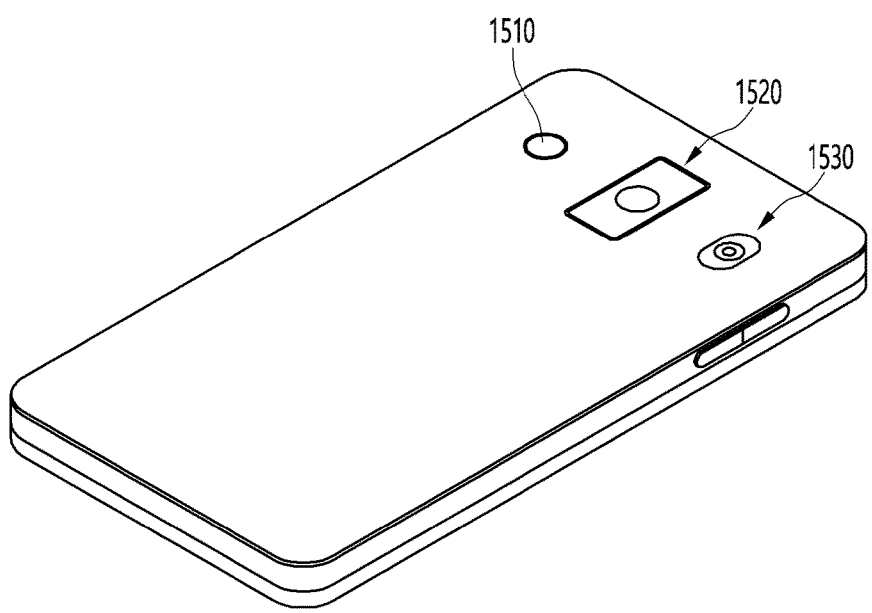
FIG. 30 is a perspective view of a mobile terminal to which a surface emitting laser element according to an embodiment is applied.

FIG. 30 is a perspective view of a mobile terminal to which a surface emitting laser element according to an embodiment is applied.

The vertical type surface emitting laser element according to the first to eleventh embodiments and the flip type surface emitting laser element shown in FIG. 29 may be applied to the mobile terminal shown in FIG. 30.

As shown in FIG. 30, a mobile terminal 4500 of an embodiment may include a camera module 1520, a flash module 1530, and an autofocusing device 1510 provided on a rear surface thereof. Here, the autofocusing device 1510 may include one of packages of the surface emitting laser element according to the first to eleventh embodiments described above as a light emitting layer.

The flash module 1530 may include a light emitting element that emits light therein. The flash module 1530 may be operated by camera operation of the mobile terminal or by the user's control.

The camera module 1520 may include an image photographing function and an autofocus function. For example, the camera module 1520 may include an autofocus function using an image.

The autofocusing device 1510 may include an autofocusing function using a laser. The autofocusing device 1510 may be used under the condition that the autofocus function using the image of the camera module 1520 is deteriorated, for example, may be used mainly in a close-up of 10 m or less or dark environment. The autofocusing device 1510 may include a light emitting layer including the surface emitting laser element of the above-described embodiment, and a light receiving unit that converts light energy into electrical energy such as a photodiode.

INDUSTRIAL APPLICABILITY

Embodiments may be applied to an electronic device in which a semiconductor light emitting element may be applied.

The invention claimed is:

1. A surface emitting laser package comprising:
a housing including a seating portion, the seating portion having a first pattern;
a surface emitting laser element disposed in the housing; and
a diffusion part disposed on the seating portion of the housing, and having a second pattern having a shape corresponding to a shape of the first pattern,
wherein the first pattern and the second pattern include a plurality of threads.

2. The surface emitting laser package of claim 1, wherein the housing has a cavity in which a step is formed, wherein the cavity includes: a first bottom surface; and a second bottom surface disposed higher than the first bottom surface by the step, wherein the surface emitting laser element is disposed on the first bottom surface, and the seating portion has the second bottom surface having a step from the first bottom surface and a side surface.

3. The surface emitting laser package of claim 2, wherein the first pattern is disposed along the side surface of the seating portion, the second pattern is disposed along a side surface of the diffusion part, the side surface of the seating portion has a first inclined surface, the side surface of the diffusion part has a second inclined surface corresponding to the first inclined surface of the seating portion, and the inclined surface has an angle of 100° to 120° with respect to the second bottom surface.

4. The surface emitting laser package of claim 2, wherein the first bottom surface has a square shape, and the second bottom surface has a circular shape.

5. The surface emitting laser package of claim 2, further comprising a first adhesive member disposed between the first pattern of the seating portion and the second pattern of the diffusion part.

6. The surface emitting laser package of claim 5, further comprising a second adhesive member disposed between the second bottom surface of the seating portion and a lower surface of the diffusion part.

7. The surface emitting laser package of claim 2, comprising
a first electrode portion disposed in the cavity;
a second electrode portion disposed in the cavity; and
a plurality of dot electrodes electrically connecting the surface emitting laser element and the second electrode portion,
wherein the first electrode portion is disposed on the first bottom surface,
the second electrode portion is disposed on the second bottom surface, and
the surface emitting laser element is disposed on the first electrode portion.

8. The surface emitting laser package of claim 7, wherein a distance between one side of the first bottom surface and a central axis of the housing is greater than a distance between the other side of the first bottom surface and the central axis of the housing.

9. The surface emitting laser package of claim 7, wherein the surface emitting laser element includes a light emitting portion including a plurality of emitters and a pad portion disposed adjacent to the second electrode portion to be electrically connected to the dot electrode, and a central axis of the light emitting portion coincides with the central axis of the housing.

10. The surface emitting laser package of claim 9, wherein the dot electrode has a first region vertically overlapped with the pad portion of the surface emitting laser element, and a second region vertically overlapped with the second electrode portion.

11. The surface emitting laser package of claim 9, wherein the housing has a first side surface located between the first bottom surface and the second bottom surface, and an end of one side of the first electrode portion is spaced apart from the first side surface.

12. The surface emitting laser package of claim 11, wherein a separation distance between the end of one side of the first electrode portion and the first side surface is 0.05 mm to 0.2 mm.

13. The surface emitting laser package of claim 7, further includes a conductive line disposed between the diffusion part and the surface emitting laser element and configured to connect the surface emitting laser element to the second electrode portion.

14. The surface emitting laser package of claim 1, wherein an upper surface of the diffusion part is lower than an upper surface of the housing.

15. The surface emitting laser package of claim 1, wherein a diameter of an upper side of the seating portion is greater than a diameter of a lower side of the seating portion.

16. The surface emitting laser package of claim 1, wherein a diameter of the diffusion part is less than a diameter of the seating portion.

17. The surface emitting laser package of claim 1, wherein the diffusion part further includes a plate and a third pattern disposed under the plate.

18. The surface emitting laser package of claim 17, wherein the third pattern includes protrusions protruding to an upper surface of the surface emitting laser element.

19. The surface emitting laser package of claim 1, wherein the diffusion part includes an anti-reflective layer disposed on an upper surface of the diffusion part.

\* \* \* \* \*